(12) United States Patent
Araki et al.

(10) Patent No.: US 8,963,165 B2
(45) Date of Patent: Feb. 24, 2015

(54) NITRIDE SEMICONDUCTOR STRUCTURE, NITRIDE SEMICONDUCTOR LIGHT EMITTING ELEMENT, NITRIDE SEMICONDUCTOR TRANSISTOR ELEMENT, METHOD OF MANUFACTURING NITRIDE SEMICONDUCTOR STRUCTURE, AND METHOD OF MANUFACTURING NITRIDE SEMICONDUCTOR ELEMENT

(75) Inventors: Masahiro Araki, Osaka (JP); Shinya Yoshida, Osaka (JP); Haruhisa Takiguchi, Osaka (JP); Atsushi Ogawa, Osaka (JP); Takao Kinoshita, Osaka (JP); Tohru Murata, Osaka (JP); Takeshi Funaki, Osaka (JP); Masayuki Hoteida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/977,456

(22) PCT Filed: Dec. 21, 2011

(86) PCT No.: PCT/JP2011/079635
§ 371 (c)(1),
(2), (4) Date: Jun. 28, 2013

(87) PCT Pub. No.: WO2012/090818
PCT Pub. Date: Jul. 5, 2012

(65) Prior Publication Data
US 2013/0277684 A1 Oct. 24, 2013

(30) Foreign Application Priority Data

Dec. 29, 2010 (JP) .................. 2010-294413
Jan. 28, 2011 (JP) .................. 2011-016496
Mar. 24, 2011 (JP) .................. 2011-066010

(51) Int. Cl.
*H01L 33/00* (2010.01)
*H01L 29/20* (2006.01)
(Continued)

(52) U.S. Cl.
CPC ........ *H01L 29/2003* (2013.01); *H01L 21/0243* (2013.01); *H01L 21/02458* (2013.01);
(Continued)

(58) Field of Classification Search
CPC ... H01L 33/20; H01L 29/2003; H01L 29/812; H01L 21/0243; H01L 21/02458; H01L 21/02494; H01L 21/0254; H01L 21/0242; H01L 21/02502; H01L 21/02516; H01L 21/262; H01L 33/007; H01L 33/12
USPC ...................................... 257/79, 76; 438/478
See application file for complete search history.

(56) References Cited

U.S. PATENT DOCUMENTS 5,122,845 A 6/1992 Manabe et al.
6,335,546 B1 * 1/2002 Tsuda et al. .................... 257/94
(Continued)

FOREIGN PATENT DOCUMENTS

| JP | 5-86646 | 12/1993 |
|---|---|---|
| JP | 3026087 | 3/2000 |
| JP | 3440873 | 8/2003 |
| JP | 3700492 | 9/2005 |
| JP | 2006-352084 | 12/2006 |
| JP | 3950471 | 8/2007 |
| JP | 2008-34444 | 2/2008 |
| JP | 2008-153634 | 7/2008 |
| JP | 2010-161354 | 7/2010 |
| JP | 2010-168273 | 8/2010 |

OTHER PUBLICATIONS

International Search Report mailed Jan. 31, 2012 directed to International Application No. PCT/JP2011/079635; 6 pages.

*Primary Examiner* — Benjamin Sandvik
*Assistant Examiner* — Farid Khan
(74) *Attorney, Agent, or Firm* — Harness, Dickey & Pierce, P.L.C.

(57) ABSTRACT

A nitride semiconductor structure in which a first nitride semiconductor underlying layer is provided on a substrate having a recess portion and a projection portion provided between the recess portions at a surface thereof, the first nitride semiconductor underlying layer has at least 6 first oblique facet planes surrounding the projection portion on an outer side of the projection portion, and a second nitride semiconductor underlying layer buries the first oblique facet planes, a nitride semiconductor light emitting element, a nitride semiconductor transistor element, a method of manufacturing a nitride semiconductor structure, and a method of manufacturing a nitride semiconductor element are provided.

23 Claims, 39 Drawing Sheets

(51) Int. Cl.
*H01L 21/02* (2006.01)
*H01L 33/12* (2010.01)
*H01L 29/812* (2006.01)

(52) U.S. Cl.
CPC ...... *H01L21/02494* (2013.01); *H01L 21/0254* (2013.01); *H01L 33/007* (2013.01); *H01L 33/12* (2013.01); *H01L 21/0242* (2013.01); *H01L 21/02502* (2013.01); *H01L 21/02516* (2013.01); *H01L 21/0262* (2013.01); *H01L 29/812* (2013.01)
USPC ............... 257/79; 257/76; 257/627; 257/628; 438/478

(56) References Cited

U.S. PATENT DOCUMENTS

| | | | |
|---|---|---|---|
| 6,620,238 | B2 | 9/2003 | Tsuda et al. |
| 6,713,789 | B1 | 3/2004 | Shibata et al. |
| 6,939,733 | B2 | 9/2005 | Shibata et al. |
| 7,754,504 | B2 | 7/2010 | Ohmae et al. |
| 2006/0258027 | A1* | 11/2006 | Ohmae et al. .................. 438/22 |
| 2008/0121903 | A1* | 5/2008 | Hiramatsu et al. .............. 257/89 |
| 2010/0102360 | A1* | 4/2010 | Nakada et al. ................. 257/201 |
| 2010/0308349 | A1* | 12/2010 | Ohmae et al. .................. 257/88 |

\* cited by examiner

US 8,963,165 B2

NITRIDE SEMICONDUCTOR STRUCTURE, NITRIDE SEMICONDUCTOR LIGHT EMITTING ELEMENT, NITRIDE SEMICONDUCTOR TRANSISTOR ELEMENT, METHOD OF MANUFACTURING NITRIDE SEMICONDUCTOR STRUCTURE, AND METHOD OF MANUFACTURING NITRIDE SEMICONDUCTOR ELEMENT

REFERENCE TO RELATED APPLICATIONS

This application is a national stage application under 35 USC 371 of International Application No. PCT/JP2011/079635, filed Dec. 21, 2011, which claims priority from Japanese Patent Application Nos. 2010-294413, filed Dec. 29, 2010, 2011-016496, filed Jan. 28, 2011, and 2011-066010, filed Mar. 24, 2011, the entire contents of which are incorporated herein by reference.

FIELD OF THE INVENTION

The present invention relates to a nitride semiconductor structure, a nitride semiconductor light emitting element, a nitride semiconductor transistor element, a method of manufacturing a nitride semiconductor structure, and a method of manufacturing a nitride semiconductor element.

BACKGROUND OF THE INVENTION

Since a group III-V compound semiconductor containing nitrogen (a group III nitride semiconductor) has a band gap corresponding to energy of light having a wavelength in a range from infrared to ultraviolet, it is useful as a material for a light emitting element emitting light having a wavelength in a range from infrared to ultraviolet or for a light receiving element receiving light having a wavelength in that range.

In addition, since a group III nitride semiconductor has strong bond between atoms forming the group III nitride semiconductor, a high breakdown voltage, and a high saturated electron velocity, it is useful also as a material for electronic devices such as transistors having resistance to high temperature, achieving high output, and adapted to a high frequency.

Moreover, the group III nitride semiconductor has attracted attention also as a material which hardly adversely affects an environment and is easy to handle.

In order to fabricate a practical nitride semiconductor element by using the group III nitride semiconductor which is an excellent material as described above, a group III nitride semiconductor layer formed of thin films of the group III nitride semiconductor should be stacked on a prescribed substrate to thereby form a prescribed element structure.

Here, a substrate made of a group III nitride semiconductor having a lattice constant and a coefficient of thermal expansion allowing direct growth of the group III nitride semiconductor on the substrate is most suitably used as a substrate, and for example, a gallium nitride (GaN) substrate or the like is preferably used as a substrate made of the group III nitride semiconductor.

Currently, however, a GaN substrate is not practical because it has such a small dimension as a diameter of 2 inches or smaller and it is also very expensive.

Therefore, under present circumstances, a sapphire substrate, a silicon carbide (SiC) substrate, or the like, which is great in difference in lattice constant and coefficient of thermal expansion from the group III nitride semiconductor, is used as a substrate for fabricating a nitride semiconductor element.

The sapphire substrate and GaN which is a representative group III nitride semiconductor are different from each other in lattice constant by approximately 16%. In addition, the SiC substrate and GaN are different from each other in lattice constant by approximately 6%. If such a great difference in lattice constant is present between a substrate and a group III nitride semiconductor grown thereon, it is generally difficult to epitaxially grow a crystal made of the group III nitride semiconductor on the substrate. For example, when GaN crystal is epitaxially grown directly on a sapphire substrate, three-dimensional growth of GaN crystal is inevitable and GaN crystal having a flat surface cannot be obtained.

Then, what is called a buffer layer for eliminating a difference in lattice constant between a substrate and a group III nitride semiconductor is generally formed between the substrate and the group III nitride semiconductor.

For example, PTL 1 (Japanese Patent No. 3026087) describes a method of growing a group III nitride semiconductor composed of $Al_xGa_{1-x}N$ after a buffer layer composed of AlN is formed on a sapphire substrate with MOVPE.

With the method described in PTL 1, however, it has been difficult to obtain a buffer layer composed of AlN and having a flat surface with good reproducibility. This may be because, in forming a buffer layer composed of AlN with MOVPE, a trimethylaluminum (TMA) gas and an ammonia ($NH_3$) gas used as source material gases are likely to react to each other in a vapor phase.

Therefore, with the method described in PTL 1, it has been difficult to grow a group III nitride semiconductor composed of high-quality $Al_xGa_{1-x}N$, having a flat surface, and having low defect density on a buffer layer composed of AlN with good reproducibility.

For example, PTL 2 (Japanese Patent Publication No. 5-86646) discloses a method of forming on a sapphire substrate, an $Al_xGa_{1-x}N$ ($0<x\leq1$) buffer layer with high-frequency sputtering in which a DC bias is applied.

The group III nitride semiconductor formed on the $Al_xGa_{1-x}N$ ($0<x\leq1$) buffer layer with the method described in PTL 2, however, did not have excellent crystallinity as described in paragraph [0004] of PTL 3 and paragraph [0004] of PTL 4.

Then, PTL 3 (Japanese Patent No. 3440873) has proposed a method of subjecting a buffer layer made of a group III nitride semiconductor formed with DC magnetron sputtering to heat treatment in an atmosphere of a gas mixture of a hydrogen gas and an ammonia gas. In addition, PTL 4 (Japanese Patent No. 3700492) has proposed a method of forming a buffer layer made of a group III nitride semiconductor and having a film thickness not smaller than 50 angstroms and not greater than 3000 angstroms with DC magnetron sputtering on a sapphire substrate of which temperature was raised to 400° C. or higher.

Moreover, PTL 5 (Japanese Patent Laying-Open No. 2008-34444) has proposed a method of forming a buffer layer composed of AlN column crystals with high-frequency sputtering on a sapphire substrate heated to 750° C.

Furthermore, PTL 6 (Japanese Patent No. 3950471) describes providing projecting and recessed structures at a substrate surface in order to grow a group III nitride semiconductor having few crystal defects and laterally growing the group III nitride semiconductor thereon.

Further, PTL 7 (Japanese Patent Laying-Open No. 2006-352084) describes in paragraphs [0043] and [0044], growth in two stages including the step of growing a GaN layer on a substrate provided with projecting and recessed structures that "a GaN layer 12 is grown in such a way as to form an isosceles triangle in section that has . . . a facet inclined relative to the main surface of the sapphire substrate 11," and the step that "next, when the growth is continued while setting the conditions where lateral growth is predominant . . . GaN layer 12 is laterally grown so that the surface of the GaN layer 12 creates a flat surface in parallel to the main surface of the sapphire substrate 11."

PTL 1: Japanese Patent No. 3026087
PTL 2: Japanese Patent Publication No. 5-86646
PTL 3: Japanese Patent No. 3440873
PTL 4: Japanese Patent No. 3700492
PTL 5: Japanese Patent Laying-Open No. 2008-34444
PTL 6: Japanese Patent No. 3950471
PTL 7: Japanese Patent Laying-Open No. 2006-352084

SUMMARY OF THE INVENTION

Even in a case where a buffer layer made of a group III nitride semiconductor is formed and a group III nitride semiconductor layer is formed on the buffer layer with the method described in PTLs 3 to 5 above, the group III nitride semiconductor layer having excellent crystallinity could not be formed with good reproducibility, and consequently, a nitride semiconductor element having good characteristics could not be fabricated with good reproducibility.

In addition, even in the case where a buffer layer made of a group III nitride semiconductor is formed according to the method described in PTL 5 above on a substrate including projections and recesses according to the method described in PTL 6 above and a group III nitride semiconductor layer is further formed with lateral growth described in PTL 7 above on that buffer layer, a group III nitride semiconductor layer having aimed excellent crystallinity could not be formed with good reproducibility.

Furthermore, as a size of a substrate becomes greater from 2 inches to 3 inches, 4 inches, 6 inches, and 8 inches, it has been difficult to form a group III nitride semiconductor layer having excellent crystallinity uniformly in a substrate surface.

In view of the circumstances above, an object of the present invention is to provide a nitride semiconductor structure allowing a nitride layer having excellent crystallinity to be formed in an upper portion thereof with good reproducibility, a nitride semiconductor light emitting element, a nitride semiconductor transistor element, a method of manufacturing a nitride semiconductor structure, and a method of manufacturing a nitride semiconductor element.

According to a first manner of the present invention, a nitride semiconductor structure including a substrate having a recess portion and a projection portion provided between the recess portions at its surface, a nitride semiconductor intermediate layer provided on the substrate, a first nitride semiconductor underlying layer provided on the nitride semiconductor intermediate layer, and a second nitride semiconductor underlying layer provided on the first nitride semiconductor underlying layer, in which the substrate is composed of trigonal corundum or hexagonal crystal, the first nitride semiconductor underlying layer has at least 6 first oblique facet planes surrounding the projection portion on an outer side of the projection portion, the second nitride semiconductor underlying layer has a lower surface in contact with the first oblique facet plane of the first nitride semiconductor underlying layer, and the second nitride semiconductor underlying layer has a flat upper surface, can be provided.

Here, in the nitride semiconductor structure according to the first manner of the present invention, preferably, the first oblique facet plane is inclined with respect to an m axis of a nitride semiconductor having a hexagonal structure.

In addition, in the nitride semiconductor structure according to the first manner of the present invention, preferably, the projection portion is arranged along a <11-20> direction of the substrate.

In addition, in the nitride semiconductor structure according to the first manner of the present invention, preferably, in a cross-sectional view passing through a center of the projection portion in a plan view of the surface of the substrate, the projection portion is in a shape having a tip end portion.

In addition, in the nitride semiconductor structure according to the first manner of the present invention, preferably, the nitride semiconductor intermediate layer is composed of a nitride semiconductor expressed with a formula AlN or $Al_xGa_{1-x}N$ ($0.5<x\leq1$).

In addition, in the nitride semiconductor structure according to the first manner of the present invention, preferably, the substrate is a sapphire substrate.

In addition, according to the first manner of the present invention, a nitride semiconductor light emitting element including any nitride semiconductor structure described above, a first-conductivity-type nitride semiconductor layer provided on the nitride semiconductor structure, a nitride semiconductor active layer provided on the first-conductivity-type nitride semiconductor layer, a second-conductivity-type nitride semiconductor layer provided on the nitride semiconductor active layer, a first electrode in contact with the first-conductivity-type nitride semiconductor layer, and a second electrode in contact with the second-conductivity-type nitride semiconductor layer can be provided.

In addition, according to the first manner of the present invention, a nitride semiconductor transistor element including any nitride semiconductor structure described above, a first-conductivity-type nitride semiconductor electron transit layer provided on the nitride semiconductor structure, a first-conductivity-type nitride semiconductor electron supply layer provided on the first-conductivity-type nitride semiconductor electron transit layer, and an electrode provided on the first-conductivity-type nitride semiconductor electron supply layer can be provided.

In addition, according to the first manner of the present invention, a nitride semiconductor structure including a sapphire substrate having a recess portion and a projection portion provided between the recess portions at a c plane or a surface inclined with respect to the c plane in a range of 5° or smaller, a nitride semiconductor intermediate layer provided on the sapphire substrate, a first nitride semiconductor underlying layer provided on the recess portion with the nitride semiconductor intermediate layer being interposed, and a second nitride semiconductor underlying layer provided on the first nitride semiconductor underlying layer, in which the projection portion is arranged along a <11-20> direction of the sapphire substrate, the first nitride semiconductor underlying layer has a first oblique facet plane surrounding the projection portion on an outer side of the projection portion, the second nitride semiconductor underlying layer has a lower surface in contact with the first oblique facet plane of the first nitride semiconductor underlying layer, and the second nitride semiconductor underlying layer has a flat upper surface, can be provided.

In addition, according to the first manner of the present invention, a method of manufacturing a nitride semiconductor structure including the steps of preparing a substrate composed of trigonal corundum or hexagonal crystal and having a c plane or a surface inclined with respect to the c plane in a range of 5° or smaller, forming a recess portion and a projection portion provided between the recess portions at the surface of the substrate, forming a nitride semiconductor intermediate layer on the surface of the substrate where the recess portion and the projection portion are formed, forming on the nitride semiconductor intermediate layer, a first nitride semiconductor underlying layer having at least 6 first oblique facet planes surrounding the projection portion on an outer side of the projection portion with the projection portion being located in a center, and forming a second nitride semiconductor underlying layer on the first nitride semiconductor underlying layer such that an upper surface thereof is flat can be provided.

Here, in the method of manufacturing a nitride semiconductor structure according to the first manner of the present invention, preferably, the steps of forming a first nitride semiconductor underlying layer and forming a second nitride semiconductor underlying layer are each a growth step with MOCVD (Metal Organic Chemical Vapor Deposition), and they are performed to satisfy at least one condition selected from the group consisting of (i-1) setting a growth temperature during growth of the first nitride semiconductor underlying layer to be lower than a growth temperature during growth of the second nitride semiconductor underlying layer, (ii-1) setting a pressure during growth of the first nitride semiconductor underlying layer to be higher than a pressure during growth of the second nitride semiconductor underlying layer, and (iii-1) setting a V/III ratio of a gas supplied during growth of the first nitride semiconductor underlying layer to be higher than a V/III ratio of a gas supplied during growth of the second nitride semiconductor underlying layer.

In addition, in the method of manufacturing a nitride semiconductor structure according to the first manner of the present invention, preferably, the nitride semiconductor intermediate layer is formed with sputtering.

In addition, in the method of manufacturing a nitride semiconductor structure according to the first manner of the present invention, preferably, the first oblique facet plane is a plane inclined with respect to an m axis of a nitride semiconductor having a hexagonal structure.

In addition, in the method of manufacturing a nitride semiconductor structure according to the first manner of the present invention, preferably, the projection portion is arranged along a <11-20> direction of the substrate.

In addition, in the method of manufacturing a nitride semiconductor structure according to the first manner of the present invention, preferably, in a cross-sectional view passing through a center of the projection portion in a plan view of the surface of the substrate, the projection portion is in a shape having a tip end portion.

Further, according to the first manner of the present invention, a method of manufacturing a nitride semiconductor element including the steps of preparing a substrate composed of trigonal corundum or hexagonal crystal and having a c plane or a surface inclined with respect to the c plane in a range of 5° or smaller, forming a recess portion and a projection portion provided between the recess portions at the surface of the substrate, forming a nitride semiconductor intermediate layer on the surface of the substrate where the recess portion and the projection portion are formed, forming on the nitride semiconductor intermediate layer, a first nitride semiconductor underlying layer having at least 6 first oblique facet planes surrounding the projection portion on an outer side of the projection portion with the projection portion being located in a center, forming a second nitride semiconductor underlying layer on the first nitride semiconductor underlying layer such that an upper surface thereof is flat, and forming at least one nitride semiconductor layer on the second nitride semiconductor underlying layer can be provided.

According to a second manner of the present invention, a nitride semiconductor structure including a substrate having a recess portion and a projection portion provided between the recess portions at its surface, a nitride semiconductor intermediate layer provided on the substrate, a third nitride semiconductor underlying layer provided on the nitride semiconductor intermediate layer at least in the recess portion, a first nitride semiconductor underlying layer provided at least on the third nitride semiconductor underlying layer, and a second nitride semiconductor underlying layer provided at least on the first nitride semiconductor underlying layer, in which the substrate is composed of trigonal corundum or hexagonal crystal, a surface of the third nitride semiconductor underlying layer has a third oblique facet plane and a third flat region, a ratio of area of the third oblique facet plane at the surface of the third nitride semiconductor underlying layer is lower than a ratio of area of the third flat region, the first nitride semiconductor underlying layer has a first oblique facet plane surrounding the projection portion, the second nitride semiconductor underlying layer has a lower surface in contact with the first oblique facet plane, and the second nitride semiconductor underlying layer has a flat upper surface, can be provided.

Here, in the nitride semiconductor structure according to the second manner of the present invention, preferably, the first oblique facet plane includes a plane inclined with respect to an m axis of a nitride semiconductor having a hexagonal structure.

In addition, in the nitride semiconductor structure according to the second manner of the present invention, preferably, the projection portion is arranged along a <11-20> direction of the substrate.

In addition, in the nitride semiconductor structure according to the second manner of the present invention, preferably, in a cross-sectional view passing through a center of the projection portion in a plan view of the surface of the substrate, the projection portion is in a shape having a tip end portion.

In addition, in the nitride semiconductor structure according to the second manner of the present invention, preferably, the nitride semiconductor intermediate layer is composed of a nitride semiconductor expressed with a formula AlN or $Al_xGa_{1-x}N$ (0.5<x≤1).

In addition, in the nitride semiconductor structure according to the second manner of the present invention, preferably, the substrate is a sapphire substrate.

In addition, according to the second manner of the present invention, a nitride semiconductor structure including a sapphire substrate having a recess portion and a projection portion provided between the recess portions at a c plane or a surface inclined with respect to the c plane in a range of 5° or smaller, a nitride semiconductor intermediate layer provided on the sapphire substrate, a third nitride semiconductor underlying layer provided on the nitride semiconductor intermediate layer at least in the recess portion, a first nitride semiconductor underlying layer provided at least on the third nitride semiconductor underlying layer, and a second nitride semiconductor underlying layer provided at least on the first nitride semiconductor underlying layer, in which the projection portion is arranged along a <11-20> direction of the sapphire substrate, a surface of the third nitride semiconductor underlying layer has a third oblique facet plane and a third flat region, a ratio of area of the third oblique facet plane at the surface of the third nitride semiconductor underlying layer is lower than a ratio of area of the third flat region, the first nitride semiconductor underlying layer has a first oblique facet plane surrounding the projection portion and a first flat region, a ratio of area of the first oblique facet plane in a plan view of the first nitride semiconductor underlying layer is higher than a ratio of area of the first flat region, the second nitride semiconductor underlying layer has a lower surface in contact with the first oblique facet plane, and the second nitride semiconductor underlying layer has a flat upper surface, can be provided.

In addition, according to the second manner of the present invention, a nitride semiconductor light emitting element including any nitride semiconductor structure described above, a first-conductivity-type nitride semiconductor layer provided on the nitride semiconductor structure, a nitride semiconductor light emitting layer provided on the first-conductivity-type nitride semiconductor layer, a second-conductivity-type nitride semiconductor layer provided on the nitride semiconductor light emitting layer, a first electrode in contact with the first-conductivity-type nitride semiconductor layer, and a second electrode in contact with the second-conductivity-type nitride semiconductor layer, can be provided.

In addition, according to the second manner of the present invention, a nitride semiconductor transistor element including any nitride semiconductor structure described above, a first-conductivity-type nitride semiconductor electron transit layer provided on the nitride semiconductor structure, a first-conductivity-type nitride semiconductor electron supply layer provided on the first-conductivity-type nitride semiconductor electron transit layer, and an electrode provided on the first-conductivity-type nitride semiconductor electron supply layer, can be provided.

In addition, according to the second manner of the present invention, a method of manufacturing a nitride semiconductor structure including the steps of preparing a substrate composed of trigonal corundum or hexagonal crystal and having a c plane or a surface inclined with respect to the c plane in a range of 5° or smaller, forming a recess portion and a projection portion provided between the recess portions at the surface of the substrate, forming a nitride semiconductor intermediate layer on the surface of the substrate where the recess portion and the projection portion are formed, forming a third nitride semiconductor underlying layer on the nitride semiconductor intermediate layer at least in the recess portion, forming a first nitride semiconductor underlying layer at least on the third nitride semiconductor underlying layer, and forming a second nitride semiconductor underlying layer at least on the first nitride semiconductor underlying layer, in which the step of forming a third nitride semiconductor underlying layer is performed under such a condition that a surface of the third nitride semiconductor underlying layer has a third oblique facet plane and a third flat region and a ratio of area of the third oblique facet plane at the surface of the third nitride semiconductor underlying layer is lower than a ratio of area of the third flat region, the step of forming a first nitride semiconductor underlying layer is performed under such a condition that a first oblique facet plane surrounding the projection portion is formed, and the step of forming a second nitride semiconductor underlying layer is performed under such a condition that a lower surface of the second nitride semiconductor underlying layer is in contact with the first oblique facet plane and an upper surface of the second nitride semiconductor underlying layer is flat, can be provided.

Here, in a method of manufacturing a nitride semiconductor structure according to the second manner of the present invention, preferably, the step of forming a third nitride semiconductor underlying layer is performed under such a condition that a ratio of area of a rough surface region at the surface of the third nitride semiconductor underlying layer is not higher than 5%.

In addition, in the method of manufacturing a nitride semiconductor structure according to the second manner of the present invention, preferably, the step of forming a third nitride semiconductor underlying layer and a first nitride semiconductor underlying layer is performed to satisfy at least one condition selected from the group consisting of (i-2) setting a growth temperature during growth of the third nitride semiconductor underlying layer to be higher than a growth temperature during growth of the first nitride semiconductor underlying layer, (ii-2) setting a pressure during growth of the third nitride semiconductor underlying layer to be lower than a pressure during growth of the first nitride semiconductor underlying layer, and (iii-2) setting a V/III ratio of a gas supplied during growth of the third nitride semiconductor underlying layer to be lower than a V/III ratio of a gas supplied during growth of the first nitride semiconductor underlying layer.

In addition, in the method of manufacturing a nitride semiconductor structure according to the second manner of the present invention, preferably, the step of forming a third nitride semiconductor underlying layer, a first nitride semiconductor underlying layer, and a second nitride semiconductor underlying layer is performed to satisfy at least one condition selected from the group consisting of (I-3) setting a growth temperature during growth of the second nitride semiconductor underlying layer to be higher than a growth temperature during growth of the third nitride semiconductor underlying layer, (II-3) setting a pressure during growth of the second nitride semiconductor underlying layer to be lower than a pressure during growth of the third nitride semiconductor underlying layer, and (III-3) setting a V/III ratio of a gas supplied during growth of the second nitride semiconductor underlying layer to be lower than a V/III ratio of a gas supplied during growth of the third nitride semiconductor underlying layer, and is performed to satisfy at least one condition selected from the group consisting of (a-3) setting a growth temperature during growth of the second nitride semiconductor underlying layer to be higher than a growth temperature during growth of the first nitride semiconductor underlying layer, (b-3) setting a pressure during growth of the second nitride semiconductor underlying layer to be lower than a pressure during growth of the first nitride semiconductor underlying layer, and (c-3) setting a V/III ratio of a gas supplied during growth of the second nitride semiconductor underlying layer to be lower than a V/III ratio of a gas supplied during growth of the first nitride semiconductor underlying layer.

In addition, in the method of manufacturing a nitride semiconductor structure according to the second manner of the present invention, preferably, the nitride semiconductor intermediate layer is formed with sputtering.

In addition, in the method of manufacturing a nitride semiconductor structure according to the second manner of the present invention, preferably, the first oblique facet plane includes a plane inclined with respect to an m axis of a nitride semiconductor having a hexagonal structure.

In addition, in the method of manufacturing a nitride semiconductor structure according to the second manner of the present invention, preferably, the projection portion is arranged along a <11-20> direction of the substrate.

In addition, in the method of manufacturing a nitride semiconductor structure according to the second manner of the present invention, preferably, in a cross-sectional view passing through a center of the projection portion in a plan view of the surface of the substrate, the projection portion is in a shape having a tip end portion.

Further, according to the second manner of the present invention, a method of manufacturing a nitride semiconductor element including the steps of forming any nitride semiconductor structure described above and forming at least one nitride semiconductor layer on the nitride semiconductor structure can be provided.

In addition, according to a third manner of the present invention, a method of manufacturing a nitride semiconductor structure including the steps of preparing a substrate having a recess portion and a projection portion provided between the recess portions at its surface, forming a nitride semiconductor intermediate layer on the substrate, and forming on the nitride semiconductor intermediate layer, a first nitride semiconductor underlying layer having at least 6 first oblique facet planes surrounding the projection portion on an outer side of the projection portion with the projection portion being located in a center, in which the step of forming a first nitride semiconductor underlying layer includes the step of growing the first nitride semiconductor underlying layer with MOCVD by using a vertical MOCVD apparatus in which a carrier gas containing a hydrogen gas is used while the substrate is rotated, the number of rotations of the substrate per unit time is not lower than 400 RPM and not higher than 1000 RPM, and a volume ratio of the hydrogen gas with respect to a total volume of the carrier gas is not lower than 0.7 and not higher than 1, can be provided.

Here, preferably, the method of manufacturing a nitride semiconductor structure according to the third manner of the present invention further includes the step of forming a second nitride semiconductor underlying layer on the first nitride semiconductor underlying layer, and the steps of forming a first nitride semiconductor underlying layer and forming a second nitride semiconductor underlying layer are each the step of growing the first nitride semiconductor underlying layer and the second nitride semiconductor underlying layer with MOCVD in which a carrier gas containing a hydrogen gas is used while the substrate is rotated, and performed to satisfy at least one condition selected from the group consisting of (i-3) setting a growth temperature during growth of the first nitride semiconductor underlying layer to be lower than a growth temperature during growth of the second nitride semiconductor underlying layer, (ii-3) setting a pressure during growth of the first nitride semiconductor underlying layer to be higher than a pressure during growth of the second nitride semiconductor underlying layer, (iii-3) setting a V/III ratio of a source material gas supplied during growth of the first nitride semiconductor underlying layer to be higher than a V/III ratio of a source material gas supplied during growth of the second nitride semiconductor underlying layer, (iv-3) setting the number of rotations of the substrate per unit time during growth of the first nitride semiconductor underlying layer to be smaller than the number of rotations of the substrate per unit time during growth of the second nitride semiconductor underlying layer, and (v-3) setting a volume ratio of the hydrogen gas with respect to the total volume of the carrier gas during growth of the first nitride semiconductor underlying layer to be equal to or higher than a volume ratio of the hydrogen gas with respect to the total volume of the carrier gas during growth of the second nitride semiconductor underlying layer.

In addition, in the method of manufacturing a nitride semiconductor structure according to the third manner of the present invention, preferably, the step of preparing a substrate includes the step of forming the projection portion and the recess portion at a c plane of the substrate or a surface inclined with respect to the c plane in a range of 5° or smaller.

In addition, in the method of manufacturing a nitride semiconductor structure according to the third manner of the present invention, preferably, the substrate is composed of trigonal corundum or hexagonal crystal.

In addition, in the method of manufacturing a nitride semiconductor structure according to the third manner of the present invention, preferably, the projection portion is arranged along a <11-20> direction of the substrate.

In addition, in the method of manufacturing a nitride semiconductor structure according to the third manner of the present invention, preferably, in a cross-sectional view passing through a center of the projection portion in a plan view of the surface of the substrate, the projection portion is in a shape having a tip end portion.

In addition, in the method of manufacturing a nitride semiconductor structure according to the third manner of the present invention, preferably, the step of forming a nitride semiconductor intermediate layer includes the step of forming the nitride semiconductor intermediate layer with sputtering.

In addition, in the method of manufacturing a nitride semiconductor structure according to the third manner of the present invention, preferably, the nitride semiconductor intermediate layer is composed of a nitride semiconductor expressed with a formula AlN or $Al_xGa_{1-x}N$ ($0.5<x\leq1$).

Further, according to the third manner of the present invention, a method of manufacturing a nitride semiconductor element including the step of forming a nitride semiconductor layer on a surface of the second nitride semiconductor underlying layer manufactured with the method of manufacturing a nitride semiconductor structure described above can be provided.

According to the present invention, a nitride semiconductor structure allowing a nitride layer having excellent crystallinity to be formed in an upper portion thereof with good reproducibility, a nitride semiconductor light emitting element, a nitride semiconductor transistor element, a method of manufacturing a nitride semiconductor structure, and a method of manufacturing a nitride semiconductor element can be provided.

DETAILED DESCRIPTION OF THE INVENTION

Figure 1:
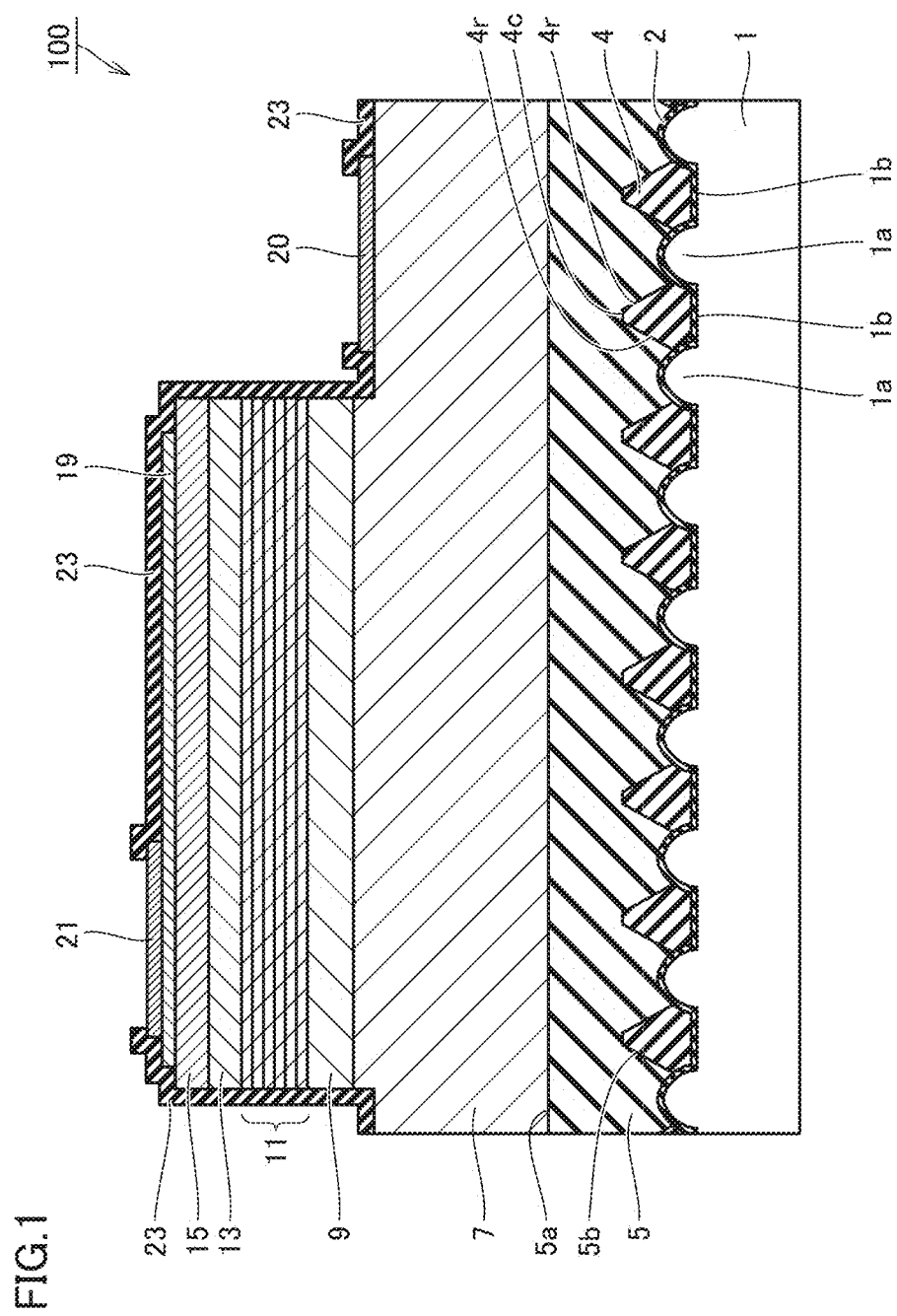
FIG. 1 is a schematic cross-sectional view of a nitride semiconductor light emitting diode element in an embodiment.

An embodiment of the present invention will be described below. It is noted that the same or corresponding portions have the same reference characters allotted in the drawings of the present invention.

<Crystal Orientation of Sapphire Substrate and Nitride Semiconductor Crystal>

A crystal system of (AlGaIn)N-based nitride semiconductor crystal is normally hexagonal, and a crystal system of sapphire is trigonal corundum, which, however, can be denoted with a hexagonal notation method. Then, regarding any of a sapphire substrate and a nitride semiconductor crystal, a direction of a c axis is denoted as [0001], a direction of an a1 axis is denoted as [−2110], a direction of an a2 axis is denoted as [1-210], a direction of an a3 axis is denoted as [11-20], and three directions of the direction of the a1 axis, the direction of the a2 axis, and the direction of the a3 axis are collectively denoted as a direction of an a axis or a <11-20> direction. In addition, three directions perpendicular to and equivalent to the direction of the c axis and the <11-20> direction are denoted as a direction of an m axis (most representatively, a <1-100> direction).

In denoting a crystal plane and a direction, they should essentially be expressed with a required number with a bar thereabove. Means for expression, however, is restricted, and hence a crystal plane and a direction are herein expressed with a required number preceded by "−", instead of an expression with a required number with a bar thereabove. For example, according to the crystallographic notation, an opposite direction of 1 should be denoted as 1 with a bar thereabove, however, it is denoted as "−1" for the sake of convenience.

Since there is a case where a direction of crystal of a substrate and a direction of crystal of a nitride semiconductor layer on the substrate are different from each other, attention should be paid to relation between a crystallographic axis of the substrate and a crystallographic axis of the nitride semiconductor layer. It is assumed herein that a direction of crystal of a substrate is denoted together with "sub", and a direction of crystal of a nitride semiconductor layer is denoted together with "layer". For example, in a case where a substrate is made of sapphire single crystal, a direction of an a (sub) axis of the substrate matches with a direction of an m (layer) axis of a nitride semiconductor layer, and a direction of an m (sub) axis of the substrate matches with a direction of an a (layer) axis of the nitride semiconductor layer. On the other hand, in a case where a substrate is composed of AlN single crystal or GaN single crystal, a direction of an a (sub) axis of the substrate matches with a direction of an a (layer) axis of a nitride semiconductor layer, and a direction of an m (sub) axis of the substrate matches with a direction of an m (layer) axis of the nitride semiconductor layer.

<Wafer>

A "wafer" herein refers to a substrate before division or a substrate before division on which each nitride semiconductor layer, an electrode, or other element necessary for a nitride semiconductor element has been formed.

<Warpage>

Then, "warpage" of a wafer herein is defined. "Warpage" of a wafer is mainly caused by stress originating from difference in rate of thermal expansion between a substrate and each nitride semiconductor layer. Here, a surface on a side where a nitride semiconductor layer is formed is defined as an upper surface of a wafer and a surface on a side where a nitride semiconductor layer is not formed is defined as a lower surface of the wafer. Then, a case where the wafer is warped in a shape convex on an upper surface side and a case where the wafer is warped in a shape convex on a lower surface side will be considered.

In the case where the wafer is warped in a shape convex on the upper surface side, an amount of warpage of the wafer is expressed by a maximum value of an interval (difference in height) between the lower surface of the wafer and a mount surface in a direction perpendicular to a flat surface when the wafer is mounted on the flat surface with its upper surface facing upward and the lower surface facing the flat surface, and a sign thereof is set to positive.

On the other hand, when the wafer is warped in a shape convex on the lower surface side, an amount of warpage of the wafer is expressed by a maximum value of an interval (difference in height) between the upper surface of the wafer and a virtual plane in contact with a periphery of the upper surface of the wafer in the direction perpendicular to the flat surface with its upper surface facing upward and the lower surface facing the flat surface, and a sign thereof is set to negative.

It is noted that magnitude of warpage of the wafer is also dependent on a wafer diameter, and as the wafer is greater in diameter, warpage of the wafer is greater. In particular, since breakage of a wafer due to warpage of the wafer is likely in a large-diameter wafer having a wafer diameter not smaller than approximately 4 inches, it is also important that the wafer is free of breakage. In addition, no crack is preferably caused in the surface of the wafer after each nitride semiconductor layer is grown on the substrate.

Furthermore, magnitude of warpage of the wafer is also dependent on a thickness of the substrate. For example, a sapphire substrate having a 4-inch diameter has a thickness of 0.9 mm, and a sapphire substrate having a 6-inch diameter has a thickness of 1.3 mm.

An amount of warpage of a wafer on which a nitride semiconductor layer is formed is preferably small to such an extent that a photolithography step, a grinding and polishing step, or the like can be performed without problems.

<Evaluation Method>

Crystallinity of a nitride semiconductor layer can be evaluated based on a half width of an X-ray rocking curve, such as a half width of an X-ray rocking curve at a GaN (004) plane (equal to a (0004) plane in hexagonal denotation). A smaller half width of an X-ray rocking curve indicates being close to single crystal, which is preferred. It is assumed herein that a half width of an X-ray rocking curve indicates a value measured at a wafer central portion, unless otherwise specified.

A crystal defect in a nitride semiconductor layer can be evaluated with a cathode luminescence (CL) method, etch pit density (EPD), or the like. Lower density of crystal defects indicates better crystallinity, which is preferred.

Embodiment 1-1

FIG. 1 shows a schematic cross-sectional view of a nitride semiconductor light emitting diode element in Embodiment 1-1 representing one example of a nitride semiconductor element according to the present invention.

A nitride semiconductor light emitting diode element 100 according to Embodiment 1-1 includes a substrate 1, a nitride semiconductor intermediate layer 2 provided in contact with a surface of substrate 1, a first nitride semiconductor underlying layer 4 provided in contact with a surface of nitride semiconductor intermediate layer 2, a second nitride semiconductor underlying layer 5 provided in contact with a surface of each of nitride semiconductor intermediate layer 2 and first nitride semiconductor underlying layer 4, an n-type nitride semiconductor contact layer 7 provided in contact with a surface of second nitride semiconductor underlying layer 5, an n-type nitride semiconductor clad layer 9 provided in contact with a surface of n-type nitride semiconductor contact layer 7, a nitride semiconductor active layer 11 provided in contact with a surface of n-type nitride semiconductor clad layer 9, a p-type nitride semiconductor clad layer 13 provided in contact with a surface of nitride semiconductor active layer 11, a p-type nitride semiconductor contact layer 15 provided in contact with a surface of p-type nitride semiconductor clad layer 13, and a light transmitting electrode layer 19 provided in contact with a surface of p-type nitride semiconductor contact layer 15.

Nitride semiconductor light emitting diode element 100 includes an n-side electrode 20 provided in contact with an exposed surface of n-type nitride semiconductor contact layer 7 and a p-side electrode 21 provided in contact with a surface of light transmitting electrode layer 19.

The surface of light transmitting electrode layer 19 and an exposed end surface of each of p-type nitride semiconductor contact layer 15, p-type nitride semiconductor clad layer 13, nitride semiconductor active layer 11, n-type nitride semiconductor clad layer 9, and n-type nitride semiconductor contact layer 7 are covered with an insulating protection film 23 composed of $SiO_2$ or the like.

Substrate 1 is composed of trigonal corundum or hexagonal crystal, and it has at its
surface, a recess portion 1b and a projection portion 1a provided between recess portions 1b.

First nitride semiconductor underlying layer 4 has at least 6 first oblique facet planes 4r surrounding projection portion 1a on an outer side of projection portion 1a of substrate 1 and has an upper surface 4c.

Second nitride semiconductor underlying layer 5 has a lower surface 5b in contact with first oblique facet plane 4r of first nitride semiconductor underlying layer 4 and has a flat upper surface 5a. A concept "flat" herein encompasses not only a case where upper surface 5a of second nitride semiconductor underlying layer 5 is completely flat but also a case where upper surface 5a of second nitride semiconductor underlying layer 5 is substantially flat. For example, flat upper surface 5a of second nitride semiconductor underlying layer 5 has surface roughness Ra (JIS B 0601:2001) not greater than 0.1 μm.

One example of a method of manufacturing nitride semiconductor light emitting diode element 100 according to Embodiment 1-1 will be described below.

Initially, substrate 1 composed of trigonal corundum or hexagonal crystal is prepared. For example, a substrate made of sapphire ($Al_2O_3$) single crystal, AlN single crystal, GaN single crystal, or the like can be employed as substrate 1 composed of trigonal corundum or hexagonal crystal.

A main surface of substrate 1 (a surface before projection portion 1a and recess portion 1b are formed) may be a c plane or a surface inclined with respect to the c plane by 5° or smaller, and a direction of inclination may be, for example, only in a direction of the m (sub) axis (<1-100>), only in a direction of the a (sub) axis (<11-20>), or in a direction which is combination of both of these directions. More specifically, such a substrate that a main surface of substrate 1 (a surface before projection portion 1a and recess portion 1b are formed) is inclined by 0.15° to 0.35° in the direction of the m (sub) axis <1-100> of the substrate with respect to the c plane (a plane of which normal is the c axis) or the like can be prepared as substrate 1.

Though a diameter of substrate 1 is not particularly limited, for example, it can be 150 mm (approximately 6 inches). Though a substrate having a diameter around 50.8 mm (2 inches) has conventionally generally been employed as substrate 1, a substrate having a large diameter is preferably employed for higher productivity. In a case of using substrate 1 having a large diameter, however, breakage of substrate 1 or a crack in a surface of a nitride semiconductor layer is more likely because strain is accumulated after a nitride semiconductor layer is formed on substrate 1. As will be described later, the present invention can suppress breakage of substrate 1 or a crack caused in a surface of a nitride semiconductor layer even in a case of using substrate 1 having a large diameter not smaller than 100 mm (approximately 4 inches).

Figure 2:
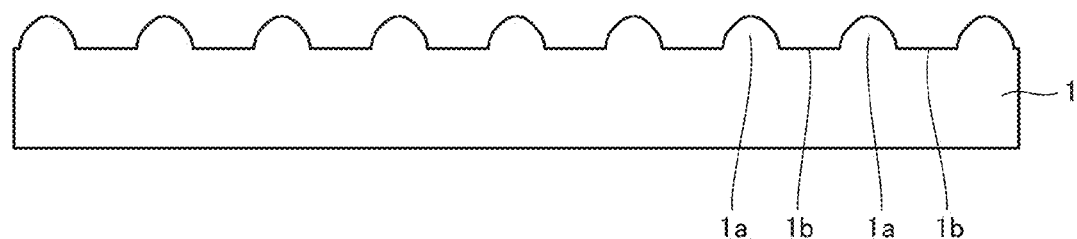
FIG. 2 is a schematic cross-sectional view illustrating a part of steps in one example of a method of manufacturing a nitride semiconductor light emitting diode element in the embodiment.

Then, as shown in a schematic cross-sectional view in FIG. 2, recess portion 1b and projection portion 1a provided between recess portions 1b are formed at the surface of substrate 1. Such projection portions 1a and recess portions 1b at the surface of substrate 1 can be formed, for example, through a patterning step of forming a mask defining two-dimensional arrangement of projection portions 1a on substrate 1 and a step of forming recess portions 1b by etching the surface of substrate 1 with the use of the mask formed in the patterning step. Here, the patterning step can be performed with a common photolithography step. An etching step can be performed, for example, with dry etching or wet etching. In order that a shape of projection portion 1a has a tip end portion which will be described later, however, dry etching with which a shape of projection portion 1a is readily controlled is preferably carried out.

Figure 3:
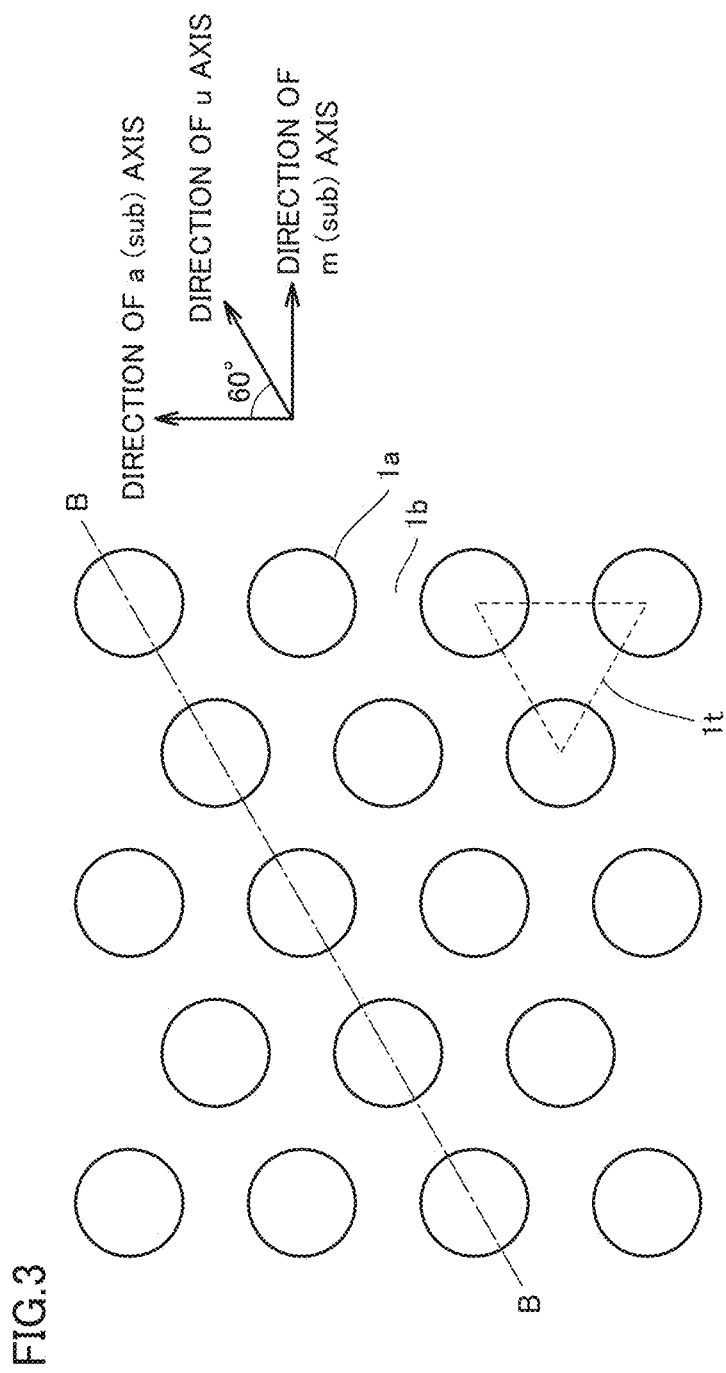
FIG. 3 is a schematic enlarged plan view of one example of a surface of a substrate shown in FIG. 2.

FIG. 3 shows a schematic enlarged plan view of one example of the surface of substrate 1 shown in FIG. 2. In the plan view of the surface of substrate 1 shown in FIG. 3, projection portion 1a having an annular two-dimensional shape is located, for example, at each vertex of a virtual triangle 1t, and arranged in a direction of each of three sides of virtual triangle 1t. In the present example, projection portion 1a is arranged in the direction of the a (sub) axis (<11-20> direction) of the surface of substrate 1, and arranged in a direction inclined by +60° with respect to the direction of the a (sub) axis of the surface of substrate 1 and in a direction inclined by −60° with respect to the direction of the a (sub) axis of the surface of substrate 1. It is noted herein that, in the plan view of the surface of substrate 1, the direction inclined by +60° with respect to the direction of the a (sub) axis and the direction inclined by −60° with respect to the direction of the a (sub) axis are both referred to as a u direction.

It is noted that a center of an annular circle which is a two-dimensional shape of projection portion 1a does not necessarily have to completely match with a vertex of triangle 1t and it should only substantially match therewith. Specifically, if a center of a circle is displaced by a radius of that circle or less, first nitride semiconductor underlying layer 4 tends to start growth on a region of recess portion 1b in a manner more stable than on a region of projection portion 1a. Then, as first nitride semiconductor underlying layer 4 further grows, first nitride semiconductor underlying layer 4 tends to be able to form at least 6 first oblique facet planes 4r so as to surround projection portion 1a on an outer side of projection portion 1a with projection portion 1a being located in the center.

A two-dimensional shape at a bottom surface of projection portion 1a is not limited to an annular shape, and it may be, for example, a polygonal shape such as a hexagonal and/or triangular shape.

In addition, in the plan view of the surface of substrate 1, an angle of each interior angle of virtual triangle 1t where projection portion 1a is arranged at each vertex is preferably not smaller than 50° and not greater than 70°. In this case, first nitride semiconductor underlying layer 4 tends to start growth on the region of recess portion 1b in a manner more stable than on the region of projection portion 1a. Then, as first nitride semiconductor underlying layer 4 further grows, first nitride semiconductor underlying layer 4 tends to be able to form at least 6 first oblique facet planes 4r so as to surround projection portion 1a on the outer side of projection portion 1a with projection portion 1a being located in the center.

Moreover, in the plan view of the surface of substrate 1, an interval between adjacent projection portions 1a is preferably not smaller than 0.2 μm and not greater than 7 μm and more preferably not smaller than 1 μm and not greater than 3 μm. When an interval between adjacent projection portions 1a is not smaller than 0.2 μm and not greater than 7 μm, a problem in terms of process tends to be less. The problem in terms of process includes, for example, a longer time period of dry etching for increasing a height of projection portion 1a, an excessively long time period of growth required until upper surface 5a of second nitride semiconductor underlying layer 5 is completely flat, and the like. It is noted herein that an interval between adjacent projection portions 1a means a shortest distance between adjacent projection portions 1a.

In the plan view of the surface of substrate 1, a diameter of an annular circle of projection portion 1a is preferably not smaller than ½ and not greater than ¾ of an interval between adjacent projection portions 1a. For example, when an interval between adjacent projection portions 1a is 2 μm, a diameter of an annular circle of projection portion 1a is more preferably around 1.2 μm. When a diameter of an annular circle of projection portion 1a is not smaller than ½ and not greater than ¾ of an interval between adjacent projection portions 1a and in particular around 1.2 μm, first nitride semiconductor underlying layer 4 tends to start growth on the region of recess portion 1b in a manner more stable than on the region of projection portion 1a. Then, as first nitride semiconductor underlying layer 4 further grows, first nitride semiconductor underlying layer 4 tends to be able to form at least 6 first oblique facet planes 4r so as to surround projection portion 1a on the outer side of projection portion 1a with projection portion 1a being located in the center.

Furthermore, a height of projection portion 1a is preferably not smaller than ¼ and not greater than 1 of a diameter of an annular circle of projection portion 1a. For example, when a diameter of an annular circle of projection portion 1a is 1.2 μm, a height of projection portion 1a is more preferably around 0.6 μm. In this case, first nitride semiconductor underlying layer 4 tends to start growth on the region of recess portion 1b in a manner more stable than on the region of projection portion 1a. Then, as first nitride semiconductor underlying layer 4 further grows, first nitride semiconductor underlying layer 4 tends to be able to form at least 6 first oblique facet planes 4r so as to surround projection portion 1a on the outer side of projection portion 1a with projection portion 1a being located in the center.

Figure 4:
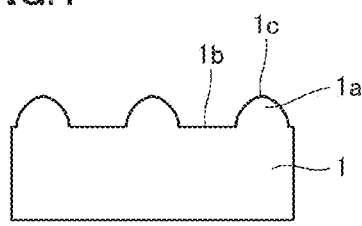
FIG. 4 is a schematic enlarged cross-sectional view along the line B-B passing through the center of a projection portion shown in FIG. 3.

FIG. 4 shows a schematic enlarged cross-sectional view along the line B-B passing through the center of the projection portion shown in FIG. 3. As shown in FIG. 4, in the cross-sectional view passing through the center of projection portion 1a in the plan view of the surface of substrate 1, projection portion 1a is preferably in a shape having a tip end portion 1c. It is noted herein that the shape of projection portion 1a having tip end portion 1c means that an upper surface of projection portion 1a is not in a flat shape in the cross-sectional view passing through the center of projection portion 1a in the plan view of the surface of substrate 1. In a case where the upper surface of projection portion 1a is flat, first nitride semiconductor underlying layer 4 which will be described later may grow not only on recess portion 1b but also on a flat upper surface of projection portion 1a. On the other hand, in a case where projection portion 1a is in a shape having tip end portion 1c, first nitride semiconductor underlying layer 4 grows from recess portion 1b and second nitride semiconductor underlying layer 5 which successively grows meets above tip end portion 1c of projection portion 1a. Therefore, it is considered that a region where a crystal defect is caused is limited and the number of defects as a whole can be decreased.

The surface of substrate 1 may be pre-treated before nitride semiconductor intermediate layer 2 is formed. One example of pre-treatment of the surface of substrate 1 includes, for example, such treatment as treatment for hydrogen-terminating the surface of substrate 1 by carrying out RCA cleaning (cleaning in which treatment with a diluted hydrofluoric acid aqueous solution (HF), treatment with ammonia ($NH_4OH$)+ hydrogen peroxide ($H_2O_2$), treatment with hydrochloric acid (HCl)+hydrogen peroxide ($H_2O_2$), and cleaning with ultrapure water are successively carried out). Thus, nitride semiconductor intermediate layer 2 having good crystallinity tends to be stacked on the surface of substrate 1 with good reproducibility.

Another example of pre-treatment of the surface of substrate 1 includes such treatment that the surface of substrate 1 is exposed to plasma of a nitrogen gas. Thus, such foreign matters as an organic substance or an oxide which has adhered to the surface of substrate 1 tend to be removed and a state of the surface of substrate 1 tends to be conditioned. In particular, in a case where substrate 1 is a sapphire substrate, by exposing the surface of substrate 1 to plasma of a nitrogen gas, the surface of substrate 1 is nitrided and nitride semiconductor intermediate layer 2 stacked on the surface of substrate 1 tends to be formed uniformly in the plane.

Figure 5:
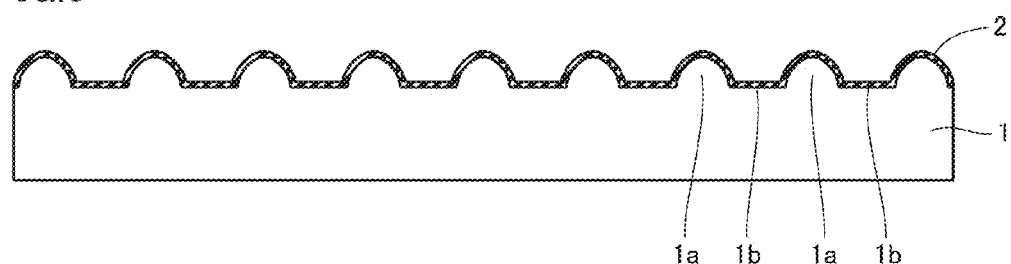
FIG. 5 is a schematic cross-sectional view illustrating another part of steps in one example of the method of manufacturing a nitride semiconductor light emitting diode element in the embodiment.

Then, as shown in a schematic cross-sectional view in FIG. 5, nitride semiconductor intermediate layer 2 is formed on the surface of substrate 1. Here, nitride semiconductor intermediate layer 2 can be formed, for example, with reactive sputtering in which an Al target is sputtered in a mixed atmosphere of $N_2$ and Ar.

For example, a layer composed of a semiconductor nitride expressed with a formula $Al_{x0}Ga_{y0}N$ ($0 \leq x \leq 1$, $0 \leq y0 \leq 1$ $x0+y0 \neq 0$) can be stacked as nitride semiconductor intermediate layer 2. Among others, a layer composed of a semiconductor nitride expressed with a formula AlN (aluminum nitride) or $Al_{x1}Ga_{1-x1}N$ ($0.5 < x1 \leq 1$) (aluminum gallium nitride) is preferably stacked as nitride semiconductor intermediate layer 2. In this case, nitride semiconductor intermediate layer 2 having good crystallinity and formed of an aggregate of column crystals uniform in crystal grain extending in a direction of the normal of the surface of substrate 1 tends to be obtained. Nitride semiconductor intermediate layer 2 may contain a trace amount of oxygen.

Nitride semiconductor intermediate layer 2 has a thickness preferably not smaller than 5 nm and not greater than 100 nm. When nitride semiconductor intermediate layer 2 has a thickness not smaller than 5 nm, nitride semiconductor intermediate layer 2 tends to sufficiently achieve a function as a buffer layer. When nitride semiconductor intermediate layer 2 has a thickness not greater than 100 nm, a function as a buffer layer tends to improve and a time period for forming nitride semiconductor intermediate layer 2 tends to be shortened. Nitride semiconductor intermediate layer 2 has a thickness more preferably not smaller than 10 nm and not greater than 50 nm. In this case, a function of nitride semiconductor intermediate layer 2 as a buffer layer tends to be achieved uniformly in the plane. By way of example of nitride semiconductor intermediate layer 2, an AlN film containing a trace amount of oxygen can be formed to a thickness of approximately 25 nm.

A temperature of substrate 1 during formation of nitride semiconductor intermediate layer 2 is preferably not lower than 300° C. and not higher than 1000° C. When a temperature of substrate 1 during formation of nitride semiconductor intermediate layer 2 is not lower than 300° C., nitride semiconductor intermediate layer 2 tends to cover the entire surface of substrate 1. When a temperature of substrate 1 during stacking of nitride semiconductor intermediate layer 2 is not higher than 1000° C., migration of a source material at the surface of substrate 1 is not excessively active, and nitride semiconductor intermediate layer 2 made of an aggregate of column crystals tends to be formed and a function of nitride semiconductor intermediate layer 2 as a buffer layer tends to improve.

Figure 6:
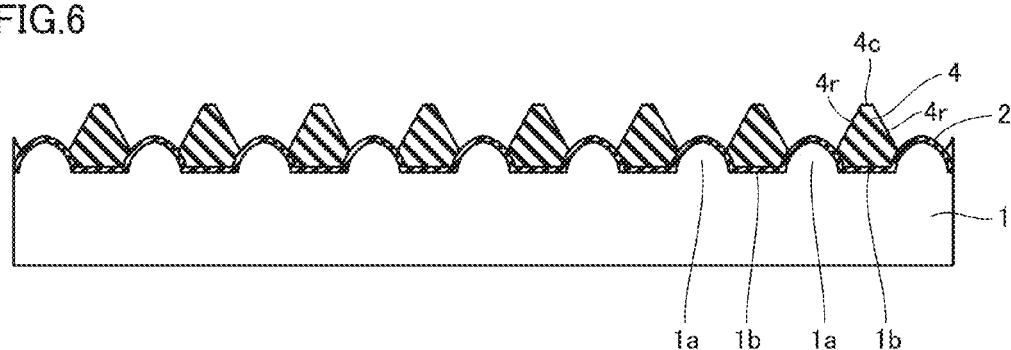
FIG. 6 is a schematic cross-sectional view illustrating another part of steps in one example of the method of manufacturing a nitride semiconductor light emitting diode element in the embodiment.
Figure 7:
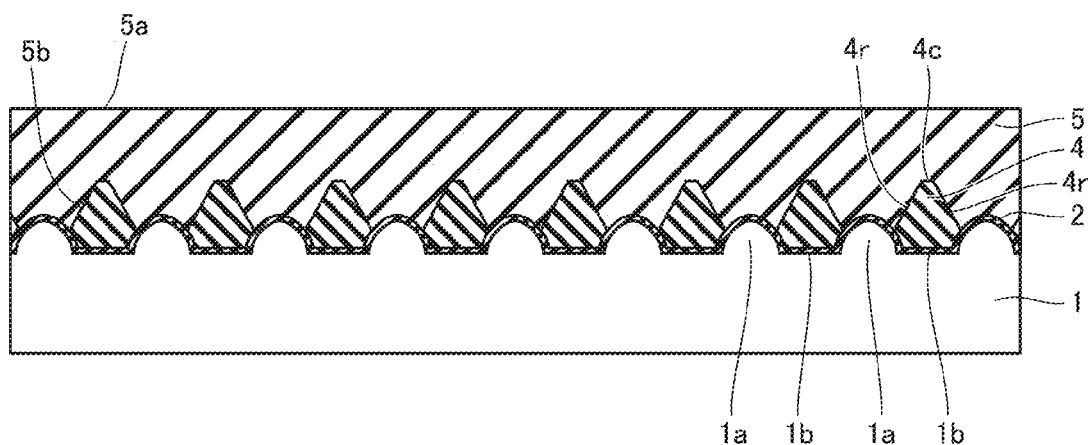
FIG. 7 is a schematic cross-sectional view illustrating another part of steps in one example of the method of manufacturing a nitride semiconductor light emitting diode element in the embodiment.

Then, as shown in a schematic cross-sectional view in FIG. 6, first nitride semiconductor underlying layer 4 is formed on the surface of nitride semiconductor intermediate layer 2, and as shown in a schematic cross-sectional view in FIG. 7, second nitride semiconductor underlying layer 5 is formed on the surface of first nitride semiconductor underlying layer 4.

Here, first nitride semiconductor underlying layer 4 and second nitride semiconductor underlying layer 5 can successively be formed on the surface of nitride semiconductor intermediate layer 2, for example, with MOCVD (Metal Organic Chemical Vapor Deposition). First nitride semiconductor underlying layer 4 is grown in a facet growth mode in which first oblique facet plane 4r is formed, and second nitride semiconductor underlying layer 5 is grown in an embedment growth mode in which first oblique facet plane 4r is buried and flat upper surface 5a is formed. Thus, second nitride semiconductor underlying layer 5 having few crystal defects, high crystallinity, and flat upper surface 5a can be formed. It is noted that a reference character 4c shown in FIG. 6 refers to an upper surface of first nitride semiconductor underlying layer 4.

Figure 8:
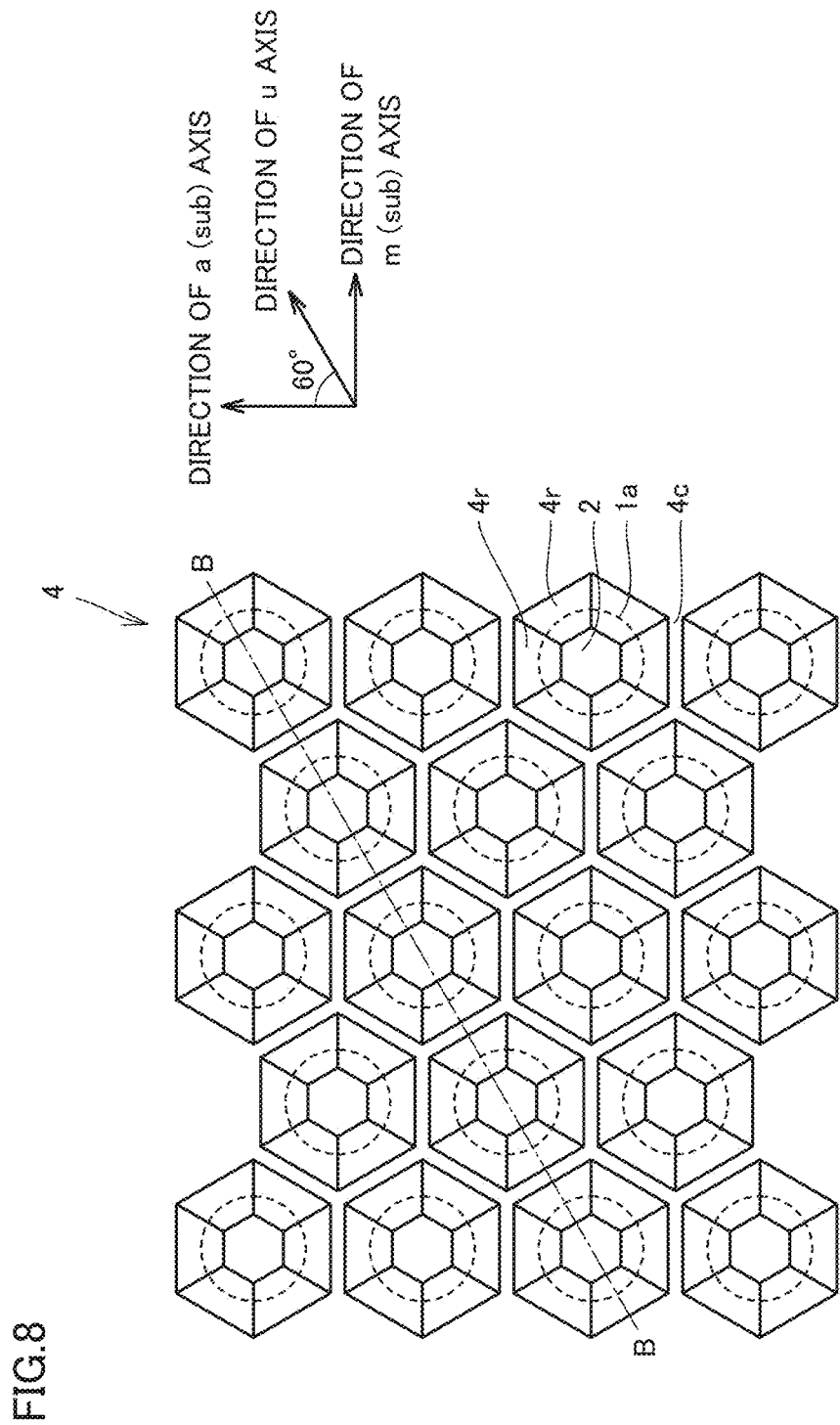
FIG. 8 is a schematic enlarged plan view of one example of a surface of a first nitride semiconductor underlying layer shown in FIG. 6.

FIG. 8 shows a schematic enlarged plan view of one example of the surface of first nitride semiconductor underlying layer 4 shown in FIG. 6. As shown in FIG. 8, first nitride semiconductor underlying layer 4 has 6 first oblique facet planes 4r surrounding projection portion 1a on the outer side of projection portion 1a. In the plan view shown in FIG. 8, two first oblique facet planes 4r appear in the direction of the a (sub) axis and two first oblique facet planes 4r appear in each of the direction inclined by an angle of 60° with respect to the direction of the a (sub) axis and the direction inclined by an angle of −60° with respect to the direction of the a (sub) axis (both of which are the u direction) (this case being referred to as a case 1-1). In addition, first oblique facet plane 4r which appears in a cross-section along the line B-B in FIG. 8 is a plane which similarly appears also in a direction of depth of a cross-section in a range where first oblique facet planes 4r are present.

Furthermore, one first oblique facet plane 4r surrounding projection portion 1a and another first oblique facet plane 4r surrounding projection portion 1a are coupled to each other at upper surface 4c of first nitride semiconductor underlying layer 4.

First oblique facet plane 4r of first nitride semiconductor underlying layer 4 is inclined downward from upper surface 4c of first nitride semiconductor underlying layer 4 toward projection 1a of substrate 1. Here, among 6 first oblique facet planes 4r, in the plan view of the surface of first nitride semiconductor underlying layer 4, two first oblique facet planes 4r which appear in the direction of the a (sub) axis are inclined obliquely upward with respect to the direction of the a (sub) axis (<11-20> direction) and the facet plane extends in the direction of inclination. In addition, similarly, in the plan view of the surface of first nitride semiconductor underlying layer 4, two first oblique facet planes 4r which appear in each of the direction inclined by an angle of +60° with respect to the direction of the a (sub) axis and the direction inclined by an angle of −60° with respect to the direction of the a (sub) axis are also inclined obliquely upward with respect to the direction inclined by an angle of +60° with respect to the direction of the a (sub) axis and the direction inclined by an angle of −60° with respect to the direction of the a (sub) axis, and the facet plane extends in the direction of inclination.

In addition, first oblique facet planes 4r of first nitride semiconductor underlying layer 4 serve as 6 facet planes surrounding projection portion 1a on the outer side of projection portion 1a with projection portion 1a being located in the center, on nitride semiconductor intermediate layer 2.

Moreover, in the plan view of the surface of first nitride semiconductor underlying layer 4, substantially no facet plane other than first oblique facet planes 4r which appear in the direction of the a (sub) axis and in the u directions preferably appears. More specifically, a ratio of area of first oblique facet planes 4r expressed with the following expression (I) is preferably not lower than 80% and more preferably not lower than 90%. When a ratio of area of first oblique facet planes 4r is not lower than 80% and in particular not lower than 90%, occurrence of breakage and crack of a wafer tends to be suppressed during growth of a nitride semiconductor layer stacked on upper surface 5a of second nitride semiconductor underlying layer 5 and in subsequent processes. Furthermore, crystallinity of a nitride semiconductor layer expressed with a half width of an X-ray rocking curve or the like also tends to improve. Additionally, defect density which can be evaluated based on a cathode luminescence (CL) method, etch pit density (EPD), or the like also tends to lower.

Specifically, a half width (arcsec) of an X-ray rocking curve at a (004) plane of a GaN underlying layer was 30 to 40 arcsec. Further, dark spot density obtained with the CL method was not higher than $2 \times 10^8$ cm$^{-3}$.

$$100 \times \text{(an area of first oblique facet planes } 4r \text{ occupying the surface of first nitride semiconductor underlying layer 4 in the plan view of the surface of first nitride semiconductor underlying layer 4)/(an area of a region other than upper surfaces } 4c \text{ and first oblique facet planes } 4r \text{ occupying the surface of first nitride semiconductor underlying layer 4 in the plan view of the surface of first nitride semiconductor underlying layer 4)}. \qquad (I)$$

As first nitride semiconductor underlying layer 4 grows and becomes thicker, first oblique facet planes 4r develop, and hence a ratio of area of upper surfaces 4c occupied in the total area of the surface of first nitride semiconductor underlying layer 4 lowers. The ratio of area of upper surfaces 4c occupied in the total area of the surface of first nitride semiconductor underlying layer 4 is preferably not higher than 20% and further preferably not higher than 10%. When the ratio of area of upper surfaces 4c above is not higher than 20% and in particular not higher than 10%, occurrence of breakage and crack of a wafer tends to be suppressed during growth of a nitride semiconductor layer stacked on upper surface 5a of second nitride semiconductor underlying layer 5 and in subsequent processes. In addition, crystallinity of a nitride semiconductor layer expressed with a half width of an X-ray rocking curve or the like can also improve. Additionally, defect density which can be evaluated with the CL method, EPD, or the like also tends to lower. It is noted that it is not necessary to continue the facet growth mode until upper surface 4c of first nitride semiconductor underlying layer 4 completely disappears.

The facet growth mode for first nitride semiconductor underlying layer 4 where first oblique facet plane 4r as described above appears can be realized by satisfying at least one condition selected from the group consisting of (i-1) setting a growth temperature during growth of first nitride semiconductor underlying layer 4 to be lower than a growth temperature during growth of second nitride semiconductor underlying layer 5, (ii-1) setting a pressure during growth of first nitride semiconductor underlying layer 4 to be higher than a pressure during growth of second nitride semiconductor underlying layer 5, and (iii-1) setting a V/III ratio of a gas (a molar ratio of a group V element with respect to a group III element in a supplied gas) supplied during growth of first nitride semiconductor underlying layer 4 to be higher than a V/III ratio of a gas supplied during growth of second nitride semiconductor underlying layer 5.

Specific conditions of (i-1), (ii-1), and (iii-1) above are shown, for example, as follows:

(i-1) A temperature of substrate 1 during growth of second nitride semiconductor underlying layer 5 is set to 1080° C. as compared with a temperature of 1000° C. of substrate 1 during growth of first nitride semiconductor underlying layer 4;

(ii-1) A pressure of an atmosphere during growth of second nitride semiconductor underlying layer 5 is set to 17.3 kPa as compared with a pressure of 66.6 kPa of an atmosphere during growth of first nitride semiconductor underlying layer 4; and (iii-1) A V/III ratio of a gas supplied during growth of second nitride semiconductor underlying layer 5 is set to 676 as compared with a V/III ratio of 1165 of a gas supplied during growth of first nitride semiconductor underlying layer 4.

By satisfying at least one condition selected from the group consisting of (i-1), (ii-1), and (iii-1) above, yield in an electrostatic discharge test (an ESD test) of a large number of semiconductor light emitting elements formed in a wafer can be not lower than 80%. It is noted that the ESD test is conducted under an HBM (human body model) condition in which a reverse voltage is set to 1 kV.

It is noted that a thickness of each of first nitride semiconductor underlying layer 4 and second nitride semiconductor underlying layer 5 is preferably not less than 0.7 time and not more than 4 times as great as an interval between adjacent projection portions 1a in the plan view of the surface of substrate 1 above. When a thickness of each of first nitride semiconductor underlying layer 4 and second nitride semiconductor underlying layer 5 is not less than 0.7 time as great as an interval between adjacent projection portions 1a, projection portion 1a tends to be buried, and when the thickness is not more than 4 times, first nitride semiconductor underlying layer 4 and second nitride semiconductor underlying layer 5 each tend to be a film having few crystal defects and hence having good crystallinity.

In addition, a thickness of first nitride semiconductor underlying layer 4 is preferably not less than 0.5 time and not more than 2 times as great as an interval between adjacent projection portions 1a in the plan view of the surface of substrate 1 above. When a thickness of first nitride semiconductor underlying layer 4 is not less than 0.5 time and not more than 2 times as great as an interval between adjacent projection portions 1a, first nitride semiconductor underlying layer 4 and second nitride semiconductor underlying layer 5 each tend to be a film having few crystal defects and hence having good crystallinity.

On the other hand, a thickness of second nitride semiconductor underlying layer 5 is preferably not less than 1 time and not more than 4 times as great as an interval between adjacent projection portions 1a in the plan view of the surface of substrate 1 above. When a thickness of second nitride semiconductor underlying layer 5 is not less than 1 time as great as an interval between adjacent projection portions 1a, second nitride semiconductor underlying layer 5 tends to bury projection portion 1a and upper surface 5a of second nitride semiconductor underlying layer 5 tends to be flat. When a thickness of second nitride semiconductor underlying layer 5 is more than 4 times as great as an interval between adjacent projection portions 1a, upper surface 5a of second nitride semiconductor underlying layer 5 has already become flat and hence only a time period of growth of second nitride semiconductor underlying layer 5 simply tends to be longer.

Figure 9:
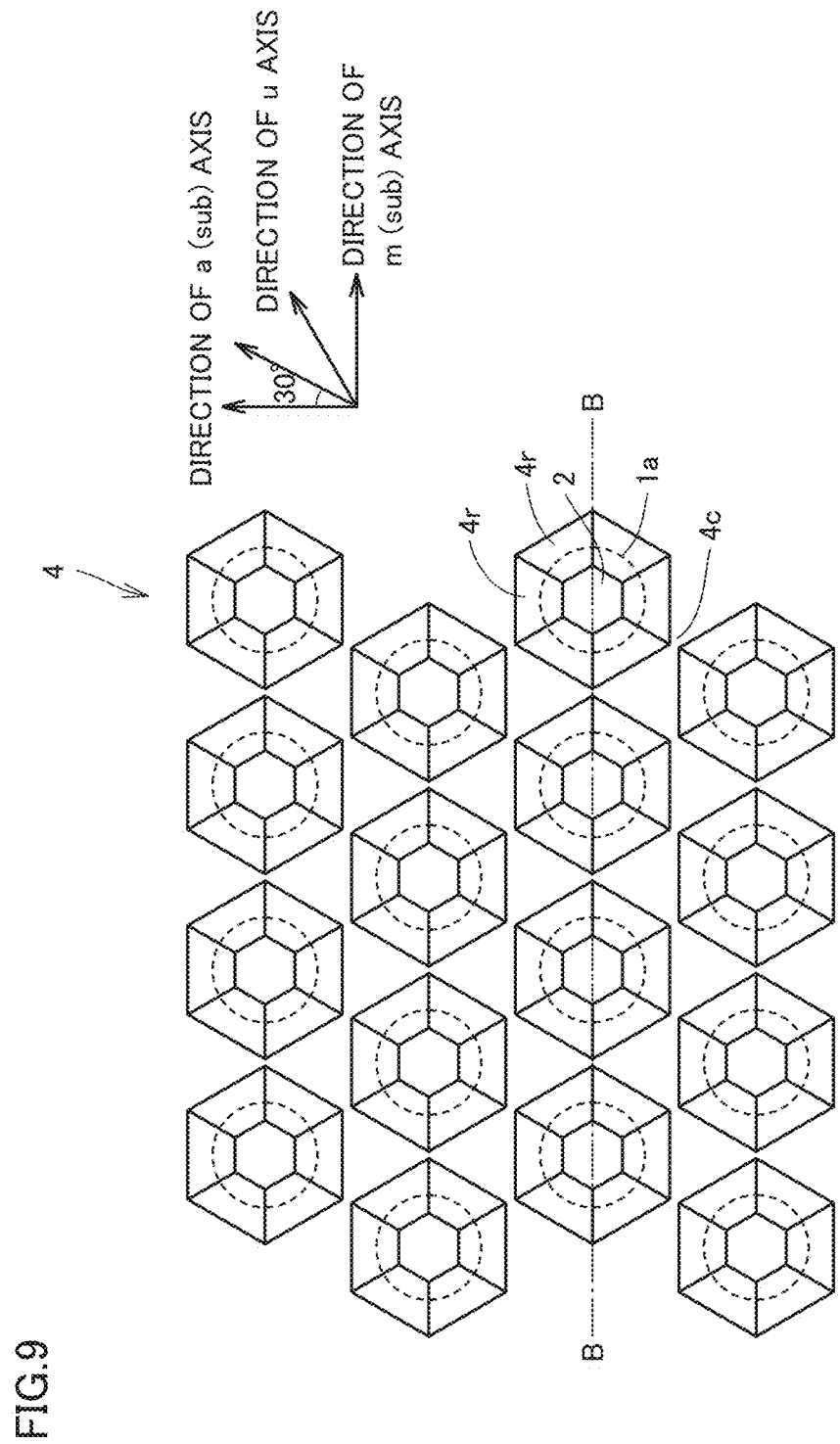
FIG. 9 is a schematic enlarged plan view of another example of the surface of the first nitride semiconductor underlying layer shown in FIG. 6.

FIG. 9 shows a schematic enlarged plan view of another example of the surface of first nitride semiconductor underlying layer 4 shown in FIG. 6. FIG. 9 shows positional relation between first oblique facet plane 4r and upper surface 4c of nitride semiconductor underlying layer 4 in a case where projection portions 1a at the surface of substrate 1 are arranged in a direction inclined by +30° with respect to the direction of the a (sub) axis and in a direction inclined by −30° with respect to the direction of the a (sub) axis (a case 1-2).

In a case of growing first nitride semiconductor underlying layer 4 in a facet mode in which 6 first oblique facet planes 4r are formed, first oblique facet planes 4r and upper surface 4c of nitride semiconductor underlying layer 4 are more likely to be affected by arrangement of projection portions 1a.

In case 1-2, in the plan view of the surface of first nitride semiconductor underlying layer 4, upper surface 4c of first nitride semiconductor underlying layer 4 is in such a shape as continuing triangles, and second nitride semiconductor underlying layer 5 is formed on upper surface 4c after switching to the embedment growth mode, which is a mode of growth of second nitride semiconductor underlying layer 5, has been made. Since upper surface 4c may have taken over crystal defects from an underlying layer thereof, growth on arrangement of projection portions 1a in case 1-2 tends to slightly be greater in the number of crystal defects in a nitride semiconductor film formed thereon.

In case 1-2, yield in an ESD test of a large number of semiconductor light emitting elements formed in a wafer was approximately 20%. It is noted that the ESD test is conducted under an HBM condition in which a reverse voltage is set to 1 kV.

Figure 10:
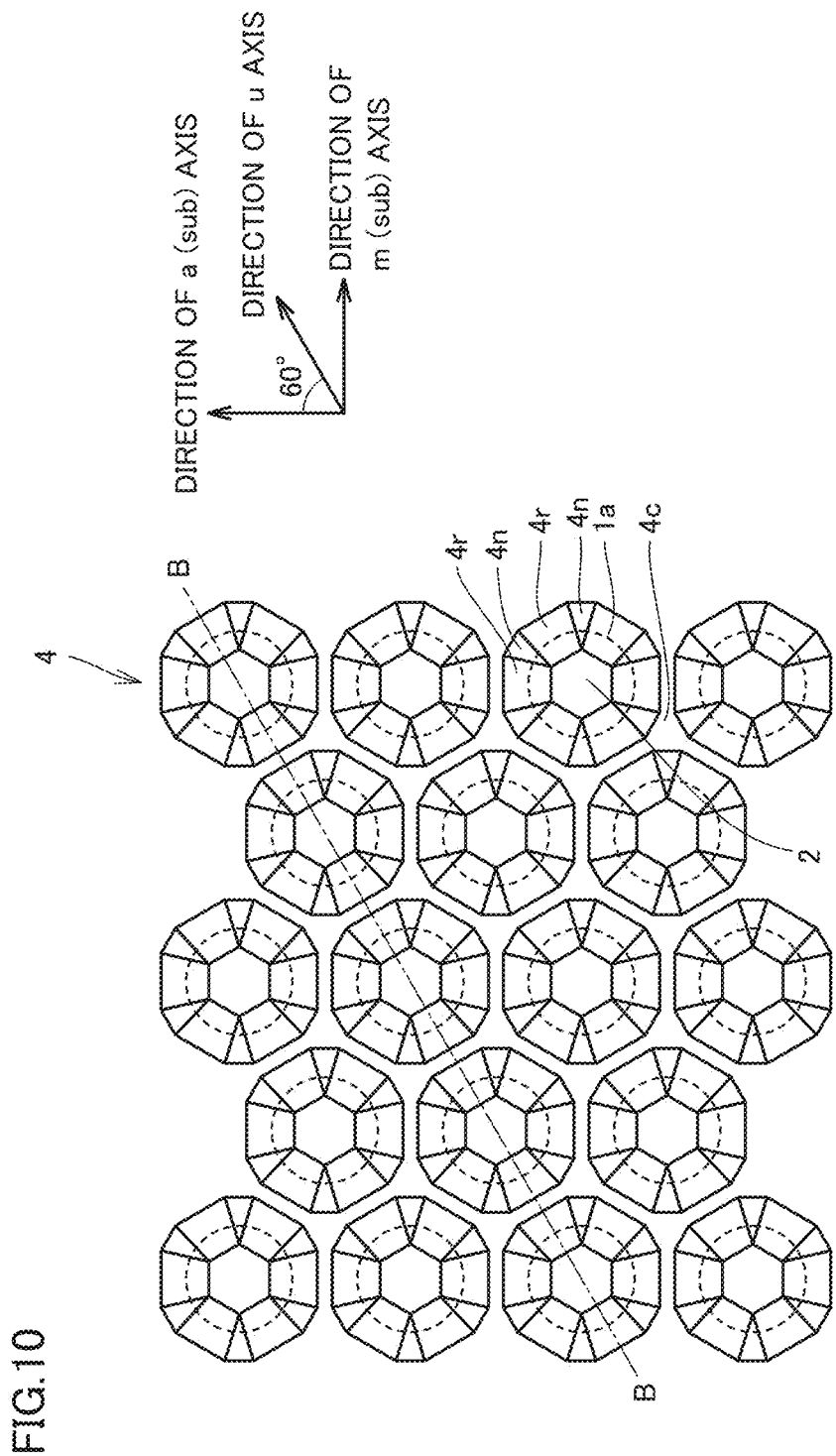
FIG. 10 is a schematic enlarged plan view of another example of the surface of the first nitride semiconductor underlying layer shown in FIG. 6.

FIG. 10 shows a schematic enlarged plan view of another example of the surface of first nitride semiconductor underlying layer 4 shown in FIG. 6. FIG. 10 shows the surface of first nitride semiconductor underlying layer 4 in a case (a case 1-3) where first nitride semiconductor underlying layer 4 is grown in a facet growth mode different from case 1-1, although arrangement of projection portions 1a at substrate 1 is the same as in case 1-1 above.

A condition for growth of first nitride semiconductor underlying layer 4 in case 1-3 is, for example, such that a temperature of substrate 1 during growth of first nitride semiconductor underlying layer 4 which was set to 1000° C. is raised to 1080° C. which is the same as a temperature of substrate 1 during growth of second nitride semiconductor underlying layer 5.

In first nitride semiconductor underlying layer 4 in case 1-3, in the plan view of the surface of first nitride semiconductor underlying layer 4 shown in FIG. 10, 12 facet planes consisting of 6 first oblique facet planes 4n which appear in a direction inclined by +30° with respect to the direction of the a (sub) axis, in a direction inclined by −30° with respect to the direction of the a (sub) axis, and in a direction of the m (sub) axis, in addition to 6 first oblique facet planes 4r which appear in the direction of the a (sub) axis and the u directions, are formed.

In case 1-3, yield in an ESD test of a large number of semiconductor light emitting elements formed in a wafer was approximately 70%. It is noted that the ESD test is conducted under an HBM condition in which a reverse voltage is set to 1 kV. It is noted that, in case 1-3, during growth with MOCVD and in subsequent processes, due to fluctuation of warpage of the entire wafer caused by temperature change, 3 of 4 wafers broke and measurement could not be conducted. It was thus found that, in a case where first oblique facet plane 4r and first oblique facet plane 4n both appear, breakage of a wafer is likely to take place. A hypothesis of this phenomenon is as follows. A crystal orientation of a film grown on first oblique facet plane 4r and a crystal orientation of a plane grown on first oblique facet plane 4n are slightly displaced from each other, which causes a line defect at an interface therebetween, and the film breaks along a line corresponding to a series of such lines. Consequently, strain involved with difference in thermal expansion between the film and substrate 1 may concentrate in that portion and a wafer may break.

Figure 11:
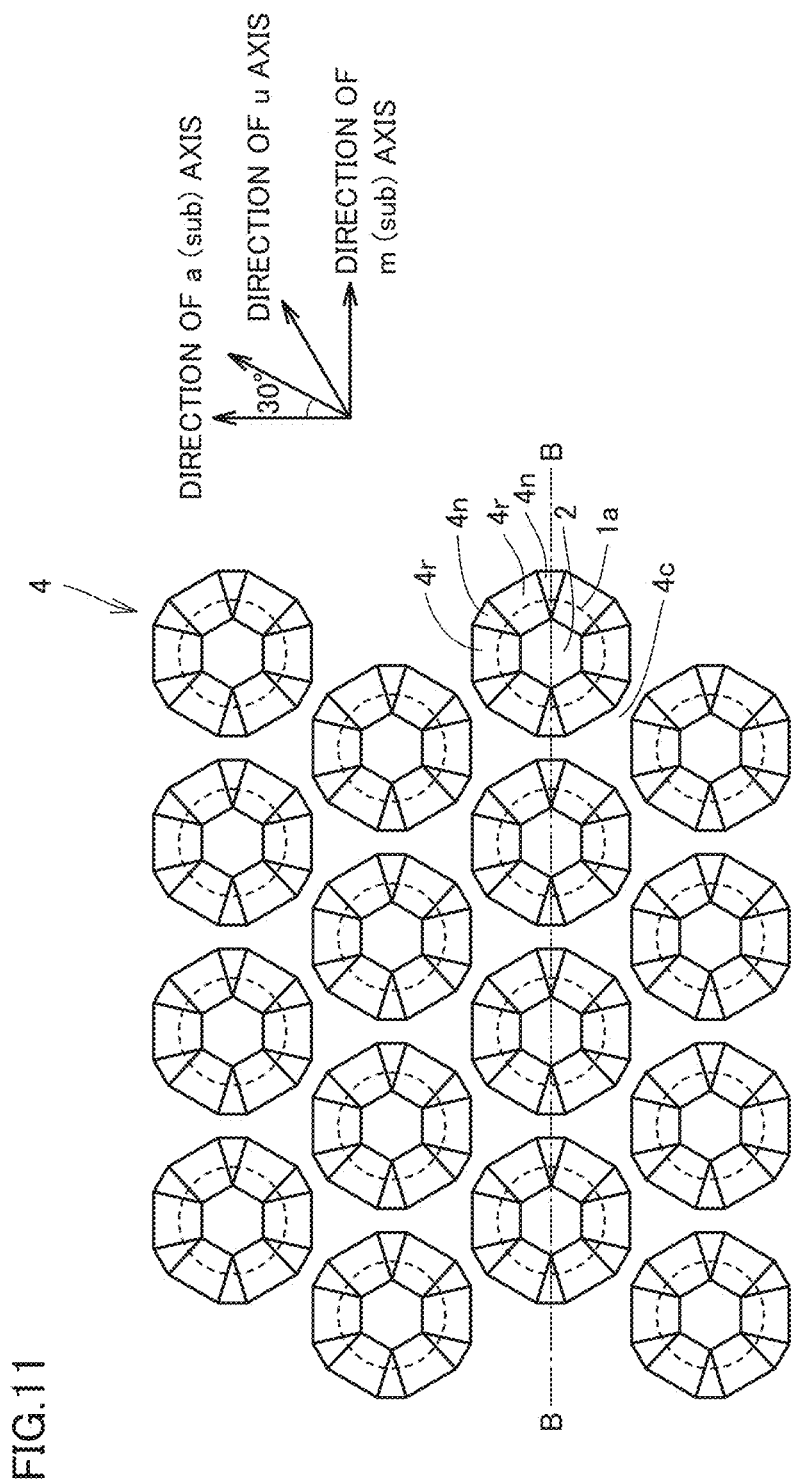
FIG. 11 is a schematic enlarged plan view of another example of the surface of the first nitride semiconductor underlying layer shown in FIG. 6.

FIG. 11 shows a schematic enlarged plan view of another example of the surface of first nitride semiconductor underlying layer 4 shown in FIG. 6. FIG. 11 shows the surface of nitride semiconductor underlying layer 4 in a case (a case 1-4) where arrangement of projection portions 1a is the same as that in case 1-2 and first nitride semiconductor underlying layer 4 is grown under growth conditions the same as those in case 1-3.

In first nitride semiconductor underlying layer 4 in case 1-4, in the plan view of the surface of first nitride semiconductor underlying layer 4 shown in FIG. 11, 12 facet planes consisting of 6 first oblique facet planes 4n which appear in directions inclined by ±30° with respect to the direction of the a (sub) axis and in the direction of the m (sub) axis, in addition to 6 first oblique facet planes 4r which appear in the direction of the a (sub) axis and the u directions, are formed.

In case 1-4, yield in an ESD test of a large number of semiconductor light emitting elements formed in a wafer was approximately 30%. It is noted that the ESD test is conducted under an HBM condition in which a reverse voltage is set to 1 kV.

It is noted that, as in case 1-3, in case 1-4 as well, during growth with MOCVD and in subsequent processes, 3 of 4 wafers broke.

From the foregoing results, the following matters (a-1) to (c-1) are derived:

(a-1) The facet growth mode in which first oblique facet plane 4r of first nitride semiconductor underlying layer 4 dominantly appears and first oblique facet plane 4n is less likely to appear is suitable because a wafer is less likely to break and high yield is obtained in an ESD test;

(b-1) It is suitable to decrease an area of upper surfaces 4c of first nitride semiconductor underlying layer 4 in the plan view of the surface of first nitride semiconductor underlying layer 4 because high yield is obtained in an ESD test; and (c-1) A large number of line defects extending upward from a lower surface of first nitride semiconductor underlying layer 4 are considered to be present at upper surface 4c of first nitride semiconductor underlying layer 4, and those defects are considered to be taken over also by second nitride semiconductor underlying layer 5 grown on facet plane 4c.

It is noted that, for example, a layer composed of a group III nitride semiconductor expressed with a formula $Al_{x2}Ga_{y2}In_{z2}N$ ($0 \leq x2 \leq 1$, $0 \leq y2 \leq 1$, $0 \leq z2 \leq 1$, $x2+y2+z2 \neq 0$) can be grown as first nitride semiconductor underlying layer 4. In addition, for example, a layer composed of a group III nitride semiconductor expressed with a formula $Al_{x3}Ga_{y3}In_{z3}N$ ($0 \leq x3 \leq 1$, $0 \leq y3 \leq 1$, $0 \leq z3 \leq 1$, $x3+y3+z3 \neq 0$) can be grown as second nitride semiconductor underlying layer 5.

In order not to take over such a crystal defect as dislocation in nitride semiconductor intermediate layer 2 made of an aggregate of column crystals, a nitride semiconductor layer containing Ga as a group III element is preferably employed for first nitride semiconductor underlying layer 4 and second nitride semiconductor underlying layer 5.

In order not to take over dislocation in nitride semiconductor intermediate layer 2, dislocation loop should be formed around an interface with nitride semiconductor intermediate layer 2. In a case where first nitride semiconductor underlying layer 4 is composed of a group III nitride semiconductor containing Ga, dislocation loop is likely to be formed. Then, by employing first nitride semiconductor underlying layer 4 composed of a group III nitride semiconductor containing Ga and second nitride semiconductor underlying layer 5 containing Ga, dislocation is confined as a loop around the interface with nitride semiconductor intermediate layer 2, so that taking over of dislocation from nitride semiconductor intermediate layer 2 into first nitride semiconductor underlying layer 4 tends to be suppressed.

For example, in a case where first nitride semiconductor underlying layer 4 is composed of a group III nitride semiconductor expressed with a formula $Al_{x2}Ga_{y2}N$ ($0<x2<1$, $0<y2<1$) and second nitride semiconductor underlying layer 5 is composed of a group III nitride semiconductor expressed with a formula $Al_{x0}Ga_{y3}N$ ($0 \leq x3<1$, $0<y3<1$) and in particular in a case where first nitride semiconductor underlying layer 4 and second nitride semiconductor underlying layer 5 are each composed of GaN, dislocation can be confined as a loop around the interface with nitride semiconductor intermediate layer 2, so that first nitride semiconductor underlying layer 4 and second nitride semiconductor underlying layer 5 having low dislocation density and good crystallinity tend to be obtained.

In addition, the surface of nitride semiconductor intermediate layer 2 immediately before first nitride semiconductor underlying layer 4 is formed may be subjected to heat treatment. Through this heat treatment, a cleaner surface and improvement in crystallinity of nitride semiconductor intermediate layer 2 tend to be achieved. This heat treatment can be carried out, for example, in an MOCVD apparatus in which MOCVD is employed, and for example, a hydrogen gas, a nitrogen gas, or the like can be employed as an atmospheric gas during heat treatment.

Moreover, in order to prevent decomposition of nitride semiconductor intermediate layer 2 during heat treatment above, an ammonia gas may be mixed with the atmospheric gas during heat treatment. Furthermore, heat treatment above can be carried out, for example, at a temperature not lower than 900° C. and not higher than 1250° C., for example, for a time period not shorter than 1 minute and not longer than 60 minutes.

First nitride semiconductor underlying layer 4 and second nitride semiconductor underlying layer 5 may be doped, for example, with an n-type dopant in a range not lower than $1\times10^{17}$ cm$^{-3}$ and not higher than $1\times10^{19}$ cm$^{-3}$. From a point of view of maintaining good crystallinity, however, first nitride semiconductor underlying layer 4 and second nitride semiconductor underlying layer 5 are preferably undoped.

For example, at least one or the like selected from the group consisting of silicon, germanium, and tin can be employed as an n-type dopant with which first nitride semiconductor underlying layer 4 and second nitride semiconductor underlying layer 5 are doped, and among these, use of silicon is preferred. In a case of using silicon as an n-type dopant, silane or disilane is preferably used as an n-type doping gas.

A temperature of substrate 1 during growth of each of first nitride semiconductor underlying layer 4 and second nitride semiconductor underlying layer 5 is preferably not lower than 800° C. and not higher than 1250° C. and more preferably not lower than 900° C. and not higher than 1150° C. When a temperature of substrate 1 during growth of each of first nitride semiconductor underlying layer 4 and second nitride semiconductor underlying layer 5 is not lower than 800° C. and not higher than 1250° C. and in particular not lower than 900° C. and not higher than 1150° C., first nitride semiconductor underlying layer 4 and second nitride semiconductor underlying layer 5 having few crystal defects and excellent crystallinity tend to be grown.

Figure 12:
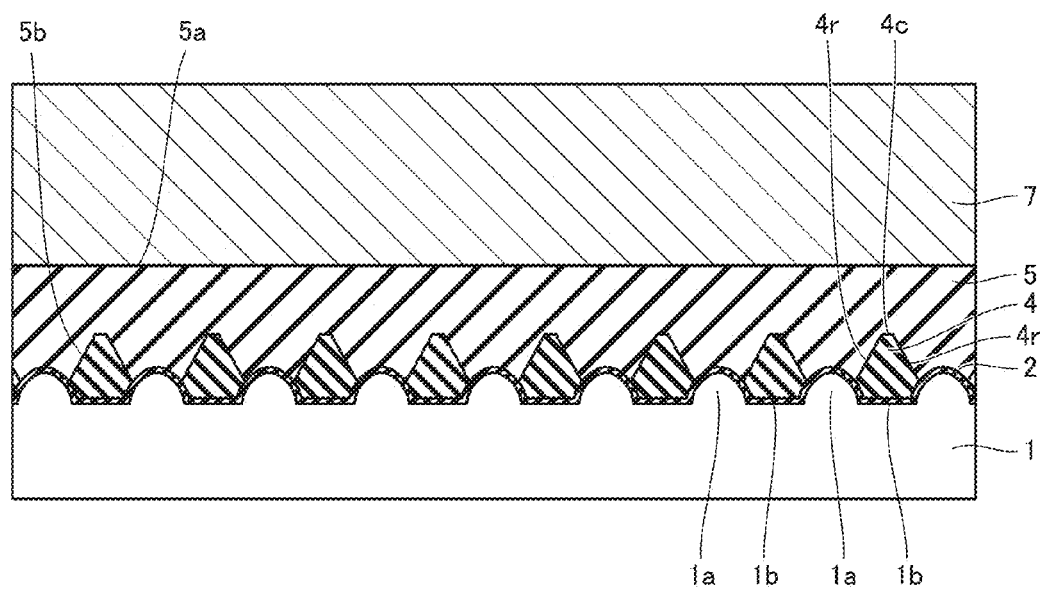
FIG. 12 is a schematic cross-sectional view illustrating another part of steps in one example of the method of manufacturing a nitride semiconductor light emitting diode element in the embodiment.

Then, as shown in a schematic cross-sectional view in FIG. 12, for example, with MOCVD, n-type nitride semiconductor contact layer 7 is formed on the surface of second nitride semiconductor underlying layer 5.

For example, a layer obtained by doping with an n-type dopant, a layer composed of a group III nitride semiconductor expressed with a formula $Al_{x4}Ga_{y4}In_{z4}N$ ($0\leq x4\leq 1$, $0\leq y4\leq 1$, $0\leq z4\leq 1$, $x4+y4-z4\neq 0$) or the like, can be formed as n-type nitride semiconductor contact layer 7.

Among others, a nitride semiconductor layer obtained by doping with silicon as an n-type dopant, a group III nitride semiconductor expressed with a formula $Al_{x4}Ga_{1-x4}N$ ($0\leq x4\leq 1$, preferably $0\leq x4\leq 0.5$, more preferably $0\leq x4\leq 0.1$), is preferred as n-type nitride semiconductor contact layer 7, because In which is readily volatilized is not handled and a growth temperature can be raised.

Concentration of doping of n-type nitride semiconductor contact layer 7 with an n-type dopant is preferably not lower than $5\times10^{17}$ cm$^{-3}$ and not higher than $5\times10^{19}$ cm$^{-3}$. In this case, good ohmic contact tends to be maintained between n-type nitride semiconductor contact layer 7 and n-side electrode 20, occurrence of a crack in n-type nitride semiconductor contact layer 7 tends to be suppressed, and good crystallinity of n-type nitride semiconductor contact layer 7 tends to be maintained.

A total thickness of first nitride semiconductor underlying layer 4, second nitride semiconductor underlying layer 5, and n-type nitride semiconductor contact layer 7 is preferably not smaller than 4 µm and not greater than 20 µm, more preferably not smaller than 4 µm and not greater than 15 µm, and further preferably not smaller than 6 µm and not greater than 15 µm. When a total thickness of first nitride semiconductor underlying layer 4, second nitride semiconductor underlying layer 5, and n-type nitride semiconductor contact layer 7 is smaller than 4 µm, crystallinity of these layers may become poorer or a pit may be caused in a surface of these layers. On the other hand, when a total thickness of first nitride semiconductor underlying layer 4, second nitride semiconductor underlying layer 5, and n-type nitride semiconductor contact layer 7 exceeds 15 µm, warpage of substrate 1 may become great and lowering in yield of an element may be caused. When a total thickness of first nitride semiconductor underlying layer 4, second nitride semiconductor underlying layer 5, and n-type nitride semiconductor contact layer 7 is not smaller than 4 µm and not greater than 15 µm and in particular not smaller than 6 µm and not greater than 15 µm, crystallinity of these layers tends to be good, warpage of substrate 1 tends to be great, and lowering in yield of an element tends to effectively be prevented. It is noted that an upper limit of a thickness of n-type nitride semiconductor contact layer 7 of the total thickness of these layers is not particularly limited.

Figure 13:
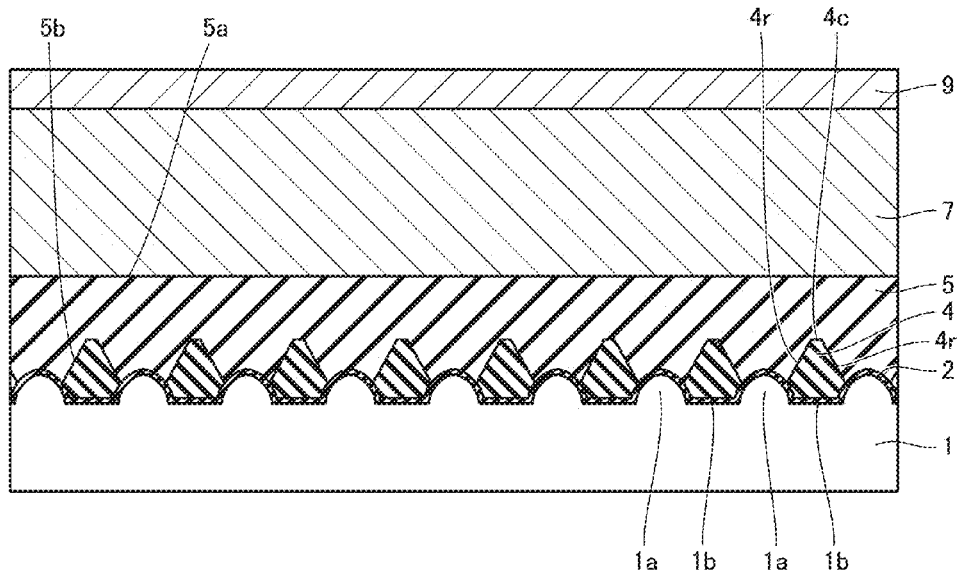
FIG. 13 is a schematic cross-sectional view illustrating another part of steps in one example of the method of manufacturing a nitride semiconductor light emitting diode element in the embodiment.

Then, as shown in a schematic cross-sectional view in FIG. 13, for example, with MOCVD, n-type nitride semiconductor clad layer 9 is formed on the surface of n-type nitride semiconductor contact layer 7.

For example, a layer obtained by doping with an n-type dopant, a layer composed of a group III nitride semiconductor expressed with a formula $Al_{x5}Ga_{y5}In_{z5}N$ ($0\leq x5\leq 1$, $0\leq y5\leq 1$, $0\leq z5\leq 1$, $x5+y5+z5\neq 0$) or the like, can be formed as n-type nitride semiconductor clad layer 9. N-type nitride semiconductor clad layer 9 may have a structure obtained by heterojunction of a plurality of nitride semiconductor layers composed of a group III nitride semiconductor or a superlattice structure.

Though a thickness of n-type nitride semiconductor clad layer 9 is not particularly limited, a thickness not smaller than 0.005 µm and not greater than 0.5 µm is preferred and a thickness not smaller than 0.005 µm and not greater than 0.1 µm is more preferred.

Concentration of doping of n-type nitride semiconductor clad layer 9 with an n-type dopant is preferably not lower than $1\times10^{17}$ cm$^{-3}$ and not higher than $1\times10^{20}$ cm$^{-3}$ and more preferably not lower than $1\times10^{18}$ cm$^{-3}$ and not higher than $1\times10^{19}$ cm$^{3}$. In this case, good crystallinity of n-type nitride semiconductor clad layer 9 tends to be maintained and an operation voltage of an element tends to be lowered.

Figure 14:
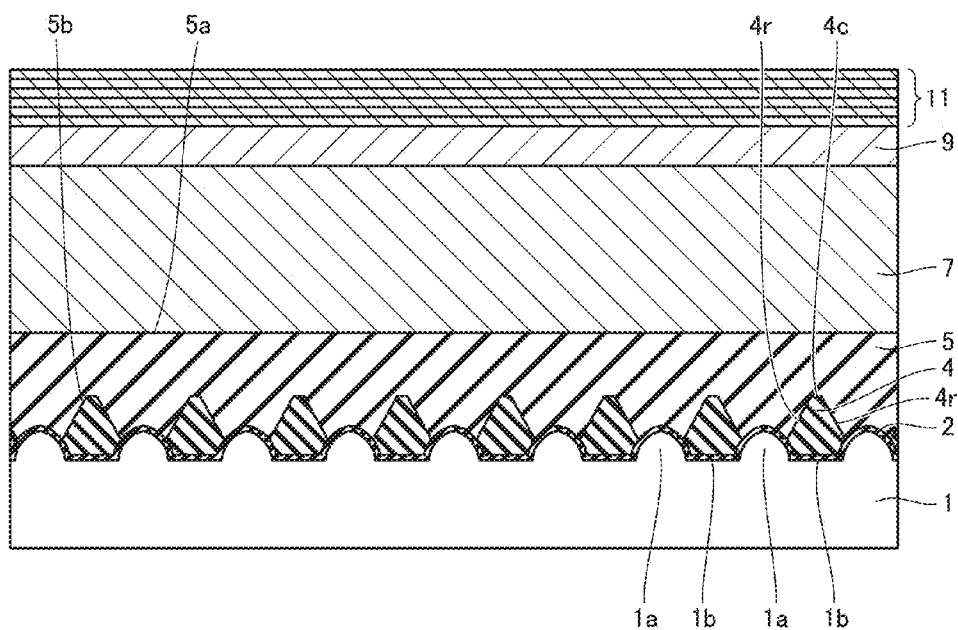
FIG. 14 is a schematic cross-sectional view illustrating another part of steps in one example of the method of manufacturing a nitride semiconductor light emitting diode element in the embodiment.

Then, as shown in a schematic cross-sectional view in FIG. 14, for example, with MOCVD, nitride semiconductor active layer 11 is formed on the surface of n-type nitride semiconductor clad layer 9.

When nitride semiconductor active layer 11 has, for example, a single quantum well (SQW) structure, for example, a layer having as a quantum well layer, a layer composed of a group III nitride semiconductor expressed with a formula $Ga_{1-z6}In_{z6}N$ (0<z6<0.4), can be employed as nitride semiconductor active layer 11.

Though a thickness of nitride semiconductor active layer 11 is not particularly limited, a thickness not smaller than 1 nm and not greater than 10 nm is preferred and a thickness not smaller than 1 nm and not greater than 6 nm is more preferred. When a thickness of nitride semiconductor active layer 11 is not smaller than 1 nm and not greater than 10 nm and in particular not smaller than 1 nm and not greater than 6 nm, emission output of nitride semiconductor light emitting diode element 100 tends to improve.

When nitride semiconductor active layer 11 has a single quantum well (SQW) structure, for example, having as a quantum well layer, a layer composed of a group III nitride semiconductor expressed with the formula $Ga_{1-z6}In_{z6}N$ (0<z6<0.4), In composition or a thickness of nitride semiconductor active layer 11 can be controlled such that an emission wavelength of nitride semiconductor light emitting diode element 100 attains to a desired emission wavelength.

When a temperature of substrate 1 during formation of nitride semiconductor active layer 11 is low, however, crystallinity may become poor. On the other hand, when a temperature of substrate 1 during formation of nitride semiconductor active layer 11 is high, sublimation of InN may become noticeable, efficiency in taking In into a solid phase may be lowered, and In composition may fluctuate. Therefore, a temperature of substrate 1 during formation of nitride semiconductor active layer 11 formed from a single quantum well (SQW) structure having as a well layer, a layer composed of a group III nitride semiconductor expressed with the formula $Ga_{1-z6}In_{z6}N$ (0<z6<0.4), is preferably not lower than 700° C. and not higher than 900° C. and more preferably not lower than 750° C. and not higher than 850° C.

Furthermore, for example, a layer having a multiple quantum well (MQW) structure formed by alternately stacking a quantum well layer composed of a group III nitride semiconductor expressed with the formula $Ga_{1-z6}In_{z6}N$ (0<z6<0.4) and a quantum barrier layer composed of a group III nitride semiconductor expressed with a formula $Al_{x0}Ga_{y7}In_{z7}N$ (0≤x7≤1, 0≤y7≤1, 0≤z7≤1, x7+y7+z7≠0) greater in band gap than the quantum well layer can also be employed as nitride semiconductor active layer 11. It is noted that the quantum well layer and/or the quantum barrier layer above may be doped with an n-type or p-type dopant.

Figure 15:
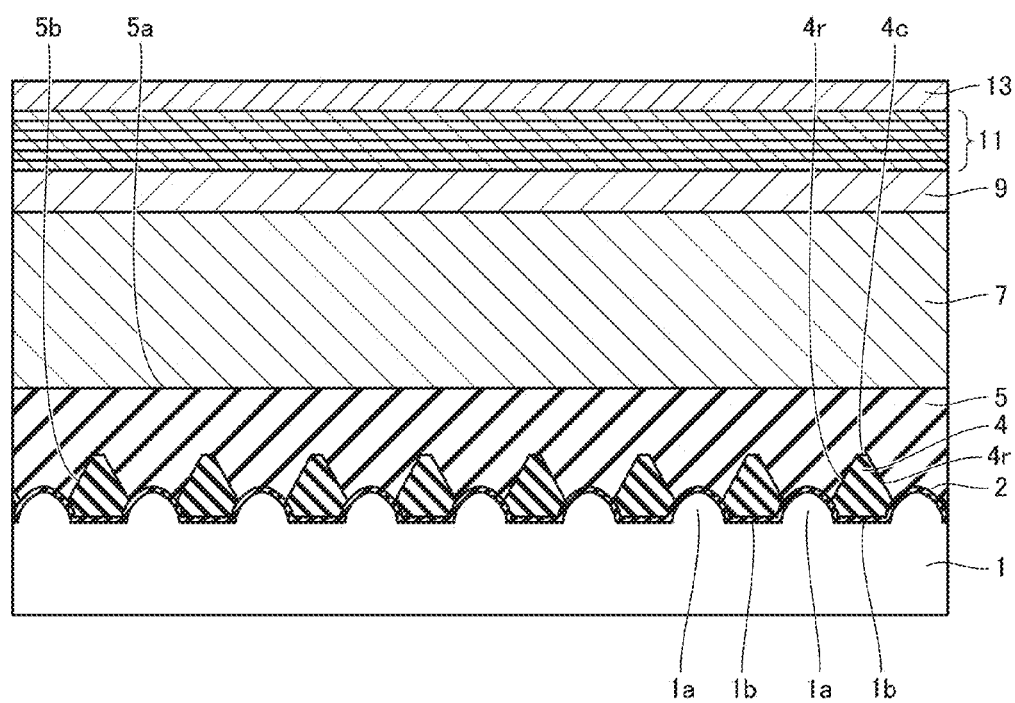
FIG. 15 is a schematic cross-sectional view illustrating another part of steps in one example of the method of manufacturing a nitride semiconductor light emitting diode element in the embodiment.

Then, as shown in a schematic cross-sectional view in FIG. 15, for example, with MOCVD, p-type nitride semiconductor clad layer 13 is formed on the surface of nitride semiconductor active layer 11.

For example, a layer obtained by doping with a p-type dopant, a group III nitride semiconductor expressed with a formula $Al_{x8}Ga_{y8}In_{z8}N$ (0≤x8≤1, 0≤y8≤1, 0≤z8≤1, x8+y8+z8≠0) or the like, can be stacked as p-type nitride semiconductor clad layer 13. Among others, a layer obtained by doping with a p-type dopant, a group III nitride semiconductor expressed with a formula $Al_{x8}Ga_{1-x8}N$ (0<x8≤0.4, preferably 0.1≤x8≤0.3), is preferably stacked as p-type nitride semiconductor clad layer 13. It is noted that, for example, magnesium or the like can be employed for a p-type dopant.

From a point of view of optical confinement in nitride semiconductor active layer 11, p-type nitride semiconductor clad layer 13 is preferably greater in band gap than nitride semiconductor active layer 11.

Though a thickness of p-type nitride semiconductor clad layer 13 is not particularly limited, a thickness not smaller than 0.01 μm and not greater than 0.4 μm is preferred and a thickness not smaller than 0.02 μm and not greater than 0.1 μm is more preferred.

Concentration of doping of p-type nitride semiconductor clad layer 13 with a p-type dopant is preferably not lower than $1\times10^{18}$ cm$^{-3}$ and not higher than $1\times10^{21}$ cm$^{-3}$ and more preferably not lower than $1\times10^{19}$ cm$^{-3}$ and not higher than $1\times10^{21}$ cm$^{-3}$. When concentration of doping of p-type nitride semiconductor clad layer 13 with a p-type dopant is not lower than $1\times10^{18}$ cm$^{-3}$ and not higher than $1\times10^{21}$ cm$^{3}$ and in particular not lower than $1\times10^{19}$ cm$^{-3}$ and not higher than $1\times10^{20}$ cm$^{-3}$, p-type nitride semiconductor clad layer 13 having good crystallinity tends to be obtained.

Figure 16:
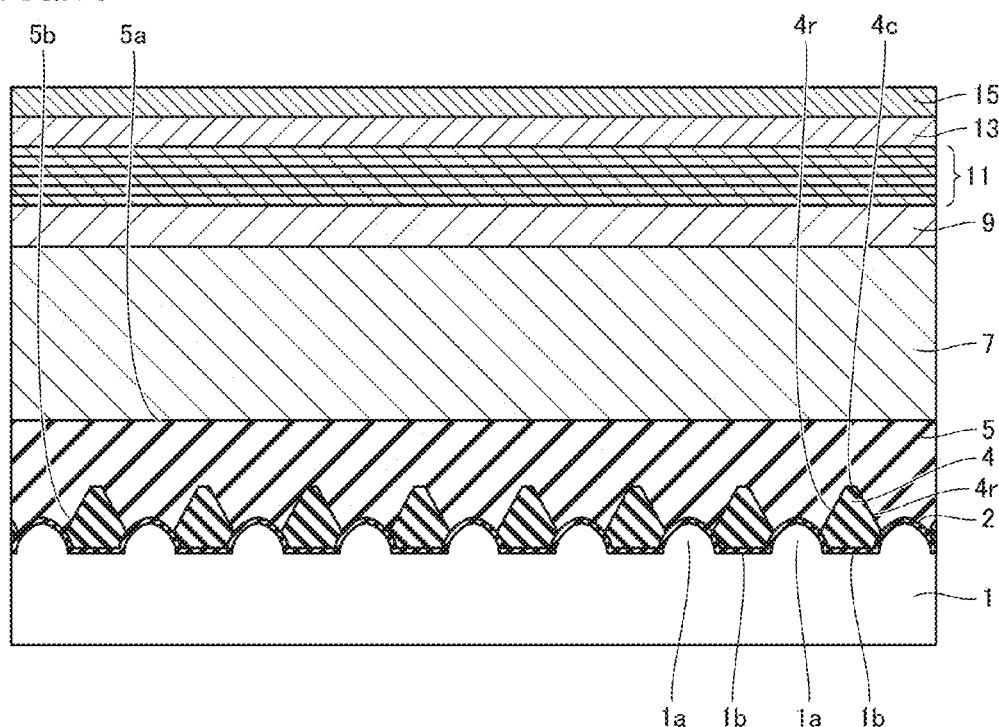
FIG. 16 is a schematic cross-sectional view illustrating another part of steps in one example of the method of manufacturing a nitride semiconductor light emitting diode element in the embodiment.

Then, as shown in a schematic cross-sectional view in FIG. 16, for example, with MOCVD, p-type nitride semiconductor contact layer 15 is formed on the surface of p-type nitride semiconductor clad layer 13.

For example, a layer obtained by doping with a p-type dopant, a group III nitride semiconductor expressed with a formula $Al_{x9}Ga_{y9}In_{z9}N$ (0≤x9≤1, 0≤y9≤1, 0≤z9≤1, x9+y9+z9≠0) or the like, can be stacked as p-type nitride semiconductor contact layer 15. Among others, a layer obtained by doping a GaN layer with a p-type dopant is preferably employed as p-type nitride semiconductor contact layer 15. In this case, good crystallinity of p-type nitride semiconductor contact layer 15 tends to be maintained and good ohmic contact with light transmitting electrode layer 19 tends to be obtained.

Concentration of doping of p-type nitride semiconductor contact layer 15 with a p-type dopant is preferably not lower than $1\times10^{18}$ cm$^{-3}$ and not higher than $1\times10^{21}$ cm$^{-3}$ and more preferably not lower than $5\times10^{19}$ cm$^{-3}$ and not higher than $5\times10^{20}$ cm$^{-3}$. When concentration of doping of p-type nitride semiconductor contact layer 15 with a p-type dopant is not lower than $1\times10^{18}$ cm$^{-3}$ and not higher than $1\times10^{21}$ cm$^{-3}$ and in particular not lower than $5\times10^{19}$ cm$^{-3}$ and not higher than $5\times10^{20}$ cm$^{-3}$, good ohmic contact with light transmitting electrode layer 19 tends to be maintained, occurrence of a crack in p-type nitride semiconductor contact layer 15 tends to be suppressed, and good crystallinity of p-type nitride semiconductor contact layer 15 tends to be maintained.

Though a thickness of p-type nitride semiconductor contact layer 15 is not particularly limited, a thickness not smaller than 0.01 μm and not greater than 0.5 μm is preferred and a thickness not smaller than 0.05 μm and not greater than 0.2 μm is more preferred. When a thickness of p-type nitride semiconductor contact layer 15 is not smaller than 0.01 μm and not greater than 0.5 μm and in particular not smaller than 0.05 μm and not greater than 0.2 μm, emission output of nitride semiconductor light emitting diode element 100 tends to improve.

It is noted that, when each of n-type nitride semiconductor contact layer 7, n-type nitride semiconductor clad layer 9, nitride semiconductor active layer 11, p-type nitride semiconductor clad layer 13, and p-type nitride semiconductor contact layer 15 is composed of a group III nitride semiconductor, these layers can each be stacked, for example, with MOCVD using a gas below.

Namely, for example, at least one group-III-element organic metal source material gas selected from the group consisting of trimethylgallium (TMG), trimethylaluminum (TMA), and trimethylindium (TMI), and a nitrogen source material gas such as ammonia are supplied into a reaction furnace of an MOCVD apparatus, to thereby achieve thermal decomposition and reaction thereof. Thus, the layers above can each be stacked.

When doping with silicon representing an n-type dopant is carried out, doping with silicon can be achieved, for example, by adding silane ($SiH_4$) or disilane ($Si_2H_6$) as a doping gas to the source material gas above and supplying the resultant gas into the reaction furnace of the MOCVD apparatus.

When doping with magnesium representing a p-type dopant is carried out, doping with magnesium can be achieved, for example, by adding bis(cyclopentadienyl) magnesium ($CP_2Mg$) as a doping gas to the source material gas above and supplying the resultant gas into the reaction furnace of the MOCVD apparatus.

Figure 17:
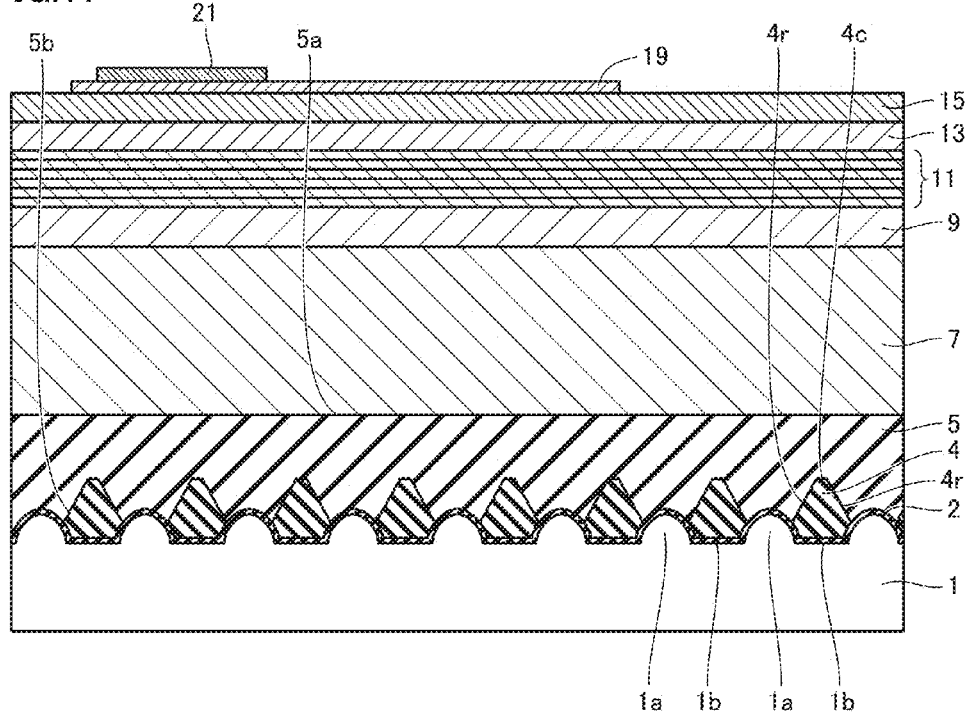
FIG. 17 is a schematic cross-sectional view illustrating another part of steps in one example of the method of manufacturing a nitride semiconductor light emitting diode element in the embodiment.

Then, as shown in a schematic cross-sectional view in FIG. 17, after light transmitting electrode layer 19 composed, for example, of ITO (Indium Tin Oxide) is formed on the surface of p-type nitride semiconductor contact layer 15, p-side electrode 21 is formed on the surface of light transmitting electrode layer 19. For example, a stack film of a nickel layer, an aluminum layer, a titanium layer, and a gold layer can be formed as p-side electrode 21.

Figure 18:
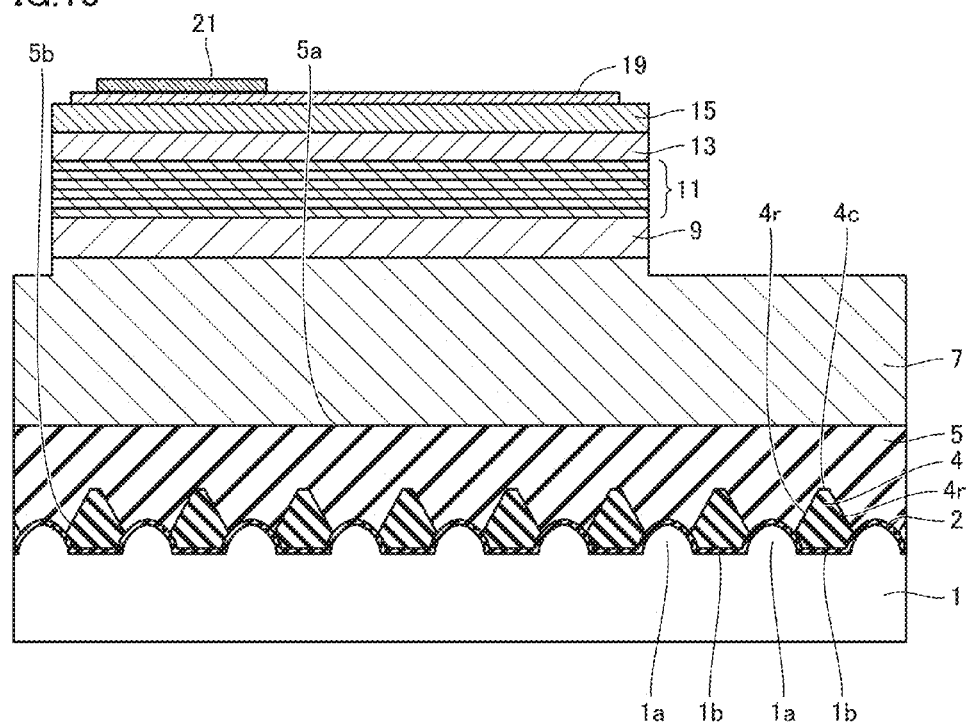
FIG. 18 is a schematic cross-sectional view illustrating another part of steps in one example of the method of manufacturing a nitride semiconductor light emitting diode element in the embodiment.

Then, as shown in a schematic cross-sectional view in FIG. 18, a part of the surface of n-type nitride semiconductor contact layer 7 is exposed by etching away a part of a stack structure after p-side electrode 21 is formed.

Figure 19:
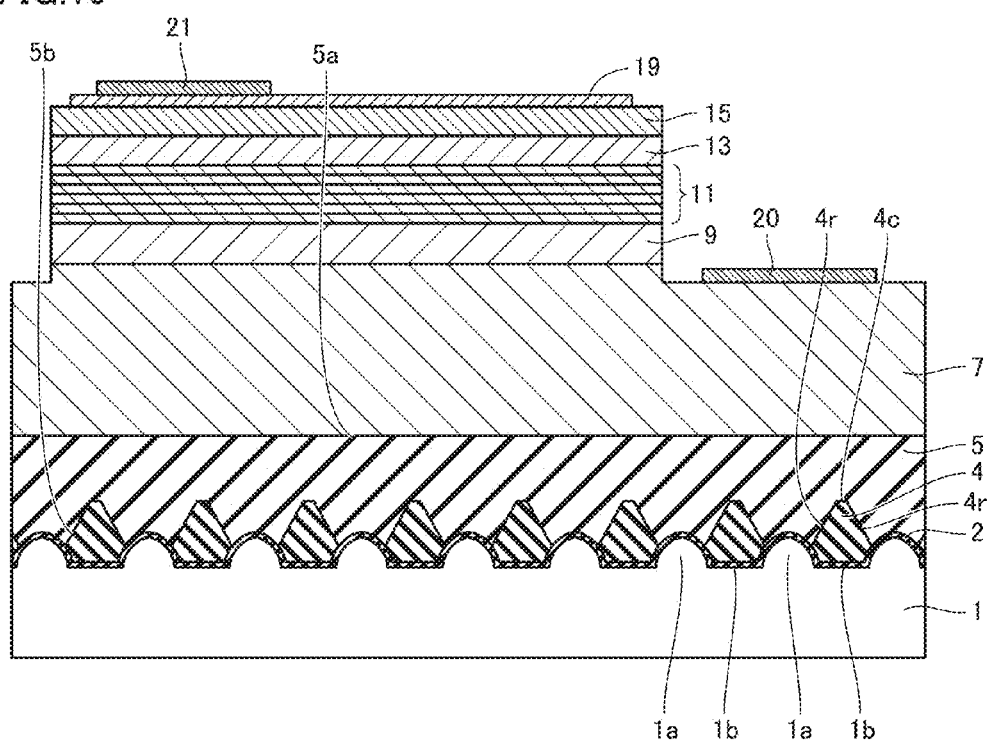
FIG. 19 is a schematic cross-sectional view illustrating another part of steps in one example of the method of manufacturing a nitride semiconductor light emitting diode element in the embodiment.

Then, as shown in a schematic cross-sectional view in FIG. 19, n-side electrode 20 is formed on the exposed surface of n-type nitride semiconductor contact layer 7. For example, a stack film of a nickel layer, an aluminum layer, a titanium layer, and a gold layer can be formed as n-side electrode 20.

Thereafter, insulating protection film 23 composed of $SiO_2$ or the like is formed on the entire surface of the stack structure after n-side electrode 20 is formed, an opening is provided in insulating protection film 23 so as to expose p-side electrode 21 and n-side electrode 20, and a wafer on which a plurality of nitride semiconductor light emitting diode elements 100 are formed is divided into individual elements, so that nitride semiconductor light emitting diode element 100 according to Embodiment 1-1 can be fabricated.

Here, division of a wafer can be achieved, for example, by grinding and polishing a back surface of the wafer having the structure above formed on substrate 1 to a mirror surface and thereafter dividing the wafer into rectangular chips each having a dimension of 280 μm×550 μm.

In nitride semiconductor light emitting diode element 100 according to Embodiment 1-1 fabricated as above, first nitride semiconductor underlying layer 4, second nitride semiconductor underlying layer 5, n-type nitride semiconductor contact layer 7, n-type nitride semiconductor clad layer 9, nitride semiconductor active layer 11, p-type nitride semiconductor clad layer 13, and p-type nitride semiconductor contact layer 15 are stacked in this order on the surface of nitride semiconductor intermediate layer 2 having good crystallinity and made of an aggregate of column crystals uniform in crystal grain extending in a direction of the normal (a perpendicular direction) of the surface of substrate 1.

Therefore, n-type nitride semiconductor contact layer 7, n-type nitride semiconductor clad layer 9, nitride semiconductor active layer 11, p-type nitride semiconductor clad layer 13, and p-type nitride semiconductor contact layer 15 stacked on flat upper surface 5a of second nitride semiconductor underlying layer 5 having few crystal defects and high crystallinity are low in dislocation density and excellent in crystallinity.

Thus, nitride semiconductor light emitting diode element 100 according to Embodiment 1-1 formed of such a nitride semiconductor layer having excellent crystallinity is an element low in operation voltage and high in emission output.

It is noted that nitride semiconductor light emitting diode element 100 fabricated under the conditions in case 1-1 was adopted as a bare chip (not sealed with resin as will be described later) evaluation element, and a current of 30 mA was fed to 10 elements. Then, it was confirmed that an element low in operation voltage and high in emission output, which achieved light output of 39 mW, an operation voltage of 3.0 V, and an emission wavelength of 455 nm on average, was obtained.

Figure 20:
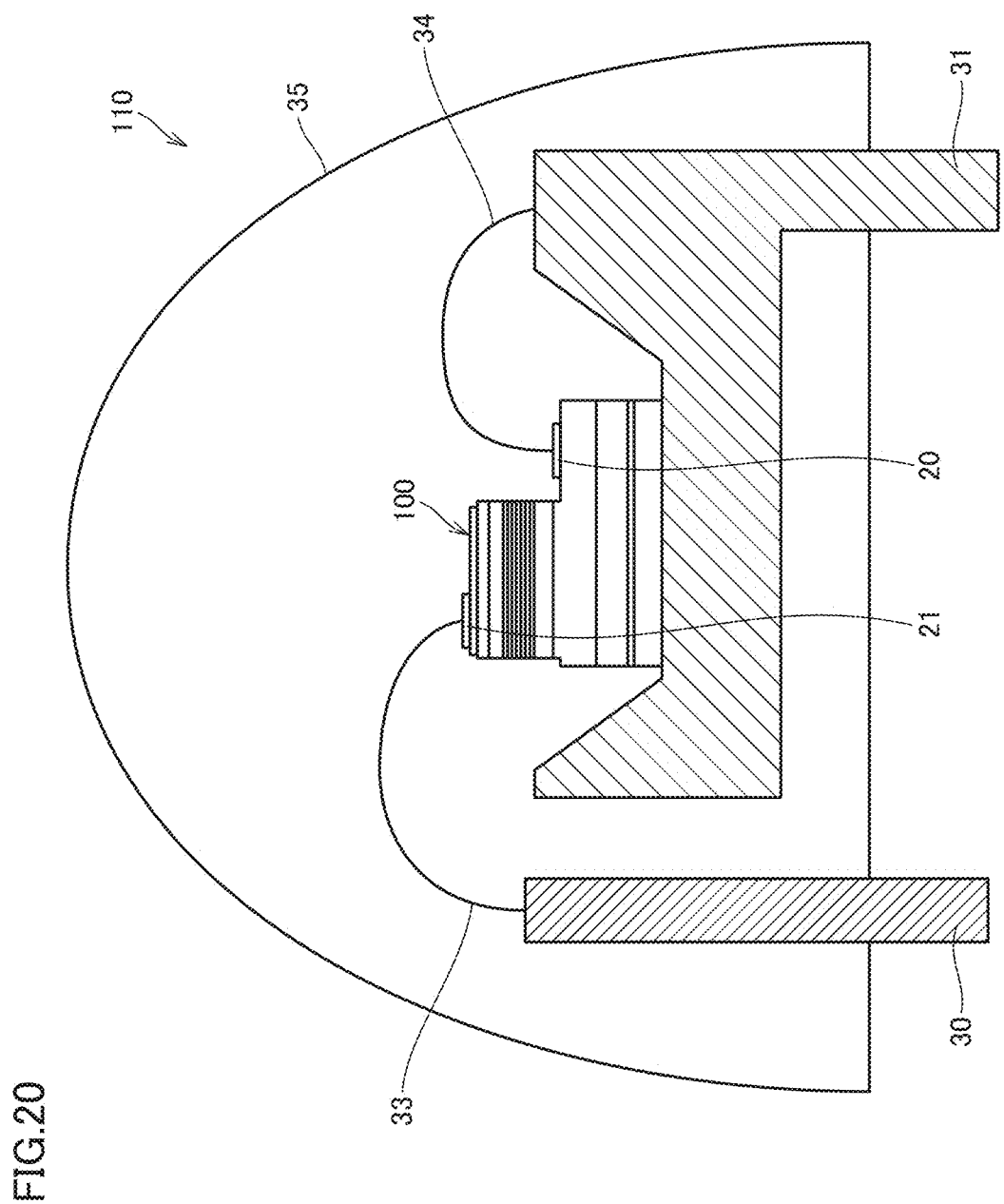
FIG. 20 is a schematic cross-sectional view of one example of a light emitting device including the nitride semiconductor light emitting diode element in the embodiment.

FIG. 20 shows a schematic cross-sectional view of one example of a light emitting device including nitride semiconductor light emitting diode element 100 according to Embodiment 1-1.

Here, a light emitting device 110 has such a construction that nitride semiconductor light emitting diode element 100 according to Embodiment 1-1 is set on a second lead frame 31. Then, p-side electrode 21 of nitride semiconductor light emitting diode element 100 and a first lead frame 30 are electrically connected to each other through a first wire 33, and n-side electrode 20 of nitride semiconductor light emitting diode element 100 and second lead frame 31 are electrically connected to each other through a second wire 34. In addition, since nitride semiconductor light emitting diode element 100 is molded with a transparent molding resin 35, light emitting device 110 is in a shape of a cannonball.

Since light emitting device 110 having the construction shown in FIG. 20 includes nitride semiconductor light emitting diode element 100 according to Embodiment 1-1, a light emitting device low in operation voltage and high in emission output can be achieved.

Embodiment 1-2

Embodiment 1-2 is characterized by being directed to a nitride semiconductor transistor element which is an electronic device including the nitride semiconductor structure according to Embodiment 1-1 (a stack structure of substrate 1, nitride semiconductor intermediate layer 2, first nitride semiconductor underlying layer 4, and second nitride semiconductor underlying layer 5).

Figure 21:
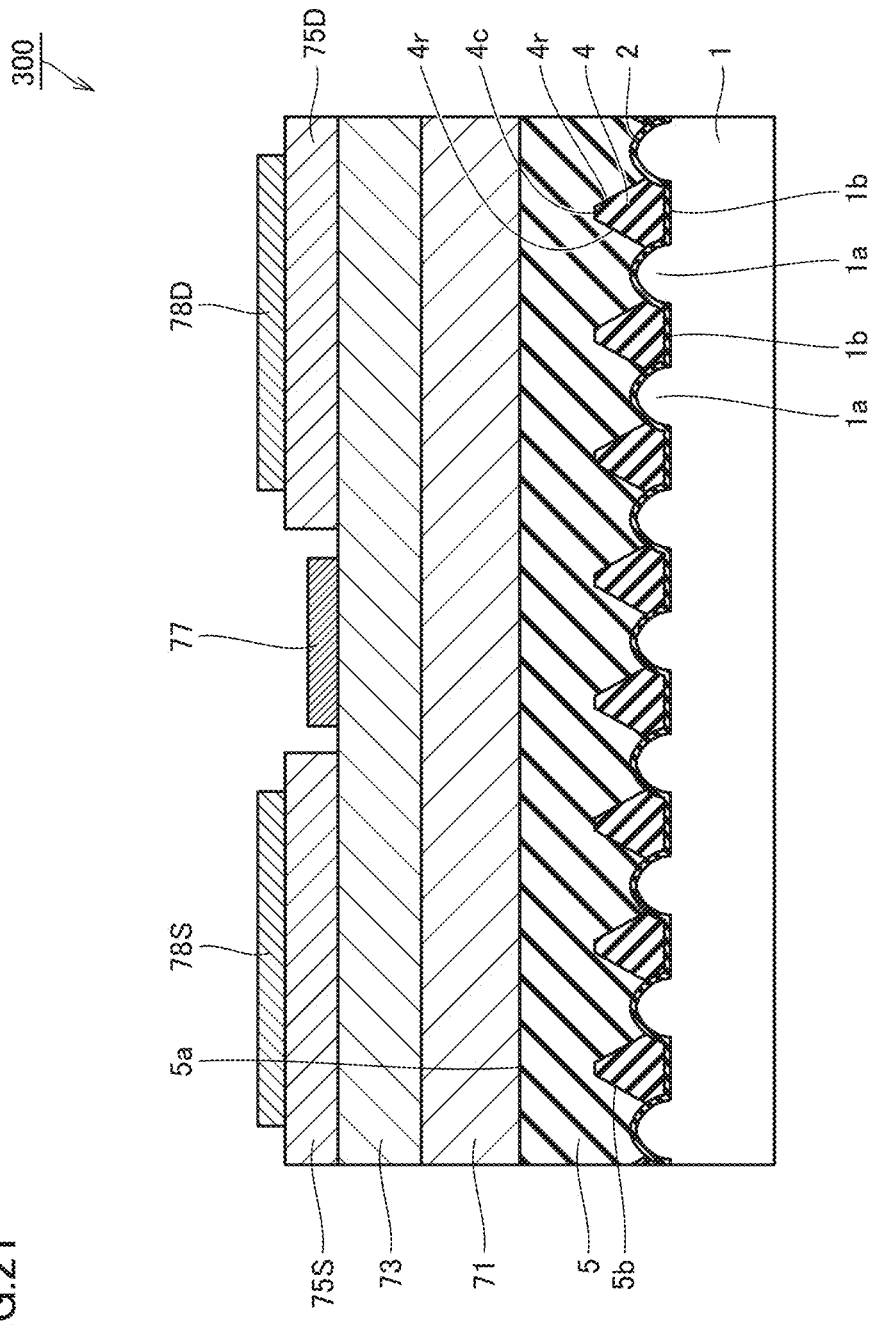
FIG. 21 is a schematic cross-sectional view of a nitride semiconductor transistor element in an embodiment.

FIG. 21 shows a schematic cross-sectional view of a nitride semiconductor transistor element 300 according to Embodiment 1-2. Nitride semiconductor transistor element 300 has a nitride semiconductor structure constituted of substrate 1 formed of a sapphire substrate having a c plane as a main surface, in which projection portions 1a are arranged in three equivalent directions of the a (sub) axis, as well as nitride semiconductor intermediate layer 2 composed of AlN or the like, first nitride semiconductor underlying layer 4 composed of undoped GaN or the like, and second nitride semiconductor underlying layer 5 composed of undoped GaN or the like, which are successively stacked on the surface of substrate 1.

Then, a nitride semiconductor electron transit layer 71 composed of undoped GaN or the like is stacked on the flat surface of second nitride semiconductor underlying layer 5 having few crystal defects and good crystallinity, and an n-type nitride semiconductor electron supply layer 73 composed of n-type AlGaN or the like is stacked on a surface of nitride semiconductor electron transit layer 71.

A gate electrode 77 is provided on a surface of n-type nitride semiconductor electron supply layer 73, and a source contact layer 75S and a drain contact layer 75D composed of n-type GaN or the like are provided on respective opposing sides of gate electrode 77. In addition, a source electrode 78S is provided on source contact layer 75S, and a drain electrode 78D is provided on drain contact layer 75D.

One example of a method of manufacturing nitride semiconductor transistor element 300 according to Embodiment 1-2 will be described below. Initially, as in Embodiment 1-1, nitride semiconductor intermediate layer 2 composed of AlN is formed with reactive sputtering on the surface of substrate 1 having projection portions 1a and recess portions 1b.

Then, first nitride semiconductor underlying layer 4 composed of undoped GaN is grown on the surface of nitride semiconductor intermediate layer 2 with MOCVD. Here, first nitride semiconductor underlying layer 4 is grown under such conditions that two first oblique facet planes 4r which appear in the direction of the a (sub) axis and two first oblique facet planes 4r which appear in each of the direction inclined by an angle of +60° with respect to the direction of the a (sub) axis and the direction inclined by an angle of −60° with respect to the direction of the a (sub) axis appear (for example, under the conditions in case 1-1) in the plan view of the surface of first nitride semiconductor underlying layer 4.

Then, second nitride semiconductor underlying layer 5 composed of undoped GaN is grown on the surface of first nitride semiconductor underlying layer 4 with MOCVD. Here, second nitride semiconductor underlying layer 5 is grown under such conditions that first oblique facet plane 4r of first nitride semiconductor underlying layer 4 is buried and substantially flat upper surface 5a appears.

Then, with MOCVD, nitride semiconductor electron transit layer 71 composed of n-type $Al_xGa_{1-x}N$ is stacked on substantially flat upper surface 5a of second nitride semiconductor underlying layer 5 and n-type nitride semiconductor electron supply layer 73 is stacked on the surface of nitride semiconductor electron transit layer 71.

Thereafter, as shown in FIG. 21, after source contact layer 75S and drain contact layer 75D are formed on the surface of n-type nitride semiconductor electron supply layer 73, source electrode 78S, drain electrode 78D, and gate electrode 77 are each formed. Nitride semiconductor transistor element 300 according to Embodiment 1-2 can be fabricated as above.

In nitride semiconductor transistor element 300 according to Embodiment 1-2 as well, as in Embodiment 1-1, in the plan view of the surface of first nitride semiconductor underlying layer 4, first nitride semiconductor underlying layer 4 is grown under such conditions that two first oblique facet planes 4r which appear in the direction of the a (sub) axis and two first oblique facet planes 4r which appear in each of the direction inclined by an angle of +60° with respect to the direction of the a (sub) axis and the direction inclined by an angle of −60° with respect to the direction of the a (sub) axis appear. Thus, since crystal defects in a two-dimensional electron transit region at an uppermost surface of nitride semiconductor electron transit layer 71 are decreased in particular, electron mobility can be improved.

Therefore, in nitride semiconductor transistor element 300 according to Embodiment 1-2 as well, each layer stacked on the surface of nitride semiconductor intermediate layer 2 can be a layer low in dislocation density and excellent in crystallinity, and hence an element achieving improved characteristics such as electron mobility can be obtained.

As above, according to the present embodiment, a shape of first nitride semiconductor underlying layer 4 and second nitride semiconductor underlying layer 5 stacked on the surface of substrate 1 having projection portions 1a and recess portions 1b is controlled. Thus, while occurrence of breakage and crack of a wafer during growth with MOCVD of a nitride semiconductor layer stacked on upper surface 5a of second nitride semiconductor underlying layer 5 and in subsequent processes is suppressed, crystallinity expressed with an X-ray half width or the like of a nitride semiconductor layer can be improved and defect density expressed with the CL method, EPD, or the like can be lowered. Therefore, a nitride semiconductor element achieving improved device characteristics represented by emission efficiency, electron mobility, and the like and a nitride semiconductor structure serving as a basis for the nitride semiconductor element can be provided.

Embodiment 2-1

Figure 22:
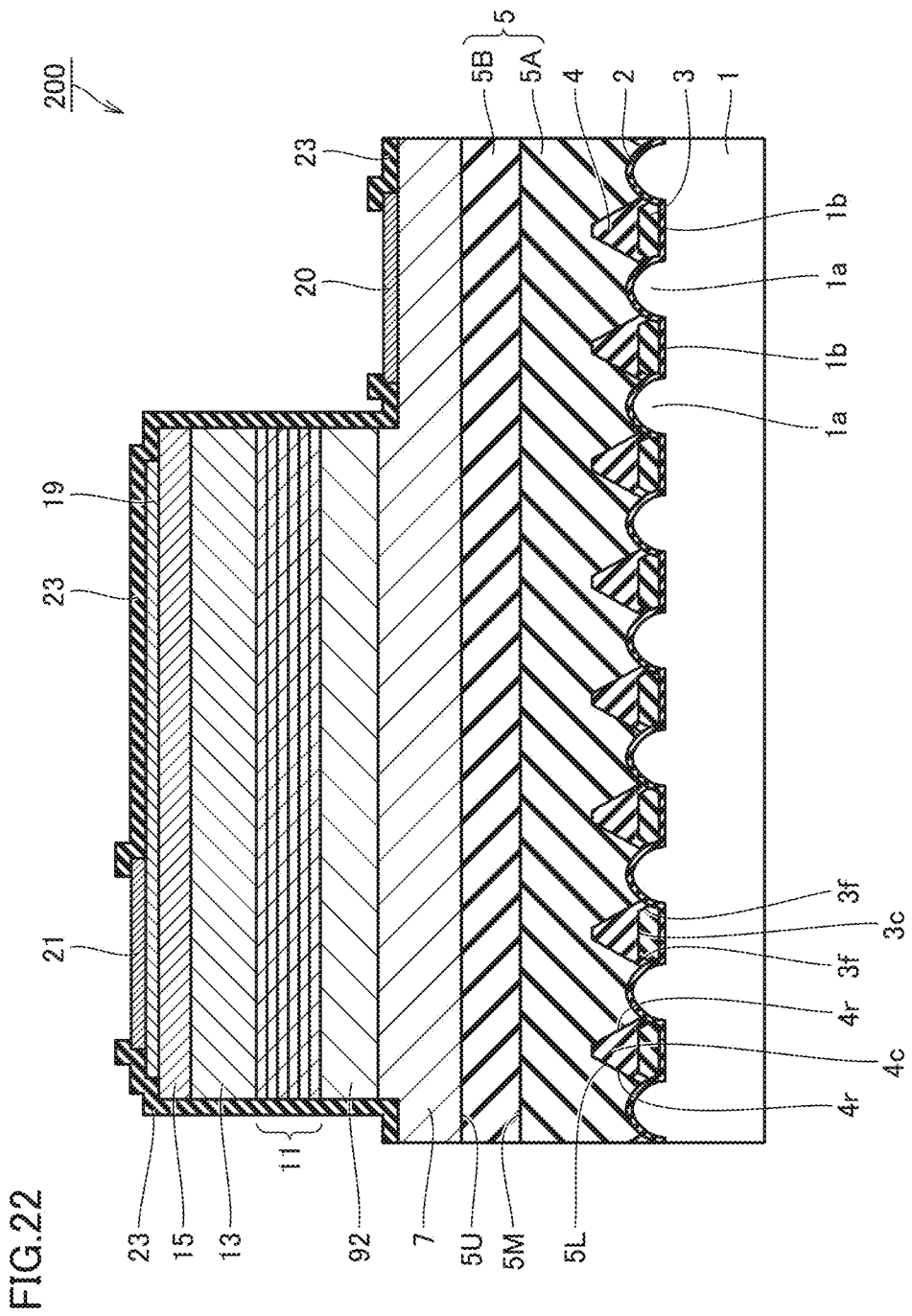
FIG. 22 is a schematic cross-sectional view of a nitride semiconductor light emitting diode element in an embodiment.

FIG. 22 shows a schematic cross-sectional view of a nitride semiconductor light emitting diode element according to Embodiment 2-1 representing another example of the nitride semiconductor element according to the present invention.

A nitride semiconductor light emitting diode element 200 according to Embodiment 2-1 is characterized by including a third nitride semiconductor underlying layer 3 provided in contact with the surface of nitride semiconductor intermediate layer 2 mainly in recess portion 1b, first nitride semiconductor underlying layer 4 provided in contact at least with third nitride semiconductor underlying layer 3, second nitride semiconductor underlying layer 5 provided in contact at least with the surface of first nitride semiconductor underlying layer 4 (and constituted of a lower layer 5A and an upper layer 5B), and an n-type nitride semiconductor superlattice layer 92 provided on the surface of n-type nitride semiconductor contact layer 7.

Third nitride semiconductor underlying layer 3 has a third oblique facet plane 3f provided on recess portion 1b of substrate 1 and surrounding projection portion 1a on the outer side of projection portion 1a of substrate 1 and a third flat region 3c coupling third oblique facet planes 3f to each other.

In addition, at the surface of third nitride semiconductor underlying layer 3, a ratio of area of third oblique facet plane 3f is lower than a ratio of area of third flat region 3c.

First nitride semiconductor underlying layer 4 has at least 6 first oblique facet planes 4r surrounding projection portion 1a on the outer side of projection portion 1a of substrate 1 and has a first flat region 4c coupling first oblique facet planes 4r to each other. First oblique facet plane 4r includes a plane inclined with respect to a direction of an m (layer) axis of a nitride semiconductor layer having a hexagonal structure, and first flat region 4c is a plane perpendicular to the direction of the m (layer) axis of the nitride semiconductor layer having the hexagonal structure. It is noted that first nitride semiconductor underlying layer 4 should only be provided such that at least a part thereof is in contact with third nitride semiconductor underlying layer 3.

A lower surface (a lower surface of lower layer 5A) 5L of second nitride semiconductor underlying layer 5 is in contact with first oblique facet plane 4r of first nitride semiconductor underlying layer 4, and an upper surface (an upper surface of upper layer 5B) 5U of second nitride semiconductor underlying layer 5 is flat. In addition, an upper surface (a lower surface of upper layer 5B) 5M of lower layer 5A of second nitride semiconductor underlying layer 5 is also flat. It is noted that second nitride semiconductor underlying layer 5 should only be provided such that at least a part thereof is in contact with the surface of first nitride semiconductor underlying layer 4.

For example, upper surface 5M of lower layer 5A of second nitride semiconductor underlying layer 5 and upper surface 5U of second nitride semiconductor underlying layer 5 each have surface roughness Ra (JIS B 0601:2001) not greater than 0.1 μm.

One example of a method of manufacturing nitride semiconductor light emitting diode element 200 according to Embodiment 2-1 will be described below.

Initially, substrate 1 composed of trigonal corundum or hexagonal crystal is prepared. For example, a substrate made of sapphire ($Al_2O_3$) single crystal, AlN single crystal, GaN single crystal, or the like can be employed as substrate 1 composed of trigonal corundum or hexagonal crystal.

Though a diameter of substrate 1 is not particularly limited, for example, it can be 150 mm (approximately 6 inches). Though a substrate having a relatively small diameter around 50.8 mm (2 inches) has conventionally generally been employed as substrate 1, a substrate having a large diameter is preferably employed for higher productivity. In a case of using substrate 1 having a large diameter, however, warpage mainly caused by stress originating from difference in rate of thermal expansion between substrate 1 and a nitride semiconductor layer becomes greater, and consequently, breakage of substrate 1 or a crack in a surface of a nitride semiconductor layer is more likely. As will be described later, the present invention can suppress breakage of substrate 1 or a crack caused in a surface of a nitride semiconductor layer even in a case of using substrate 1 having a large diameter not smaller than 100 mm (approximately 4 inches).

Then, as shown in the schematic cross-sectional view in FIG. 2, recess portion 1*b* and projection portion 1*a* provided between recess portions 1*b* are formed at the surface of substrate 1.

FIG. 3 shows the schematic enlarged plan view of one example of the surface of substrate 1 shown in FIG. 2. Here, an angle of each interior angle of virtual triangle 1*t* where projection portion 1*a* is arranged at each vertex is preferably not smaller than 50° and not greater than 70° in the plan view of the surface of substrate 1. In this case, third nitride semiconductor underlying layer 3 tends to start growth on a region of recess portion 1*b* in a stable manner. Then, as first nitride semiconductor underlying layer 4 formed on third nitride semiconductor underlying layer 3 further grows, first nitride semiconductor underlying layer 4 tends to be able to form at least 6 first oblique facet planes 4*r* so as to surround projection portion 1*a* on the outer side of projection portion 1*a* with projection portion 1*a* being located in the center.

Moreover, in the plan view of the surface of substrate 1, an interval between adjacent projection portions 1*a* is preferably not smaller than 0.2 μm and not greater than 7 μm, more preferably not smaller than 1 μm and not greater than 3 μm, and further preferably around 2 μm. When an interval between adjacent projection portions 1*a* is not smaller than 0.2 μm and not greater than 7 μm, a problem in terms of process tends to be less. The problem in terms of process includes, for example, a longer time period of dry etching for increasing a height of projection portion 1*a*, an excessively long time period of growth required until upper surface 5U of second nitride semiconductor underlying layer 5 is completely flat, and the like. It is noted herein that an interval between adjacent projection portions 1*a* means a shortest distance between adjacent projection portions 1*a*.

In addition, in the plan view of the surface of substrate 1, a diameter of an annular circle of projection portion 1*a* is preferably not smaller than ½ and not greater than ¾ of an interval between adjacent projection portions 1*a*. For example, when an interval between adjacent projection portions 1*a* is 2 μm, a diameter of an annular circle of projection portion 1*a* is more preferably around 1.2 μm. When a diameter of an annular circle of projection portion 1*a* is not smaller than ½ and not greater than ¾ of an interval between adjacent projection portions 1*a* and in particular around 1.2 μm, third nitride semiconductor underlying layer 3 tends to start growth on the region of recess portion 1*b* in a manner more stable than on the region of projection portion 1*a*.

Furthermore, a height of projection portion 1*a* is preferably not smaller than ¼ and not greater than 1 of a diameter of an annular circle of projection portion 1*a* in the plan view of the surface of substrate 1. For example, when a diameter of an annular circle of projection portion 1*a* is 1.2 μm, a height of projection portion 1*a* is more preferably around 0.6 μm. In this case, third nitride semiconductor underlying layer 3 tends to start growth on the region of recess portion 1*b* in a manner more stable than on the region of projection portion 1*a*.

For example, as shown in FIG. 4 which is the schematic enlarged cross-sectional view along the line B-B passing through the center of the projection portion shown in FIG. 3, projection portion 1*a* is preferably in a shape having tip end portion 1*c*. In a case where the upper surface of projection portion 1*a* is flat, third nitride semiconductor underlying layer 3 which will be described later may grow not only on recess portion 1*b* but also on a flat upper surface of projection portion 1*a*. On the other hand, in a case where projection portion 1*a* is in a shape having tip end portion 1*c*, third nitride semiconductor underlying layer 3 and first nitride semiconductor underlying layer 4 selectively grow from recess portion 1*b* and second nitride semiconductor underlying layer 5 which successively grows meets above tip end portion 1*c* of projection portion 1*a*. Therefore, it is considered that a region where a crystal defect occurs is limited and the number of defects as a whole can be decreased.

Then, as shown in the schematic cross-sectional view in FIG. 5, nitride semiconductor intermediate layer 2 is formed on the surface of substrate 1. Here, nitride semiconductor intermediate layer 2 can be formed, for example, with reactive sputtering in which $N_2$ and Ar are introduced in a chamber and an Al target is sputtered in a mixed atmosphere of $N_2$ and Ar. Ar does not necessarily have to be introduced into the chamber. In addition, a trace amount of $O_2$ may be added as an introduction gas. By using an introduction gas containing a trace amount of $O_2$, a film better in quality than nitride semiconductor intermediate layer 2 containing oxygen originating from remaining moisture in the chamber is obtained.

Figure 23:
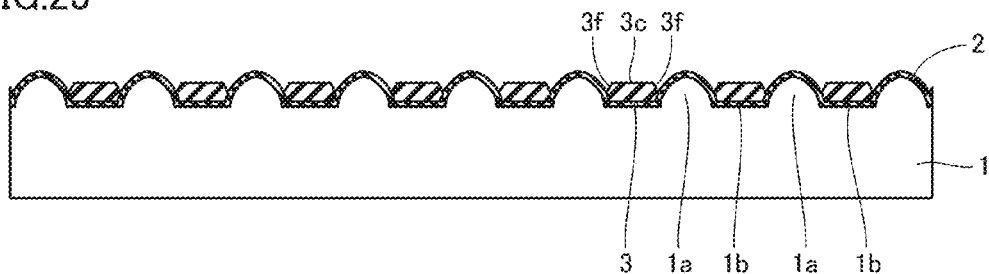
FIG. 23 is a schematic cross-sectional view illustrating another part of manufacturing steps in one example of a method of manufacturing a nitride semiconductor light emitting diode element in the embodiment.
Figure 24:
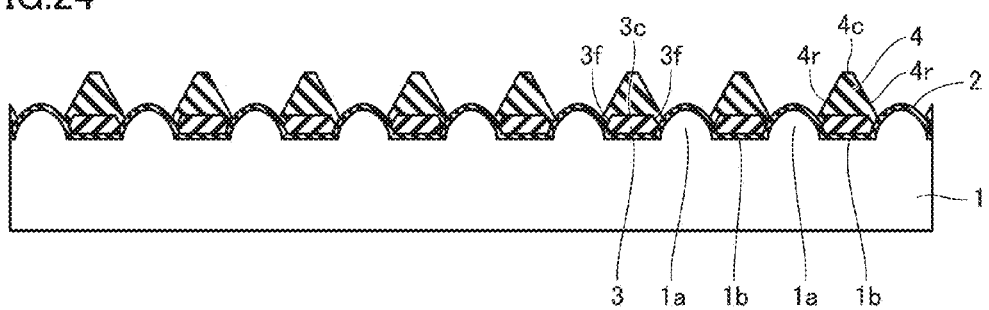
FIG. 24 is a schematic cross-sectional view illustrating another part of the manufacturing steps in one example of the method of manufacturing a nitride semiconductor light emitting diode element in the embodiment.
Figure 25:
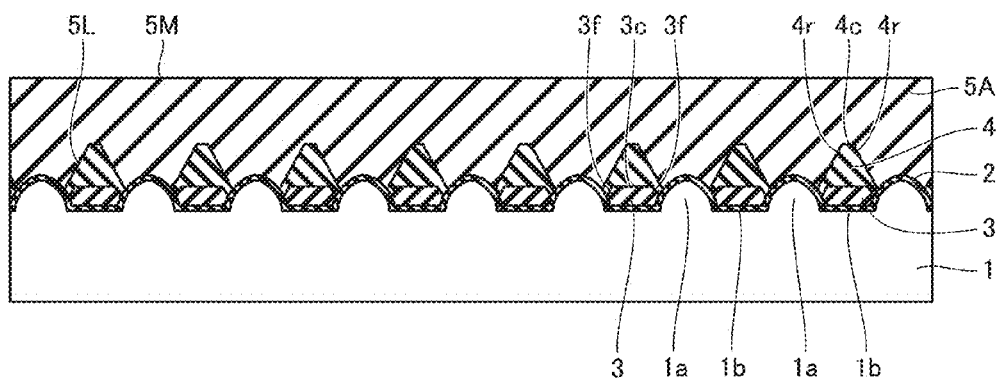
FIG. 25 is a schematic cross-sectional view illustrating another part of the manufacturing steps in one example of the method of manufacturing a nitride semiconductor light emitting diode element in the embodiment.
Figure 26:
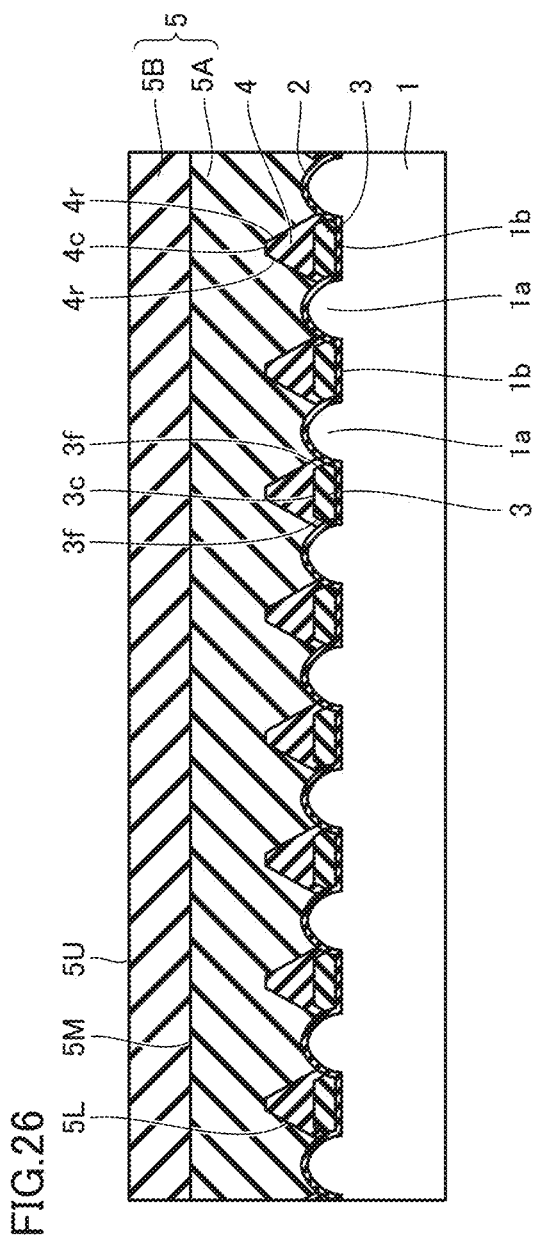
FIG. 26 is a schematic cross-sectional view illustrating another part of the manufacturing steps in one example of the method of manufacturing a nitride semiconductor light emitting diode element in the embodiment.

Then, as shown in a schematic cross-sectional view in FIG. 23, third nitride semiconductor underlying layer 3 is formed on the surface of nitride semiconductor intermediate layer 2, and as shown in a schematic cross-sectional view in FIG. 24, first nitride semiconductor underlying layer 4 is formed on a surface of third nitride semiconductor underlying layer 3. In addition, as shown in a schematic cross-sectional view in FIG. 25, lower layer 5A of second nitride semiconductor underlying layer 5 is formed on the surface of first nitride semiconductor underlying layer 4, and as shown in a schematic cross-sectional view in FIG. 26, upper layer 5B of second nitride semiconductor underlying layer 5 is formed on a surface of lower layer 5A of second nitride semiconductor underlying layer 5.

Here, third nitride semiconductor underlying layer 3, first nitride semiconductor underlying layer 4, and second nitride semiconductor underlying layer 5 (lower layer 5A and upper layer 5B) can successively be formed on the surface of nitride semiconductor intermediate layer 2, for example, with MOCVD (Metal Organic Chemical Vapor Deposition).

Figure 27:
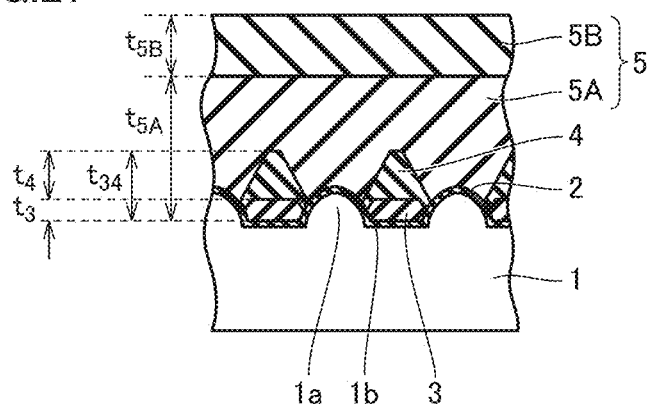
FIG. 27 is a schematic cross-sectional view of one example of a wafer after each layer of the nitride semiconductor underlying layer in the embodiment is formed.

More specifically, as shown in a schematic cross-sectional view in FIG. 27, initially, third nitride semiconductor underlying layer 3 (for example, having a thickness $t_3$=300 nm) is formed on the surface of nitride semiconductor intermediate layer 2 mainly in recess portion 1*b*, then first nitride semiconductor underlying layer 4 (for example, having a thickness $t_4$=1400 nm) is formed at least on the surface of third nitride semiconductor underlying layer 3, and thereafter second nitride semiconductor underlying layer 5 is formed at least on the surface of first nitride semiconductor underlying layer 4. Here, second nitride semiconductor underlying layer 5 is formed of a stack structure of undoped lower layer 5A (for example, having a thickness $t_{5A}$=4000 nm) and n-type doped upper layer 5B (for example, having $t_{5B}$=a thickness of 3000 nm).

Figure 28:
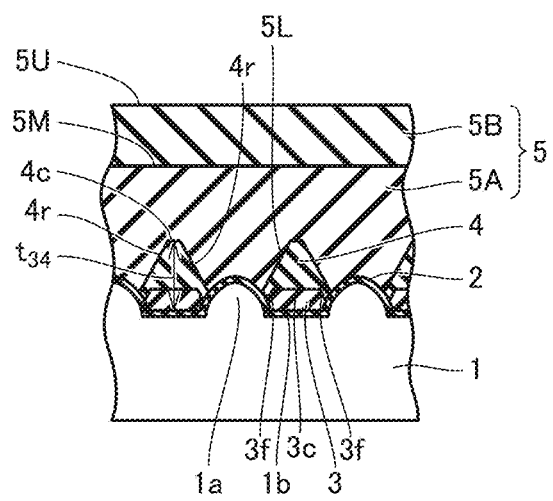
FIG. 28 is a schematic cross-sectional view of one example of the wafer after each layer of the nitride semiconductor underlying layer in the embodiment is formed.

A method of manufacturing second nitride semiconductor underlying layer 5 having few crystal defects and flat upper surface 5U, in particular, a growth mode, will now be described with reference to a schematic cross-sectional view in FIG. 28.

[Mode of Growth of Nitride Semiconductor Underlying Layer]

Initially, third nitride semiconductor underlying layer 3, first nitride semiconductor underlying layer 4, and second nitride semiconductor underlying layer 5 (hereinafter referred to as "each layer of the nitride semiconductor underlying layer") are each grown in an appropriately selected growth mode. For the sake of convenience, the growth mode is herein defined as follows.

Two-dimensional growth mode: A growth mode in which a flat surface is likely to be obtained Three-dimensional growth mode: A growth mode in which an oblique facet plane is likely to be formed Two-point-five dimensional growth mode: A growth mode intermediate between the two-dimensional growth mode and the three-dimensional growth mode

[Relation Between Mode of Growth of Nitride Semiconductor Underlying Layer and Growth Parameter]

Then, switching between the growth modes used for growth of each layer of the nitride semiconductor underlying layer can be made by appropriately selecting three growth parameters of (A-2) a growth temperature, (B-2) a growth pressure, and (C-2) a V/III ratio.

Specifically, at least one growth parameter of (A-2), (B-2), and (C-2) below or combination thereof can lead to realization. Here, as a result of dedicated studies conducted by the present inventor, correlation between each of these three growth parameters and a mode of growth of a nitride semiconductor underlying layer could be found.

(A-2) Growth Temperature

As a growth temperature is higher, the two-dimensional growth mode is likely to be set, and as a growth temperature is lower, the three-dimensional growth mode is likely to be set.

(B-2) Growth Pressure

As a growth pressure is lower, the two-dimensional growth mode is likely to be set, and as a growth pressure is higher, the three-dimensional growth mode is likely to be set.

(C-2) V/III Ratio

As a V/III ratio is lower, the two-dimensional growth mode is likely to be set, and as a V/III ratio is higher, the three-dimensional growth mode is likely to be set. It is noted that a V/III ratio represents a ratio between a molar quantity of a group V source material gas supplied per unit time during growth of a nitride semiconductor underlying layer and a molar quantity of a group III source material gas supplied per unit time.

Then, in order to form second nitride semiconductor underlying layer 5 having few crystal defects, high crystallinity, and flat upper surface 5U, initially, third nitride semiconductor underlying layer 3 is grown in the "2.5 dimensional growth mode" which is a growth mode intermediate between the "two-dimensional growth mode" in which a flat surface is obtained and the "three-dimensional growth mode" in which a crystal plane having an oblique facet preferentially appears.

Thus, the surface of third nitride semiconductor underlying layer 3 has third oblique facet plane 3f and third flat region 3c. Then, a ratio of area of third oblique facet plane 3f at the surface of each third nitride semiconductor underlying layer 3 is lower than a ratio of area of third flat region 3c.

First nitride semiconductor underlying layer 4 is grown in the "three-dimensional growth mode" such that first oblique facet plane 4r is formed.

Thus, the surface of first nitride semiconductor underlying layer 4 has first oblique facet plane 4r and first flat region 4c. Then, a ratio of area of first oblique facet planes 4r in the plan view of the surface of each first nitride semiconductor underlying layer 4 is higher than a ratio of area of first flat regions 4c.

Furthermore, second nitride semiconductor underlying layer 5 is grown in the "two-dimensional growth mode" in order to bury first oblique facet plane 4r and form flat upper surface 5U.

Thus, second nitride semiconductor underlying layer 5 having few crystal defects, high crystallinity, and flat upper surface 5U can be formed.

Namely, by providing third oblique facet plane 3f at the surface of third nitride semiconductor underlying layer 3, dislocation extending in a direction of a c (layer) axis of a nitride semiconductor layer is bent in a direction of third oblique facet plane 3f, so that the number thereof is decreased.

Then, by providing first oblique facet planes 4r at a ratio of area higher than a ratio of area of first flat regions 4c in the plan view of the surface of first nitride semiconductor underlying layer 4, dislocation extending in the direction of the c (layer) axis of a nitride semiconductor layer is bent in a direction of first oblique facet plane 4r, so that the number thereof is further decreased.

By thus growing second nitride semiconductor underlying layer 5 in the two-dimensional growth mode in which growth of a nitride semiconductor layer having a flat surface is promoted on the surface of first nitride semiconductor underlying layer 4 in which the number of dislocations extending in the direction of the c (layer) axis of the nitride semiconductor layer is decreased, second nitride semiconductor underlying layer 5 having few crystal defects, good crystallinity, and flat upper surface 5U can be formed.

It is noted that, though second nitride semiconductor underlying layer 5 is formed of a stack structure of lower layer 5A and upper layer 5B, lower layer 5A is an undoped layer and upper layer 5B can be grown by carrying out doping with an n-type under the growth conditions basically the same as those for lower layer 5A.

Summarizing the results above, the step of forming third nitride semiconductor underlying layer 3 and first nitride semiconductor underlying layer 4 is preferably performed to satisfy at least one condition selected from the group consisting of (i-2), (ii-2), and (iii-2) below. Thus, a nitride semiconductor underlying layer less likely to experience cracking and having a narrow half width of an X-ray rocking curve tends to be obtained.

(i-2) A growth temperature during growth of third nitride semiconductor underlying layer 3 is set to be higher than a growth temperature during growth of first nitride semiconductor underlying layer 4.

(ii-2) A pressure during growth of third nitride semiconductor underlying layer 3 is set to be lower than a pressure during growth of the first nitride semiconductor underlying layer.

(iii-2) A V/III ratio of a gas supplied during growth of third nitride semiconductor underlying layer 3 is set to be lower than a V/III ratio of a gas supplied during growth of first nitride semiconductor underlying layer 4.

In addition, the step of forming third nitride semiconductor underlying layer 3, first nitride semiconductor underlying layer 4, and second nitride semiconductor underlying layer 5 is preferably performed to satisfy at least one condition selected from the group consisting of (I-2), (II-2), and (III-2) below and to satisfy at least one condition selected from the group consisting of (a-2), (b-2), and (c-2) below. Thus, a nitride semiconductor underlying layer less likely to experience cracking and having a narrow half width of an X-ray rocking curve tends to be obtained.

(I-2) A growth temperature during growth of second nitride semiconductor underlying layer 5 is set to be higher than a growth temperature during growth of third nitride semiconductor underlying layer 3.

(II-2) A pressure during growth of second nitride semiconductor underlying layer 5 is set to be lower than a pressure during growth of third nitride semiconductor underlying layer 3.

(III-2) A V/III ratio of a gas supplied during growth of second nitride semiconductor underlying layer 5 is set to be lower than a V/III ratio of a gas supplied during growth of third nitride semiconductor underlying layer 3.

(a-2) A growth temperature during growth of second nitride semiconductor underlying layer 5 is set to be higher than a growth temperature during growth of first nitride semiconductor underlying layer 4.

(b-2) A pressure during growth of second nitride semiconductor underlying layer 5 is set to be lower than a pressure during growth of first nitride semiconductor underlying layer 4.

(c-2) A V/III ratio of a gas supplied during growth of second nitride semiconductor underlying layer 5 is set to be lower than a V/III ratio of a gas supplied during growth of first nitride semiconductor underlying layer 4.

Figure 29:
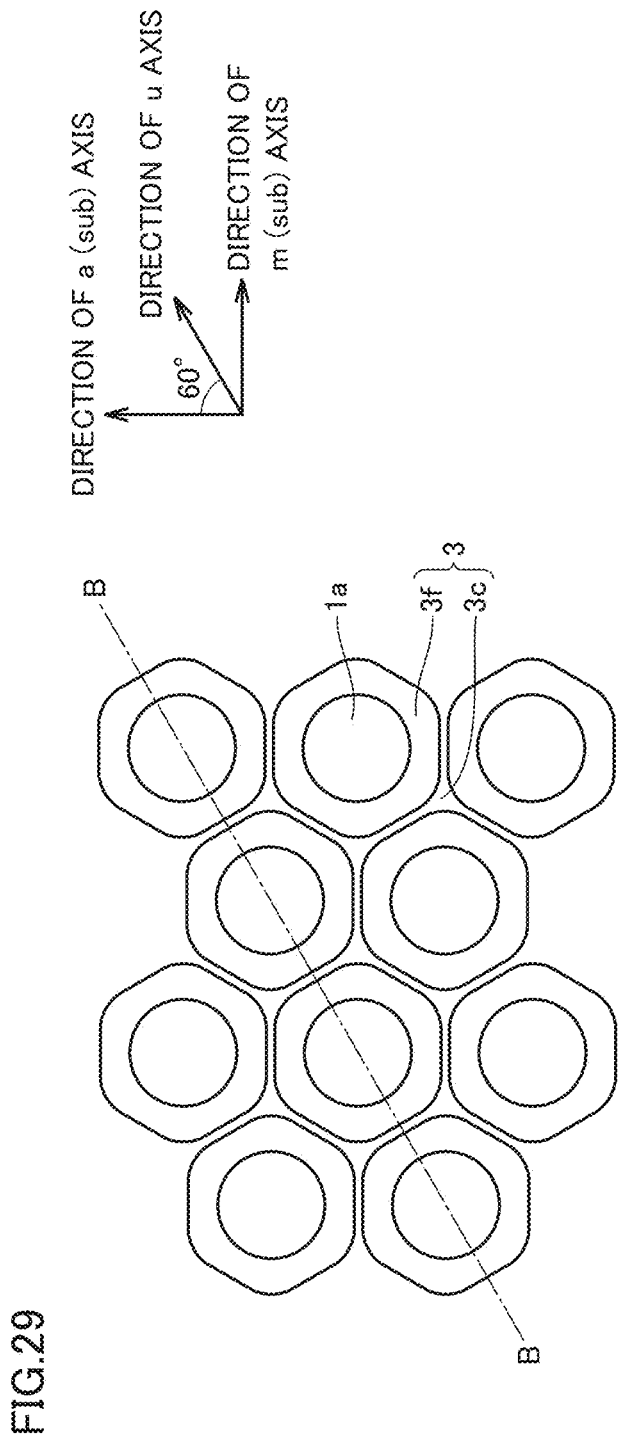
FIG. 29 is a schematic enlarged plan view of one example of a surface of a third nitride semiconductor underlying layer.

FIG. 29 shows a schematic enlarged plan view of one example of a surface of third nitride semiconductor underlying layer 3. As shown in FIG. 29, third nitride semiconductor underlying layer 3 has third oblique facet plane 3f surrounding projection portion 1a on the outer side of projection portion 1a.

In addition, one third oblique facet plane 3f surrounding projection portion 1a and another third oblique facet plane 3f surrounding projection portion 1a are coupled to each other at third flat region 3c of third nitride semiconductor underlying layer 3.

Third oblique facet plane 3f of third nitride semiconductor underlying layer 3 is inclined downward from third flat region 3c of third nitride semiconductor underlying layer 3 toward projection 1a of substrate 1.

Figure 30:
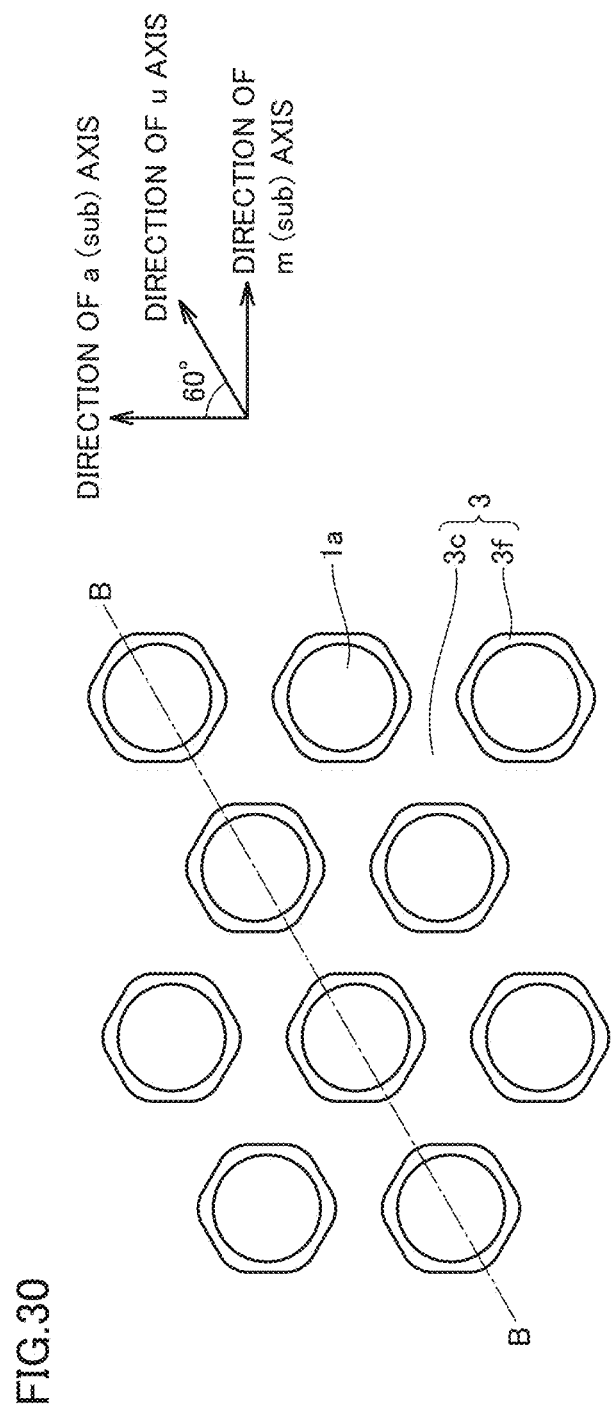
FIG. 30 is a schematic enlarged plan view of another example of the surface of the third nitride semiconductor underlying layer.

FIG. 30 shows a schematic enlarged plan view of another example of the surface of third nitride semiconductor underlying layer 3. The example shown in FIG. 30 is characterized in that substantially the entire surface of recess portion 1b of substrate 1 is uniformly covered with third flat region 3c of third nitride semiconductor underlying layer 3 and third oblique facet plane 3f is slightly formed around projection portion 1a.

Namely, in the example shown in FIG. 30, as compared with the example shown in FIG. 29, a ratio of area occupied by third flat region 3c in the surface of third nitride semiconductor underlying layer 3 is higher than a ratio of area occupied by third oblique facet plane 3f.

Figure 31:
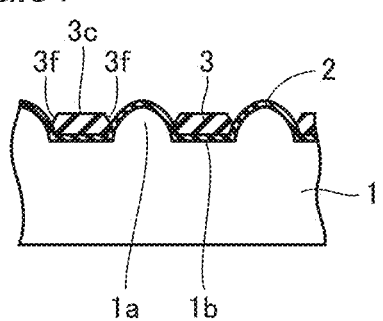
FIG. 31 is a schematic cross-sectional view along B-B in FIG. 30.

FIG. 31 shows a schematic cross-sectional view along B-B in FIG. 30. Growth of third nitride semiconductor underlying layer 3 proceeds selectively from a region on recess portion 1b of substrate 1. Then, as growth of third nitride semiconductor underlying layer 3 proceeds, substantially the entire surface of the region on recess portion 1b of substrate 1 is uniformly covered with third flat region 3c of third nitride semiconductor underlying layer 3 and third facet plane 3f is slightly formed around projection portion 1a of substrate 1.

Figure 32:
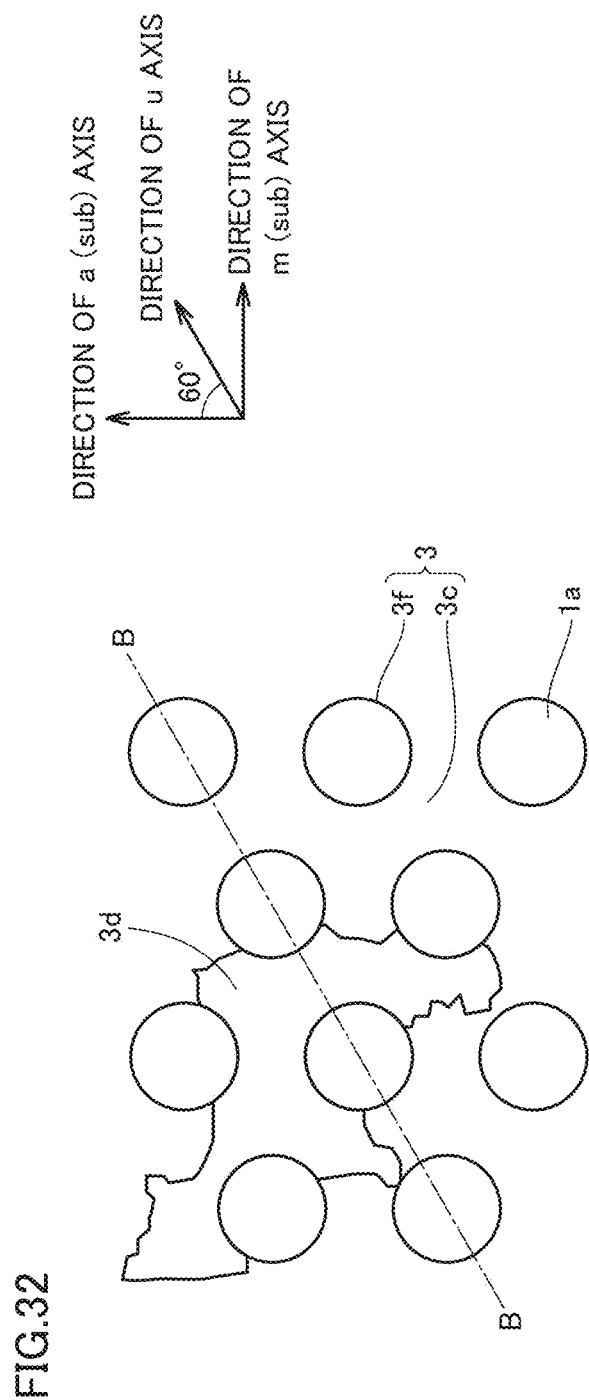
FIG. 32 is a schematic enlarged plan view of another example of the surface of the third nitride semiconductor underlying layer.

FIG. 32 shows a schematic enlarged plan view of another example of the surface of third nitride semiconductor underlying layer 3. The example shown in FIG. 32 is characterized in that a rough surface region 3d is formed at the surface of third nitride semiconductor underlying layer 3. Here, even in a case where third nitride semiconductor underlying layer 3 has a layer thickness not smaller than 50 nm, third flat region 3c and rough surface region 3d rougher than third flat region 3c are present together at the surface of third nitride semiconductor underlying layer 3 in the region on the recess portion. In this case, disadvantageously, when first nitride semiconductor underlying layer 4 is grown on the surface of this rough surface region 3d, the surface of first nitride semiconductor underlying layer 4 is likely to be a greater rough surface, and the surface of second nitride semiconductor underlying layer 5 grown further thereon is less likely to be flat.

Third nitride semiconductor underlying layer 3 is preferably grown under such a condition that a ratio of area of rough surface region 3d occupying the surface of third nitride semiconductor underlying layer 3 is not higher than 5%. In this case, first nitride semiconductor underlying layer 4 and second nitride semiconductor underlying layer 5 grown on the surface of third nitride semiconductor underlying layer 3 each tend to be a film having few crystal defects and good crystallinity.

Figure 33:
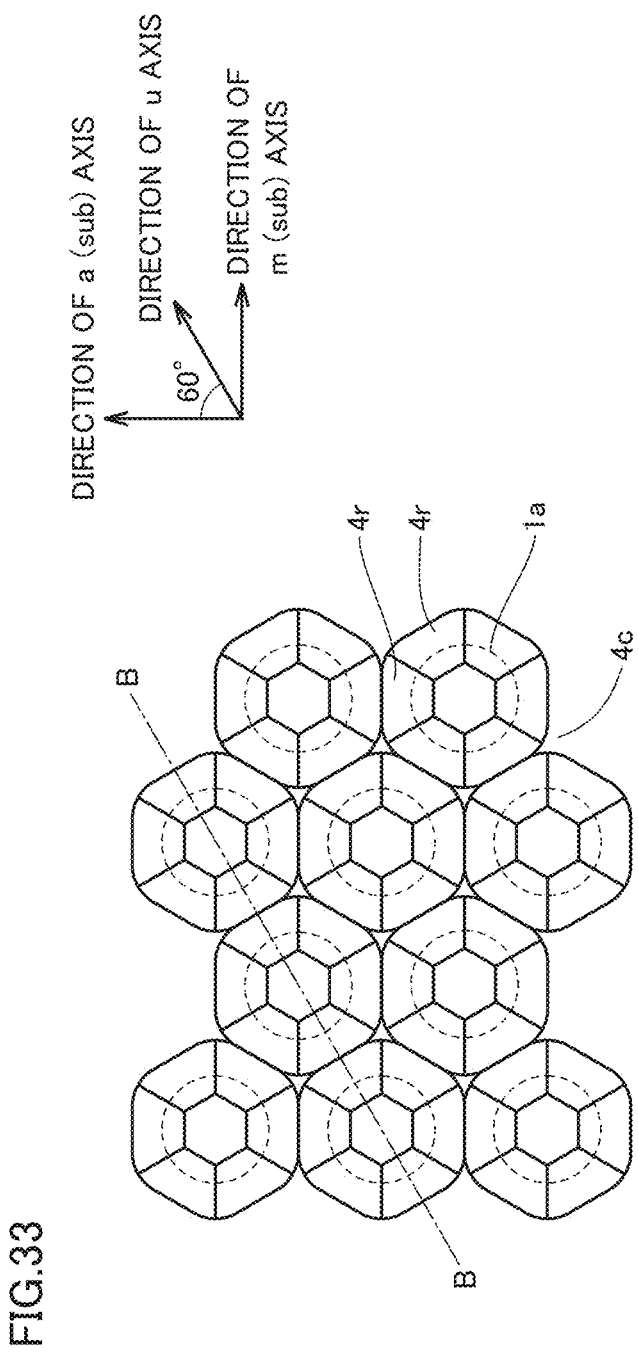
FIG. 33 is a schematic enlarged plan view of one example of the surface of the first nitride semiconductor underlying layer grown after the third nitride semiconductor underlying layer is formed.

FIG. 33 shows a schematic enlarged plan view of one example of the surface of first nitride semiconductor underlying layer 4 grown after third nitride semiconductor underlying layer 3 is formed. First nitride semiconductor underlying layer 4 has 6 first oblique facet planes 4r surrounding projection portion 1a on the outer side of projection portion 1a of substrate 1.

In the plan view shown in FIG. 33, two first oblique facet planes 4r appear in the direction of the a (sub) axis and two first oblique facet planes 4r appear in each of the direction inclined by an angle of +60° with respect to the direction of the a (sub) axis and the direction inclined by an angle of −60° with respect to the direction of the a (sub) axis (both of which are the u directions) (this case being referred to as a "case 2-1").

More specifically, in the plan view of the surface of first nitride semiconductor underlying layer 4 shown in FIG. 33, two first oblique facet planes 4r which appear in the direction of the a (sub) axis among 6 first oblique facet planes 4r are inclined obliquely upward with respect to the direction of the a (sub) axis (<11-20> direction), and first oblique facet plane 4r extends in that direction of inclination.

In addition, similarly, in the plan view of the surface of first nitride semiconductor underlying layer 4, two first oblique facet planes 4r which appear in each of the direction inclined by an angle of +60° with respect to the direction of the a (sub) axis and the direction inclined by an angle of −60° with respect to the direction of the a (sub) axis (both of which are the u directions) are also inclined obliquely upward with respect to the direction inclined by an angle of +60° with respect to the direction of the a (sub) axis and the direction inclined by an angle of −60° with respect to the direction of the a (sub) axis, and first oblique facet plane 4r extends in that direction of inclination.

Figure 34:
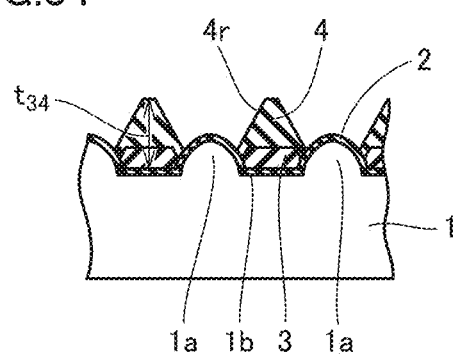
FIG. 34 is a schematic cross-sectional view along B-B in FIG. 33.

FIG. 34 shows a schematic cross-sectional view along B-B in FIG. 33. First oblique facet plane 4r which appears in FIG. 34 is a plane which similarly appears also in a direction of depth of a cross-section thereof in a range where first oblique facet planes 4r are present.

In addition, one first oblique facet plane 4r surrounding projection portion 1a and another first oblique facet plane 4r surrounding projection portion 1a are coupled to each other at upper surface 4c of first nitride semiconductor underlying layer 4.

Here, 6 first oblique facet planes 4r surrounding an outer circumference of projection portion 1a are inclined by each extending obliquely upward from projection portion 1a.

Figure 35:
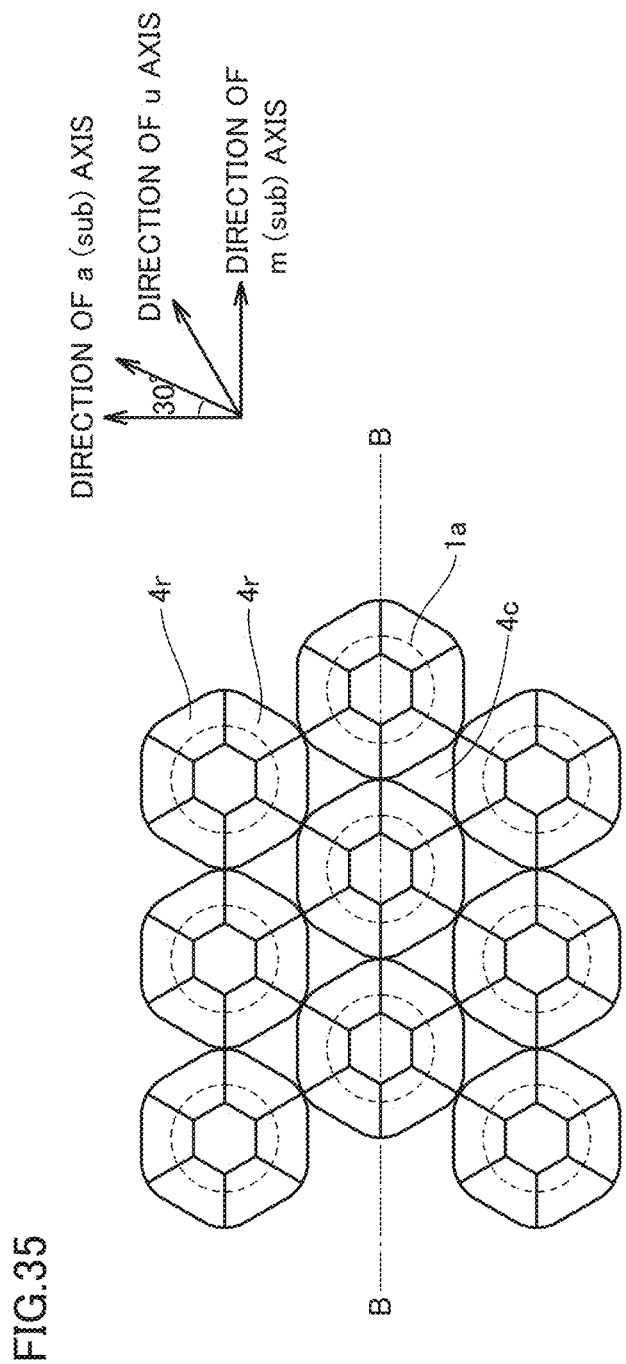
FIG. 35 is a schematic enlarged plan view of another example of the surface of the first nitride semiconductor underlying layer grown after the third nitride semiconductor underlying layer is formed.

FIG. 35 shows a schematic enlarged plan view of another example of the surface of first nitride semiconductor underlying layer 4 grown after third nitride semiconductor underlying layer 3 is formed. The example shown in FIG. 35 shows positional relation between first oblique facet plane 4r and first flat region 4c of first nitride semiconductor underlying layer 4 in a case where projection portions 1a at the surface of substrate 1 are arranged in a direction inclined by +30° with respect to the direction of the a (sub) axis and in a direction inclined by −30° with respect to the direction of the a (sub) axis (this case being referred to as a "case 2-2").

In a case of growing first nitride semiconductor underlying layer 4 in the three-dimensional growth mode in which 6 first oblique facet planes 4r are formed, first oblique facet planes 4r and first flat region 4c of first nitride semiconductor underlying layer 4 are each more likely to be affected by arrangement of projection portions 1a at substrate 1.

In case 2-2, in the plan view of the surface of first nitride semiconductor underlying layer 4, a shape of first flat region 4c of first nitride semiconductor underlying layer 4 is in such a shape as continuing triangles, and second nitride semiconductor underlying layer 5 is formed on first flat region 4c after switching to the two-dimensional growth mode, which is a mode of growth of second nitride semiconductor underlying layer 5, has been made. Since crystal defects at first flat region 4c of first nitride semiconductor underlying layer 4 tend to be taken over by and propagate through second nitride semiconductor underlying layer 5, case 2-1 in which an area of first flat region 4c occupied in the surface of first nitride semiconductor underlying layer 4 is smaller tends to bring about a film having few crystal defects and better crystallinity in second nitride semiconductor underlying layer 5, as compared with case 2-2.

Thickness $t_3$ of third nitride semiconductor underlying layer 3 shown in FIG. 27 is preferably not smaller than 60 nm and not greater than a height of projection portion 1a (for example, not greater than 600 nm in a case where projection portion 1a has a height of 0.6 μm). When thickness $t_3$ is not smaller than 60 nm, third nitride semiconductor underlying layer 3 covers the entire region of nitride semiconductor intermediate layer 2 in recess portion 1b, and consequently first nitride semiconductor underlying layer 4 and second nitride semiconductor underlying layer 5 each tend to be a film having few crystal defects and good crystallinity. When thickness $t_3$ is not greater than a height of projection portion 1a, first oblique facet plane 4r is likely to be formed during growth of first nitride semiconductor underlying layer 4, and hence first nitride semiconductor underlying layer 4 and second nitride semiconductor underlying layer 5 each tend to readily be a film having few crystal defects and good crystallinity.

In addition, a thickness $t_{34}$ of a largest thickness portion of a film which is combination of third nitride semiconductor underlying layer 3 and first nitride semiconductor underlying layer 4 shown in FIG. 27 is preferably not less than 0.5 time and not more than 2 times as great as an interval between adjacent projection portions 1a in the plan view of the surface of substrate 1. For example, when an interval between adjacent projection portions 1a in the plan view of the surface of substrate 1 is 2 μm, thickness $t_{34}$ is preferably not smaller than 1 μm and not greater than 4 μm. When thickness $t_{34}$ is equal to or more than 0.5 time as great as the interval between adjacent projection portions 1a in the plan view of the surface of substrate 1, a ratio of area of first oblique facet planes 4r at the surface of first nitride semiconductor underlying layer 4 is further higher than a ratio of area of first flat regions 4c, and therefore first nitride semiconductor underlying layer 4 and second nitride semiconductor underlying layer 5 each tend to readily be a film having few crystal defects and good crystallinity. Alternatively, when thickness $t_{34}$ is equal to or less than 2 times as great as the interval between adjacent projection portions 1a in the plan view of the surface of substrate 1, tendency to bury projection portion 1a while first oblique facet 4r is formed is low, and hence crystal defects do not tend to remain above projection portion 1a.

A thickness of second nitride semiconductor underlying layer 5 (a total thickness of thickness $t_{5A}$ of lower layer 5A and thickness $t_{5B}$ of upper layer 5B) is preferably at least twice a height of projection portion 1a. For example, when a height of projection portion 1a is 0.6 μm, the thickness is preferably not smaller than 1.2 μm. When a thickness of second nitride semiconductor underlying layer 5 is at least twice the height of projection portion 1a, tendency that lower layer 5A of second nitride semiconductor underlying layer 5 can bury projection portion 1a is higher, and hence tendency that upper surface 5M of lower layer 5A of second nitride semiconductor underlying layer 5 is flat is higher.

It is noted that, for example, a layer composed of a group III nitride semiconductor expressed with a formula $Al_{x10}Ga_{y10}In_{z10}N$ (0≤x10≤1, 0≤y10≤1, 0≤z10≤1, x10+y10+z10≠0) can be employed as third nitride semiconductor underlying layer 3. In addition, preferably, third nitride semiconductor underlying layer 3, first nitride semiconductor underlying layer 4, and second nitride semiconductor underlying layer 5 are identical in composition in terms of a material and they are different only in growth conditions.

At the time of switching from the growth mode during growth of third nitride semiconductor underlying layer 3 to the growth mode during growth of first nitride semiconductor underlying layer 4 and switching from the growth mode during growth of first nitride semiconductor underlying layer 4 to the growth mode during growth of second nitride semiconductor underlying layer 5, preferably, a growth interruption time period, for example, approximately for 2 seconds to 60 seconds, is provided during which growth conditions are changed, however, conditions may be changed continuously.

In order not to take over such a crystal defect as dislocation in nitride semiconductor intermediate layer 2 made of an aggregate of column crystals, a nitride semiconductor layer containing Ga as a group III element is preferably employed for third nitride semiconductor underlying layer 3, first nitride semiconductor underlying layer 4, and second nitride semiconductor underlying layer 5.

In order not to take over dislocation into nitride semiconductor intermediate layer 2, dislocation loop should be formed around an interface with nitride semiconductor intermediate layer 2. In a case where third nitride semiconductor underlying layer 3 is composed of a group III nitride semiconductor containing Ga, dislocation loop is likely to be formed. Then, by employing third nitride semiconductor underlying layer 3, first nitride semiconductor underlying layer 4, and second nitride semiconductor underlying layer 5 each composed of a group III nitride semiconductor containing Ga, dislocation is confined as a loop around the interface with nitride semiconductor intermediate layer 2, so that taking over of dislocation from nitride semiconductor intermediate layer 2 into first nitride semiconductor underlying layer 4 tends to be suppressed.

In addition, the surface of nitride semiconductor intermediate layer 2 immediately before third nitride semiconductor underlying layer 3 is formed may be subjected to heat treatment. Through this heat treatment, a cleaner surface and improvement in crystallinity of nitride semiconductor intermediate layer 2 tend to be achieved. This heat treatment can be carried out, for example, in an MOCVD apparatus in which MOCVD is employed, and for example, a hydrogen gas, a nitrogen gas, or the like can be employed as an atmospheric gas during heat treatment.

Moreover, in order to prevent decomposition of nitride semiconductor intermediate layer 2 during heat treatment above, an ammonia gas may be mixed with the atmospheric gas during heat treatment. Furthermore, heat treatment above can be carried out, for example, at a temperature not lower than 900° C. and not higher than 1250° C., for example, for a time period not shorter than 1 minute and not longer than 60 minutes.

Preferably, third nitride semiconductor underlying layer 3, first nitride semiconductor underlying layer 4, and lower layer 5A of second nitride semiconductor underlying layer 5 are each undoped, and upper layer 5B of second nitride semiconductor underlying layer 5 is doped with an n-type, however, third nitride semiconductor underlying layer 3, first nitride semiconductor underlying layer 4, and lower layer 5A of second nitride semiconductor underlying layer 5 may each be doped with an n-type. In a case of doping with an n-type, doping with an n-type dopant in a range not lower than $1 \times 10^{17}$ cm$^{-3}$ and not higher than $1 \times 10^{19}$ cm$^{-3}$ may be carried out.

For example, at least one or the like selected from the group consisting of silicon, germanium, and tin can be employed as an n-type dopant, and among these, use of silicon is preferred. In a case of using silicon as an n-type dopant, a silane gas or a disilane gas is preferably used as an n-type doping gas.

A temperature of substrate 1 during growth of each of third nitride semiconductor underlying layer 3, first nitride semiconductor underlying layer 4, and second nitride semiconductor underlying layer 5 is preferably not lower than 800° C. and not higher than 1250° C. and more preferably not lower than 900° C. and not higher than 1150° C. When a temperature of substrate 1 during growth of each of third nitride semiconductor underlying layer 3, first nitride semiconductor underlying layer 4, and second nitride semiconductor underlying layer 5 is not lower than 800° C. and not higher than 1250° C. and in particular not lower than 900° C. and not higher than 1150° C., third nitride semiconductor underlying layer 3, first nitride semiconductor underlying layer 4, and second nitride semiconductor underlying layer 5 having few crystal defects and excellent crystallinity tends to be grown.

Then, for example, with MOCVD, n-type nitride semiconductor contact layer 7 is formed on the surface of second nitride semiconductor underlying layer 5. It is noted that n-type nitride semiconductor contact layer 7 should only be provided such that at least a part thereof is in contact with the surface of second nitride semiconductor underlying layer 5.

A total thickness of third nitride semiconductor underlying layer 3, first nitride semiconductor underlying layer 4, second nitride semiconductor underlying layer 5, and n-type nitride semiconductor contact layer 7 is preferably not smaller than 4 μm and not greater than 20 μm and more preferably not smaller than 4 μm and not greater than 15 μm. When a total thickness of third nitride semiconductor underlying layer 3, first nitride semiconductor underlying layer 4, second nitride semiconductor underlying layer 5, and n-type nitride semiconductor contact layer 7 is not smaller than 4 μm, crystallinity of these layers tends to be good and a pit does not tend to be caused in a surface of these layers. On the other hand, when a total thickness of third nitride semiconductor underlying layer 3, first nitride semiconductor underlying layer 4, second nitride semiconductor underlying layer 5, and n-type nitride semiconductor contact layer 7 is not greater than 15 μm, warpage of substrate 1 does not become great, breakage of a wafer or uneven exposure during a photolithography process is less likely, and yield of an element tends to be high. Furthermore, when a total thickness of third nitride semiconductor underlying layer 3, first nitride semiconductor underlying layer 4, second nitride semiconductor underlying layer 5, and n-type nitride semiconductor contact layer 7 is in particular not smaller than 4 μm and not greater than 15 μm, crystallinity of these layers tends to be good, occurrence of warpage of substrate 1 tends to be suppressed, and lowering in yield of an element tends to further effectively be prevented. It is noted that an upper limit of a thickness of n-type nitride semiconductor contact layer 7 of the total thickness of these layers is not particularly limited.

Then, for example, with MOCVD, n-type nitride semiconductor superlattice layer 92 is formed on the surface of n-type nitride semiconductor contact layer 7. A main function of n-type nitride semiconductor superlattice layer 92 is to suppress extension of a crystal defect extending from below to above of n-type nitride semiconductor contact layer 7 as far as nitride semiconductor active layer 11, by using an interface between layers forming the superlattice of n-type nitride semiconductor superlattice layer 92.

For example, a superlattice structure obtained by alternately stacking 10 pairs of a low band gap layer composed, for example, of $In_{x11}Ga_{1-x11}N$ (0<x11≤1, for example, x111=0.02) and having a thickness of 2.5 nm and a high band gap layer composed, for example, of GaN and having a thickness of 2.5 nm can be employed as n-type nitride semiconductor superlattice layer 92, however, composition of the low band gap layer and the high band gap layer is not limited thereto. Since the low band gap layer contains volatile In as its composition, a growth temperature for entire n-type nitride semiconductor superlattice layer 92 or at least for the low band gap layer is preferably lower than that for n-type nitride semiconductor contact layer 7. Though a growth temperature may be constant, for example, growth may be carried out at a low temperature for the low band gap layer, and growth may be carried out at a high temperature for the high band gap layer. It is noted that n-type nitride semiconductor superlattice layer 92 may be omitted and nitride semiconductor active layer 11 may be formed on n-type nitride semiconductor contact layer 7. In this case, since an element structure is simplified, variation in characteristics tends to be lowered.

Any one or both of the low band gap layer and the high band gap layer in n-type nitride semiconductor superlattice layer 92 is/are preferably doped with an n-type. Concentration of doping with an n-type dopant is preferably not lower than $1 \times 10^{17}$ cm$^{-3}$ and not higher than $1 \times 10^{20}$ cm$^{-3}$, more preferably not lower than $1 \times 10^{18}$ cm$^{-3}$ and not higher than $1 \times 10^{19}$ cm$^{-3}$, and further preferably not lower than $2 \times 10^{18}$ cm$^{-3}$ and not higher than $4 \times 10^{18}$ cm$^{-3}$. In this case, good crystallinity of n-type nitride semiconductor superlattice layer 92 tends to be maintained and an operation voltage of an element tends to be lowered.

Then, for example, with MOCVD, nitride semiconductor active layer 11, p-type nitride semiconductor clad layer 13, and p-type nitride semiconductor contact layer 15 are formed on the surface of n-type nitride semiconductor superlattice layer 92 in this order.

Then, light transmitting electrode layer 19 composed, for example, of ITO (Indium Tin Oxide) is formed on the surface of p-type nitride semiconductor contact layer 15.

Then, a part of the surface of n-type nitride semiconductor contact layer 7 is exposed by etching away a part of a stack structure after p-side electrode 21 is formed.

Then, p-side electrode 21 and n-side electrode 20 are simultaneously formed on the surface of light-transmitting electrode 19 and on the exposed surface of n-type nitride semiconductor contact layer 7, respectively. For example, a stack film of a nickel layer, an aluminum layer, a titanium layer, and a gold layer can be formed as p-side electrode 21 and n-side electrode 20.

It is noted that, instead of simultaneously forming p-side electrode 21 and n-side electrode 20, they may separately be formed, and in that case, a material optimal for p-side electrode 21 and n-side electrode 20 can be selected by varying a material for each of these electrodes.

Thereafter, insulating protection film 23 composed of $SiO_2$ or the like is formed on the entire surface of the stack structure after n-side electrode 20 is formed, an opening is provided in insulating protection film 23 so as to expose p-side electrode 21 and n-side electrode 20, and a wafer on which a plurality of nitride semiconductor light emitting diode elements 200 are formed is divided into individual elements, so that nitride semiconductor light emitting diode element 200 according to Embodiment 2-1 can be fabricated.

In nitride semiconductor light emitting diode element 200 according to Embodiment 2-1 fabricated as above, on the surface of nitride semiconductor intermediate layer 2 provided on the surface of substrate 1, third nitride semiconductor underlying layer 3 is grown in the 2.5 dimensional growth mode, first nitride semiconductor underlying layer 4 is grown in the three-dimensional growth mode, and second nitride semiconductor underlying layer 5 is grown in the two-dimensional growth mode. N-type nitride semiconductor contact layer 7, n-type nitride semiconductor superlattice layer 92, nitride semiconductor active layer 11, p-type nitride semiconductor clad layer 13, and p-type nitride semiconductor contact layer 15 are stacked in this order on flat upper surface 5U of second nitride semiconductor underlying layer 5 thus obtained, which has a narrow half width of an X-ray rocking curve and good crystallinity. Therefore, each layer on the nitride semiconductor underlying layer such as nitride semiconductor active layer 11 is low in dislocation density and excellent in crystallinity.

Therefore, nitride semiconductor light emitting diode element 200 according to Embodiment 2-1 formed of such a nitride semiconductor layer having excellent crystallinity is an element low in operation voltage and high in emission output.

Nitride semiconductor light emitting diode element 200 according to Embodiment 2-1 was adopted as a bare chip (not sealed with resin as will be described later) evaluation element, and a current of 30 mA was fed to 10 elements. Then, it was confirmed that an element low in operation voltage and high in emission output, which achieved light output of 41 mW, an operation voltage of 3.0 V, and an emission wavelength of 445 nm on average, was obtained.

Figure 36:
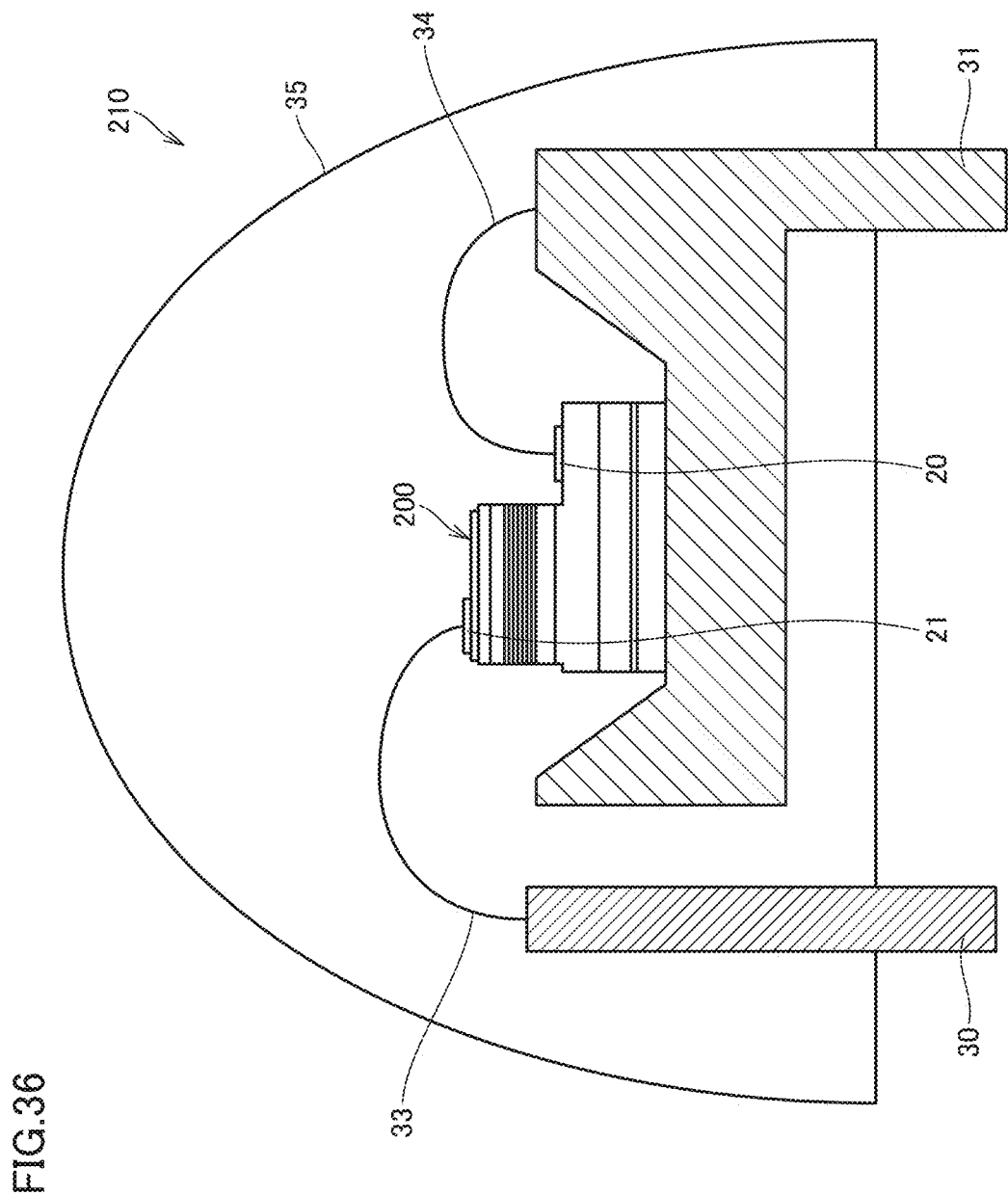
FIG. 36 is a schematic cross-sectional view of one example of a light emitting device including the nitride semiconductor light emitting diode element in the embodiment.

FIG. 36 shows a schematic cross-sectional view of one example of a light emitting device 210 including nitride semiconductor light emitting diode element 200 according to Embodiment 2-1.

Here, light emitting device 210 has such a construction that nitride semiconductor light emitting diode element 200 according to Embodiment 2-1 is set on second lead frame 31. Then, p-side electrode 21 of nitride semiconductor light emitting diode element 200 and first lead frame 30 are electrically connected to each other through first wire 33, and n-side electrode 20 of nitride semiconductor light emitting diode element 200 and second lead frame 31 are electrically connected to each other through second wire 34. In addition, since nitride semiconductor light emitting diode element 200 is molded with transparent molding resin 35, light emitting device 210 is in a shape of a cannonball. Since light emitting device 210 having the construction shown in FIG. 36 includes nitride semiconductor light emitting diode element 200 according to Embodiment 2-1, a light emitting device low in operation voltage and high in emission output can be achieved.

Embodiment 2-2

Embodiment 2 is characterized by being directed to a nitride semiconductor transistor element which is an electronic device including the nitride semiconductor structure according to Embodiment 1 (a stack structure of substrate 1, nitride semiconductor intermediate layer 2, third nitride semiconductor underlying layer 3, first nitride semiconductor underlying layer 4, and second nitride semiconductor underlying layer 5).

Figure 37:
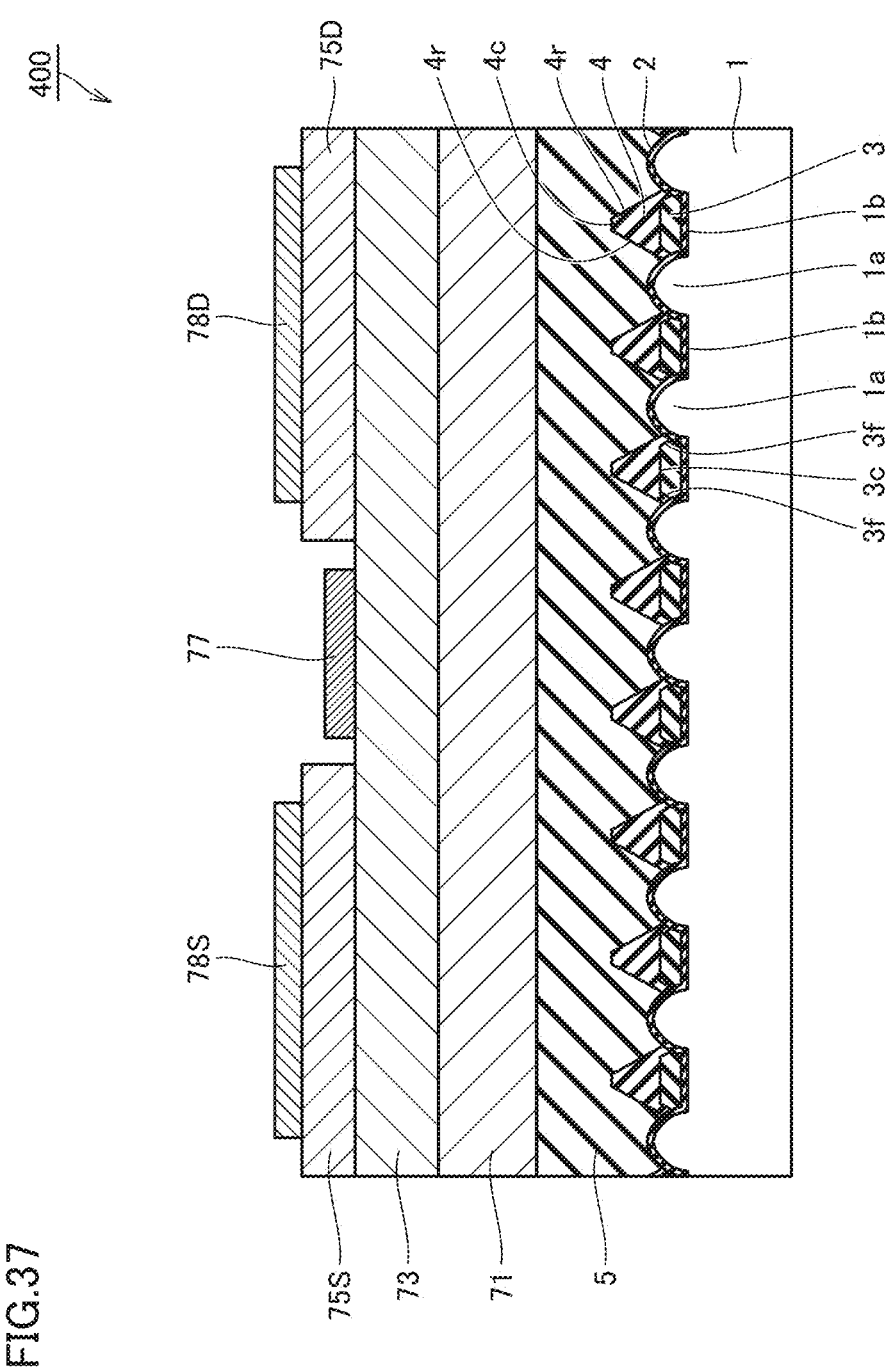
FIG. 37 is a schematic cross-sectional view of a nitride semiconductor transistor element in an embodiment.

FIG. 37 shows a schematic cross-sectional view of a nitride semiconductor transistor element 400 according to Embodiment 2-2. Nitride semiconductor transistor element 400 has a nitride semiconductor structure constituted of substrate 1 formed of a sapphire substrate having a c plane as a main surface, in which projection portions 1a are arranged in three equivalent directions of the a (sub) axis, as well as nitride semiconductor intermediate layer 2 composed of AlN or the like, third nitride semiconductor underlying layer 3 composed of undoped GaN or the like, first nitride semiconductor underlying layer 4 composed of undoped GaN or the like, and second nitride semiconductor underlying layer 5 composed of undoped GaN or the like, which are successively stacked on the surface of substrate 1.

Then, nitride semiconductor electron transit layer 71 composed of undoped GaN or the like is stacked on flat surface 5U of second nitride semiconductor underlying layer 5 having few crystal defects and good crystallinity, and n-type nitride semiconductor electron supply layer 73 composed of n-type AlGaN or the like is stacked on the surface of nitride semiconductor electron transit layer 71.

Gate electrode 77 is provided on the surface of n-type nitride semiconductor electron supply layer 73, and source contact layer 75S and drain contact layer 75D composed of n-type GaN or the like are provided on respective opposing sides of gate electrode 77. In addition, source electrode 78S is provided on source contact layer 75S, and drain electrode 78D is provided on drain contact layer 75D.

One example of a method of manufacturing nitride semiconductor transistor element 400 according to Embodiment 2-2 will be described below. Initially, as in Embodiment 2-1, nitride semiconductor intermediate layer 2 composed of AlN is formed with reactive sputtering on the surface of substrate 1 having projection portions 1a and recess portions 1b.

Then, on the surface of nitride semiconductor intermediate layer 2, with MOCVD, third nitride semiconductor underlying layer 3 composed of undoped GaN is grown in the 2.5 dimensional growth mode in which third oblique facet plane 3f and third flat region 3c appear and first nitride semiconductor underlying layer 4 composed of undoped GaN is grown in the three-dimensional growth mode.

Here, first nitride semiconductor underlying layer 4 is grown under such conditions that, in the plan view of the surface of first nitride semiconductor underlying layer 4, two first oblique facet planes 4r which appear in the direction of the a (sub) axis and two first oblique facet planes 4r which appear in each of the direction inclined by an angle of +60° with respect to the direction of the a (sub) axis and the direction inclined by an angle of −60° with respect to the direction of the a (sub) axis appear.

Then, second nitride semiconductor underlying layer 5 composed of undoped GaN is grown on the surface of first nitride semiconductor underlying layer 4 in the two-dimensional growth mode with MOCVD. Here, second nitride semiconductor underlying layer 5 is grown under such conditions that first oblique facet plane 4r of first nitride semiconductor underlying layer 4 is buried and flat upper surface 5U appears.

Then, with MOCVD, nitride semiconductor electron transit layer 71 composed of n-type $Al_xGa_{1-x}N$ is stacked on flat upper surface 5U of second nitride semiconductor underlying layer 5, and n-type nitride semiconductor electron supply layer 73 is stacked on the surface of nitride semiconductor electron transit layer 71.

Thereafter, as shown in FIG. 37, after source contact layer 75S and drain contact layer 75D are formed on the surface of n-type nitride semiconductor electron supply layer 73, source electrode 78S, drain electrode 78D, and gate electrode 77 are each formed. Nitride semiconductor transistor element 400 according to Embodiment 2-2 can be fabricated as above.

In nitride semiconductor transistor element 400 according to Embodiment 2-2, in the plan view of the surface of first nitride semiconductor underlying layer 4, first nitride semiconductor underlying layer 4 is grown under such conditions that two first oblique facet planes 4r which appear in the direction of the a (sub) axis and two first oblique facet planes 4r which appear in each of the direction inclined by an angle of +60° with respect to the direction of the a (sub) axis and the direction inclined by an angle of −60° with respect to the direction of the a (sub) axis appear. Thus, since crystal defects in a two-dimensional electron transit region at an uppermost surface of nitride semiconductor electron transit layer 71 are decreased in particular, electron mobility can be improved.

Therefore, in nitride semiconductor transistor element 400 according to Embodiment 2-2 as well, each layer stacked on the surface of nitride semiconductor intermediate layer 2 can be a layer low in dislocation density and excellent in crystallinity, and hence an element achieving improved characteristics such as electron mobility can be obtained.

As above, according to the present embodiment, on the surface of substrate 1 having projection portions 1a and recess portions 1b, initially, third nitride semiconductor underlying layer 3 is grown in the 2.5 dimensional growth mode, then first nitride semiconductor underlying layer 4 is grown in the three-dimensional growth mode, and thereafter second nitride semiconductor underlying layer 5 is grown in the two-dimensional growth mode, so that second nitride semiconductor underlying layer 5 serves as an underlying layer low in dislocation density and excellent in crystallinity.

Thus, while occurrence of breakage and crack of a wafer during growth with MOCVD of a nitride semiconductor layer stacked on upper surface 5U of second nitride semiconductor underlying layer 5 and in subsequent processes is suppressed, crystallinity expressed with a half width of an X-ray rocking curve or the like of a nitride semiconductor layer can be improved and defect density expressed with the CL method, EPD, or the like can be lowered. Therefore, a nitride semiconductor element achieving improved device characteristics represented by emission efficiency, electron mobility, and the like and a nitride semiconductor structure serving as a basis for the nitride semiconductor element can be provided.

Though only a layer formed with sputtering has been described as nitride semiconductor intermediate layer 2, the method is not limited to this method, and for example, what is called a low-temperature buffer layer formed at a low temperature with MOCVD may be adopted. In addition, in a case of using a GaN substrate as substrate 1, nitride semiconductor intermediate layer 2 may be omitted.

It is noted that description other than the above in Embodiments 2-1 and 2-2 is the same as that in Embodiments 1-1 and 1-2 and hence description thereof will not be provided.

Embodiment 3-1

A method of manufacturing a nitride semiconductor structure according to Embodiment 3-1 will be described below. The method of manufacturing a nitride semiconductor structure according to Embodiment 3-1 is characterized in growing a first nitride semiconductor underlying layer with MOCVD in a vertical MOCVD apparatus in which a carrier gas containing a hydrogen gas is employed while a substrate is rotated and limiting the number of rotations of the substrate per unit time and a volume ratio of the hydrogen gas to the total volume of the carrier gas. In addition, the method of manufacturing a nitride semiconductor structure according to the present embodiment may naturally include other steps between steps which will be described later.

Figure 38:
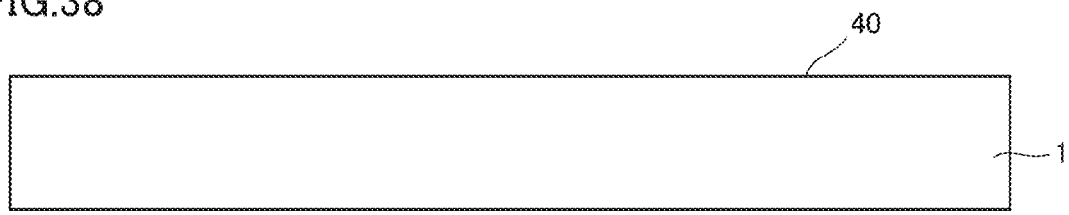
FIG. 38 is a schematic cross-sectional view illustrating a part of manufacturing steps in a method of manufacturing a nitride semiconductor structure in an embodiment.

Initially, as shown in a schematic cross-sectional view in FIG. 38, the step of preparing substrate 1 is performed. Here, substrate 1 composed of trigonal corundum or hexagonal crystal can be prepared as substrate 1. For example, a substrate made of sapphire ($Al_2O_3$) single crystal, AlN single crystal, GaN single crystal, or the like can be employed as substrate 1 composed of trigonal corundum or hexagonal crystal.

In addition, a surface 40 of substrate 1 may be a c plane or a surface inclined with respect to the c plane by 5° or smaller, and a direction of inclination may be, for example, only in the direction of the m (sub) axis (<1-100>), only in the direction of the a (sub) axis (<11-20>), or in a direction which is combination of both of these directions. More specifically, such a substrate that surface 40 of substrate 1 is inclined by 0.15° to 0.35° in the direction of the m (sub) axis <1-100> of the substrate with respect to the c plane (a plane of which normal is the c axis) or the like can be prepared as substrate 1.

Figure 39:
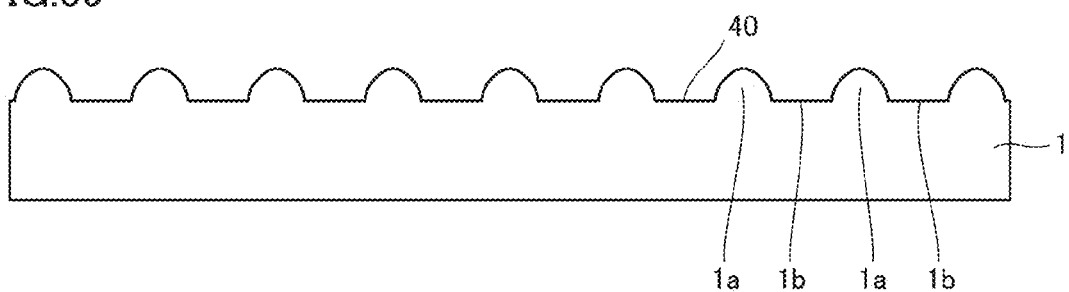
FIG. 39 is a schematic cross-sectional view illustrating another part of the manufacturing steps in the method of manufacturing a nitride semiconductor structure in the embodiment.

Then, as shown in a schematic cross-sectional view in FIG. 39, recess portion 1b and projection portion 1a provided between recess portions 1b are formed at surface 40 of substrate 1. Such projection portions 1a and recess portions 1b at the surface of substrate 1 can be formed, for example, through a process including a patterning step of forming a mask defining two-dimensional arrangement of projection portions 1a on surface 40 of substrate 1 and a step of forming recess portions 1b by etching surface 40 of substrate 1 with the use of the mask formed in the patterning step. Here, the patterning step can be performed with a common photolithography step. An etching step can be performed, for example, with dry etching or wet etching. In order that a shape of projection portion 1a has a tip end portion which will be described later, however, dry etching with which a shape of projection portion 1a is readily controlled is preferably carried out.

Then, as shown in the schematic cross-sectional view in FIG. 5, nitride semiconductor intermediate layer 2 is formed on the surface of substrate 1.

Then, as shown in the schematic cross-sectional view in FIG. 6, first nitride semiconductor underlying layer 4 is formed on the surface of nitride semiconductor intermediate layer 2, and as shown in the schematic cross-sectional view in FIG. 7, second nitride semiconductor underlying layer 5 is formed on the surface of first nitride semiconductor underlying layer 4.

Here, first nitride semiconductor underlying layer 4 and second nitride semiconductor underlying layer 5 can successively be formed on the surface of nitride semiconductor intermediate layer 2, for example, with MOCVD with the use of a vertical MOCVD apparatus, in which a carrier gas containing a hydrogen gas and a source material gas containing a group III source material gas and a group V source material gas are supplied while substrate 1 on which nitride semiconductor intermediate layer 2 has been formed is rotated.

First nitride semiconductor underlying layer 4 is grown in the facet growth mode in which first oblique facet plane 4r is formed, and second nitride semiconductor underlying layer 5 is grown in the embedment growth mode in which first oblique facet plane 4r is buried such that first oblique facet plane 4r and lower surface 5b are in contact with each other and flat upper surface 5a is formed. Thus, second nitride semiconductor underlying layer 5 having few crystal defects, high crystallinity, and flat upper surface 5a can be formed.

FIG. 8 shows the schematic enlarged plan view of one example of the surface of first nitride semiconductor underlying layer 4 shown in FIG. 6. As shown in FIG. 8, first nitride semiconductor underlying layer 4 has 6 first oblique facet planes 4r surrounding projection portion 1a on the outer side of projection portion 1a. In the plan view shown in FIG. 8, two first oblique facet planes 4r appear in the direction of the a (sub) axis and two first oblique facet planes 4r appear in each of the direction inclined by an angle of +60° with respect to the direction of the a (sub) axis and the direction inclined by an angle of −60° with respect to the direction of the a (sub) axis (both of which are the u direction) (this case being referred to as a case 3-1). In addition, first oblique facet plane 4r which appears in a cross-section along the line B-B in FIG. 8 is a plane which similarly appears also in a direction of depth of a cross-section thereof in a range where first oblique facet planes 4r are present.

Furthermore, one first oblique facet plane 4r surrounding projection portion 1a and another first oblique facet plane 4r surrounding projection portion 1a are coupled to each other at upper surface 4c of first nitride semiconductor underlying layer 4.

First oblique facet plane 4r of first nitride semiconductor underlying layer 4 is inclined downward from upper surface 4c of first nitride semiconductor underlying layer 4 toward projection 1a of substrate 1. Here, among 6 first oblique facet planes 4r, in the plan view of the surface of first nitride semiconductor underlying layer 4, two first oblique facet planes 4r which appear in the direction of the a (sub) axis are inclined obliquely upward with respect to the direction of the a (sub) axis (<11-20> direction), and the facet plane extends in the direction of inclination. In addition, similarly, in the plan view of the surface of first nitride semiconductor underlying layer 4, two first oblique facet planes 4r which appear in each of the direction inclined by an angle of +60° with respect to the direction of the a (sub) axis and the direction inclined by an angle of −60° with respect to the direction of the a (sub) axis are also inclined obliquely upward with respect to the direction inclined by an angle of +60° with respect to the direction of the a (sub) axis and the direction inclined by an angle of −60° with respect to the direction of the a (sub) axis, and the facet plane extends in the direction of inclination.

In addition, first oblique facet planes 4r of first nitride semiconductor underlying layer 4 serve as 6 facet planes surrounding projection portion 1a on the outer side of projection portion 1a with projection portion 1a being located in the center, on nitride semiconductor intermediate layer 2.

Moreover, in the plan view of the surface of first nitride semiconductor underlying layer 4, substantially no facet plane other than first oblique facet planes 4r which appear in the direction of the a (sub) axis and the u directions preferably appears. More specifically, a ratio of area of first oblique facet planes 4r expressed with the expression (I) above is preferably not lower than 80% and more preferably not lower than 90%. When a ratio of area of first oblique facet planes 4r is not lower than 80% and in particular not lower than 90%, occurrence of breakage and crack of a wafer tends to be suppressed during growth of a nitride semiconductor layer stacked on upper surface 5a of second nitride semiconductor underlying layer 5 and in subsequent processes. Furthermore, crystallinity of a nitride semiconductor layer expressed with a half width of an X-ray rocking curve or the like also tends to improve. Additionally, defect density which can be evaluated based on a cathode luminescence method, etch pit density, or the like also tends to lower. Specifically, a half width (arcsec) of an X-ray rocking curve at the (004) plane of a GaN underlying layer can be 30 to 40 arcsec. Further, dark spot density obtained with the CL method can be not higher than $2 \times 10^8$ cm$^{-3}$.

The facet growth mode for first nitride semiconductor underlying layer 4 in which first oblique facet plane 4r as described above appears can be realized by setting the number of rotations per unit time of substrate 1 during growth of first nitride semiconductor underlying layer 4 with MOCVD with the use of the vertical MOCVD apparatus to be not lower than 400 RPM and not higher than 1000 RPM and setting a volume ratio of a hydrogen gas to the total volume of a carrier gas supplied during growth with MOCVD of first nitride semiconductor underlying layer 4 to be not lower than 0.7 and not higher than 1.

This is because the present inventor has found as a result of dedicated studies the fact that, in growing first nitride semiconductor underlying layer 4 on nitride semiconductor intermediate layer 2 formed on the surface of substrate 1 having projection portions and recess portions with MOCVD with the use of the vertical MOCVD apparatus, the number of rotations of substrate 1 per unit time is set to be not lower than 400 RPM and not higher than 1000 RPM and a volume ratio of a hydrogen gas to the total volume of a carrier gas supplied during growth of first nitride semiconductor underlying layer 4 is not lower than 0.7 and not higher than 1, so that first nitride semiconductor underlying layer 4 can be a continuous film having high uniformity and having continuous surfaces.

In a case where second nitride semiconductor underlying layer 5 is grown with MOCVD on the surface of first nitride semiconductor underlying layer 4 which is such a continuous film, upper surface 5a of second nitride semiconductor underlying layer 5 having few crystal defects, high crystallinity, and high flatness can be obtained. Therefore, in the present embodiment, on upper surface 5a of second nitride semiconductor underlying layer 5 having such high crystallinity and high flatness, a nitride layer having excellent crystallinity can be formed with good reproducibility.

It is noted that "RPM" is abbreviation of "Rotation Per Minute," and refers to the number of rotations of substrate 1 per minute. In addition, the "vertical MOCVD apparatus" is a reaction furnace in which a source material gas is supplied in a direction substantially perpendicular to a substrate surface.

The facet growth mode for first nitride semiconductor underlying layer 4 where first oblique facet plane 4r as described above appears and the embedment growth mode for second nitride semiconductor underlying layer 5 in which first oblique facet plane 4r is buried to form upper surface 5a high in flatness are preferably carried out to satisfy at least one condition selected from the group consisting of (i-3), (ii-3), (iii-3), (iv-3), and (v-3) below and further preferably carried out to satisfy all conditions of (i-3), (ii-3), (iii-3), (iv-3), and (v-3) below. In the case where the facet growth mode for first nitride semiconductor underlying layer 4 and the embedment growth mode for second nitride semiconductor underlying layer 5 are carried out under the condition satisfying at least one of (i-3) to (v-3) below, in particular under the conditions satisfying all of (i-3) to (v-3), upper surface 5a of second nitride semiconductor underlying layer 5 having higher crystallinity and flatness can be obtained and hence a nitride layer having better crystallinity tends to be formed thereon with better reproducibility.

(i-3) A growth temperature during growth of first nitride semiconductor underlying layer 4 is set to be lower than a growth temperature during growth of second nitride semiconductor underlying layer 5.

(ii-3) A pressure during growth of first nitride semiconductor underlying layer 4 is set to be higher than a pressure during growth of second nitride semiconductor underlying layer 5.

(iii-3) A V/III ratio of a source material gas (a molar ratio of a group V element with respect to a group III element in a source material gas) supplied during growth of first nitride semiconductor underlying layer 4 is set to be higher than a V/III ratio of a source material gas supplied during growth of second nitride semiconductor underlying layer 5.

(iv-3) The number of rotations per unit time of substrate 1 during growth of first nitride semiconductor underlying layer 4 is set to be smaller than the number of rotations per unit time of substrate 1 during growth of second nitride semiconductor underlying layer 5.

(v-3) A volume ratio of a hydrogen gas to the total volume of a carrier gas during growth of first nitride semiconductor underlying layer 4 is set to be equal to or higher than a volume ratio of a hydrogen gas to the total volume of a carrier gas during growth of second nitride semiconductor underlying layer 5.

Specific conditions of each of (i-3), (ii-3), (iii-3), (iv-3), and (v-3) above are shown, for example, as follows:

(i-3) A temperature of substrate 1 during growth of second nitride semiconductor underlying layer 5 is set to 1080° C. as compared with a temperature of 1000° C. of substrate 1 during growth of first nitride semiconductor underlying layer 4;

(ii-3) A pressure of an atmosphere during growth of second nitride semiconductor underlying layer 5 is set to 17.3 kPa as compared with a pressure of 66.6 kPa of an atmosphere during growth of first nitride semiconductor underlying layer 4;

(iii-3) A V/III ratio of a source material gas supplied during growth of second nitride semiconductor underlying layer 5 is set to 676 as compared with a V/III ratio of 1165 of a source material gas supplied during growth of first nitride semiconductor underlying layer 4;

(iv-3) The number of rotations per unit time of substrate 1 during growth of second nitride semiconductor underlying layer 5 is set to 1200 RPM as compared with the number of rotations of 600 RPM per unit time of substrate 1 during growth of first nitride semiconductor underlying layer 4; and (v-3) A volume ratio of a hydrogen gas to the total volume of a carrier gas ((a volume of the hydrogen gas)/(the total volume of the carrier gas)) during growth of second nitride semiconductor underlying layer 5 is not lower than 0.7 and not higher than 1 with respect to the volume ratio of 1 of the hydrogen gas to the total volume of the carrier gas during growth of first nitride semiconductor underlying layer 4.

Here, when the number of rotations per unit time of substrate 1 during growth of first nitride semiconductor underlying layer 4 with MOCVD with the use of vertical MOCVD is not lower than 400 RPM and not higher than 1000 RPM, a volume ratio of a hydrogen gas to the total volume of a carrier gas supplied during growth of first nitride semiconductor underlying layer 4 is not lower than 0.7 and not higher than 1, and at least one condition selected from the group consisting of (i-3), (ii-3), (iii-3), (iv-3), and (v-3) is satisfied, yield in an electrostatic discharge test (an ESD test) of first nitride semiconductor underlying layer 4 tends to be higher. It is noted that the ESD test is conducted under an HBM (human body model) condition in which a reverse voltage is set to 1 kV.

A method of manufacturing a nitride semiconductor element according to Embodiment 3-1 will be described hereinafter with reference to FIGS. 12 to 18. It is noted that, in the following as well, other steps may naturally be included between steps which will be described later.

Initially, as shown in FIG. 12, n-type nitride semiconductor contact layer 7 is formed on upper surface 5a of second nitride semiconductor underlying layer 5, for example, fabricated as above with MOCVD.

Then, as shown in FIG. 13, for example, with MOCVD, n-type nitride semiconductor clad layer 9 is formed on the surface of n-type nitride semiconductor contact layer 7.

Then, as shown in FIG. 14, for example, with MOCVD, nitride semiconductor active layer 11 is formed on the surface of n-type nitride semiconductor clad layer 9.

Then, as shown in FIG. 15, for example, with MOCVD, p-type nitride semiconductor clad layer 13 is formed on the surface of nitride semiconductor active layer 11.

It is noted that, for example, a layer obtained by doping with a p-type dopant, a group III nitride semiconductor expressed with the formula $Al_{x8}Ga_{y8}In_{z8}N$ ($0 \leq x8 \leq 1$, $0 \leq y8 \leq 1$, $0 \leq z8 \leq 1$, $x8+y8+z8 \neq 0$) or the like, can be employed as p-type nitride semiconductor clad layer 13 as described above, however, a layer having a superlattice structure obtained by alternately stacking a layer (an A layer) composed of a group III nitride semiconductor expressed with a formula $Al_{x8a}Ga_{1-x8a}N$ ($0<x8a \leq 0.4$, preferably $0.1 \leq x8a \leq 0.3$) and a layer (a B layer) composed of a group III nitride semiconductor expressed with a formula $Al_{x8b}Ga_{y8b}In_{z8b}N$ ($0 \leq x8 \leq 1$, $0 \leq y8b \leq 1$, $0 \leq z8b \leq 1$, $x8b+y8b+z8b \neq 0$) narrower in band gap than the A layer can also be employed. It is noted that, in the superlattice structure, each of the A layer and the B layer may be doped with a p-type dopant, or only one of the A layer and the B layer may be doped with a p-type dopant.

Then, as shown in FIG. 16, for example, with MOCVD, p-type nitride semiconductor contact layer 15 is formed on the surface of p-type nitride semiconductor clad layer 13.

Then, as shown in FIG. 17, after light transmitting electrode layer 19 composed, for example, of ITO (Indium Tin Oxide) is formed on the surface of p-type nitride semiconductor contact layer 15, p-side electrode 21 is formed on the surface of light transmitting electrode layer 19.

Then, as shown in FIG. 18, a part of the surface of n-type nitride semiconductor contact layer 7 is exposed by etching away a part of a stack structure after p-side electrode 21 is formed.

Then, as shown in FIG. 19, n-side electrode 20 is formed on the exposed surface of n-type nitride semiconductor contact layer 7.

Figure 40:
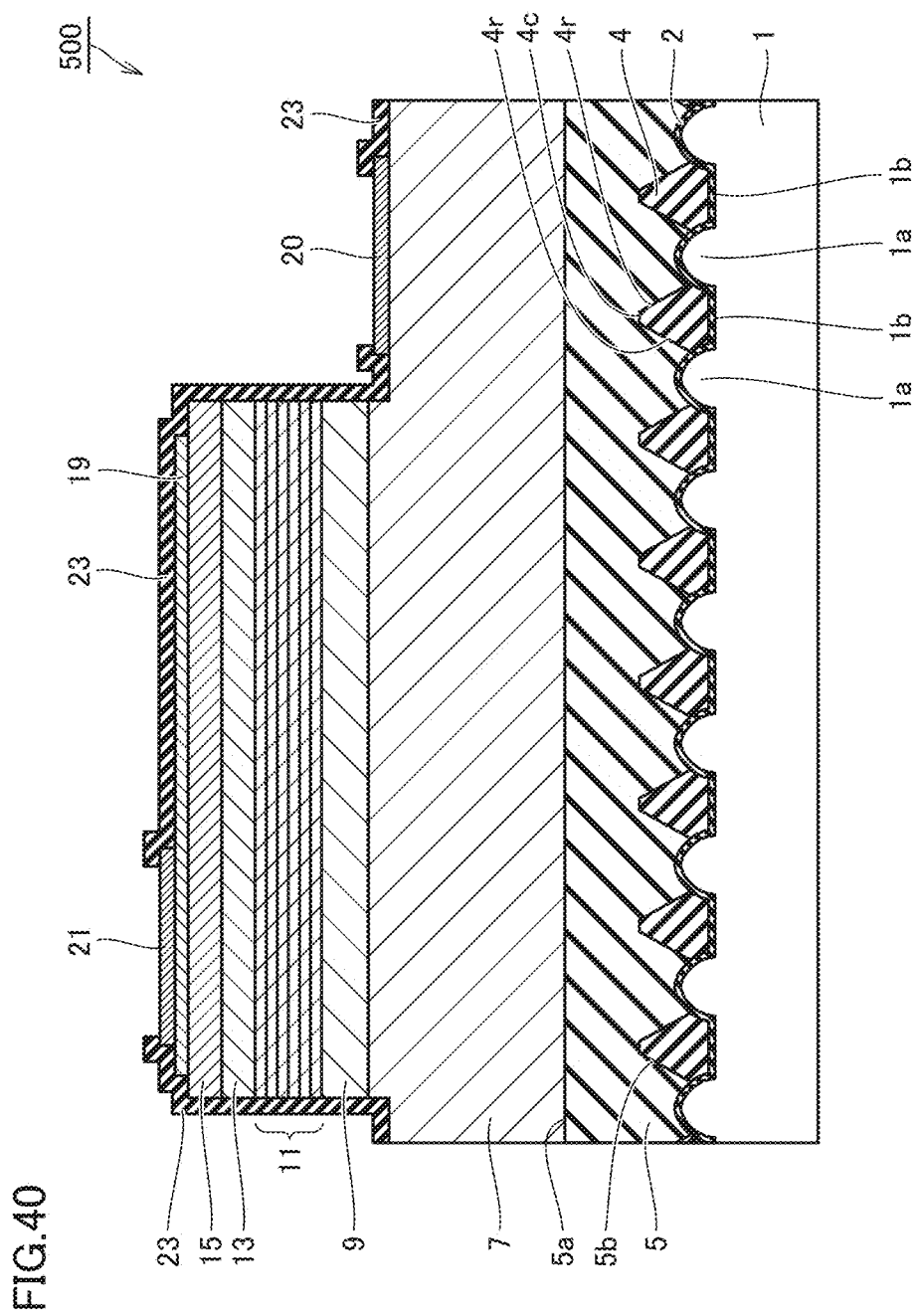
FIG. 40 is a schematic cross-sectional view of a nitride semiconductor light emitting diode element in an embodiment.

Thereafter, as shown in a schematic cross-sectional view in FIG. 40, insulating protection film 23 composed of $SiO_2$ or the like is formed on the entire surface of the stack structure after n-side electrode 20 is formed, an opening is provided in insulating protection film 23 so as to expose p-side electrode 21 and n-side electrode 20, and a wafer on which a plurality of nitride semiconductor light emitting diode elements 500 are formed is divided into individual elements, so that nitride semiconductor light emitting diode element 500 according to Embodiment 3-1 shown in FIG. 40 can be fabricated.

In nitride semiconductor light emitting diode element 500 according to Embodiment 3-1 fabricated as above, n-type nitride semiconductor contact layer 7, n-type nitride semiconductor clad layer 9, nitride semiconductor active layer 11, p-type nitride semiconductor clad layer 13, and p-type nitride semiconductor contact layer 15 are stacked in this order on upper surface 5a of second nitride semiconductor underlying layer 5 having high crystallinity and high flatness on the surface of first nitride semiconductor underlying layer 4 which is a continuous film having high uniformity and continuous surfaces.

Therefore, n-type nitride semiconductor contact layer 7, n-type nitride semiconductor clad layer 9, nitride semiconductor active layer 11, p-type nitride semiconductor clad layer 13, and p-type nitride semiconductor contact layer 15 stacked on flat upper surface 5a of second nitride semiconductor underlying layer 5 having few crystal defects and high crystallinity are low in dislocation density and excellent in crystallinity.

Thus, nitride semiconductor light emitting diode element 500 according to Embodiment 3-1 formed of such a nitride semiconductor layer having excellent crystallinity is an element low in operation voltage and high in emission output.

It is noted that nitride semiconductor light emitting diode element 500 fabricated under the conditions in case 3-1 was adopted as a bare chip (not sealed with resin as will be described later) evaluation element, and a current of 30 mA was fed to 10 elements. Then, it was confirmed that an element low in operation voltage and high in emission output, which achieved light output of 39 mW, an operation voltage of 3.0 V, and an emission wavelength of 455 nm on average, was obtained.

Figure 41:
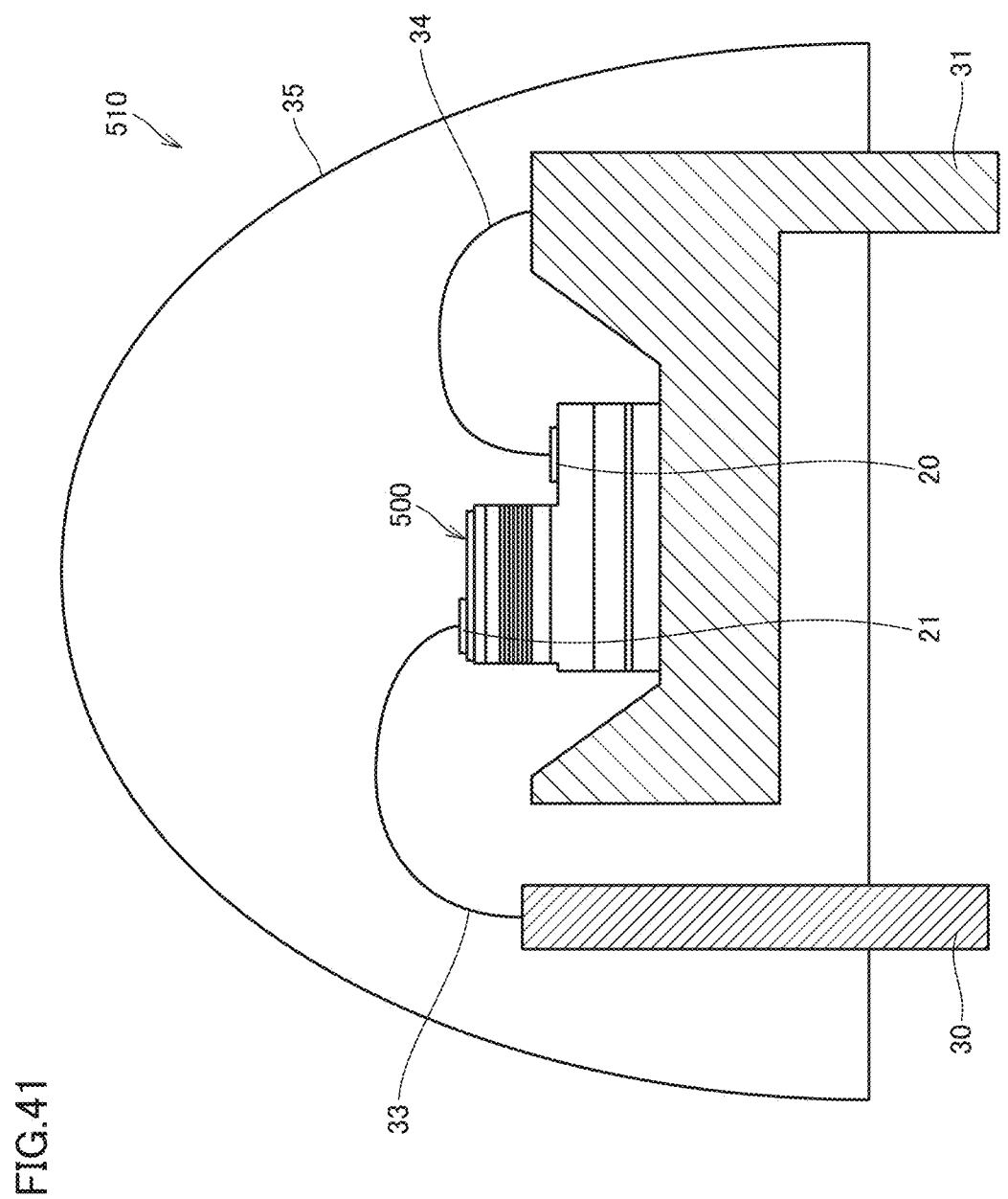
FIG. 41 is a schematic cross-sectional view of a light emitting device in an embodiment.

A light emitting device 510 according to Embodiment 3-1 having a construction shown in FIG. 41 may be manufactured by using nitride semiconductor light emitting diode element 500 according to Embodiment 3-1.

Here, in light emitting device 510 according to Embodiment 3-1, for example, nitride semiconductor light emitting diode element 500 according to Embodiment 3-1 is set on second lead frame 31, p-side electrode 21 of nitride semiconductor light emitting diode element 500 and first lead frame 30 are electrically connected to each other through first wire 33, and n-side electrode 20 of nitride semiconductor light emitting diode element 500 and second lead frame 31 are electrically connected to each other through second wire 34. Then, by molding nitride semiconductor light emitting diode element 500 with transparent molding resin 35, light emitting device 510 in a shape of a cannonball can be manufactured.

Since light emitting device 510 according to Embodiment 3-1 having the construction shown in FIG. 41 includes nitride semiconductor light emitting diode element 500 according to Embodiment 3-1, a light emitting device low in operation voltage and high in emission output can be obtained.

Embodiment 3-2

Embodiment 3-2 is characterized by being directed to a nitride semiconductor transistor element which is an electronic device including the nitride semiconductor structure manufactured according to Embodiment 3-1 (a stack structure of substrate 1, nitride semiconductor intermediate layer 2, first nitride semiconductor underlying layer 4, and second nitride semiconductor underlying layer 5).

Figure 42:
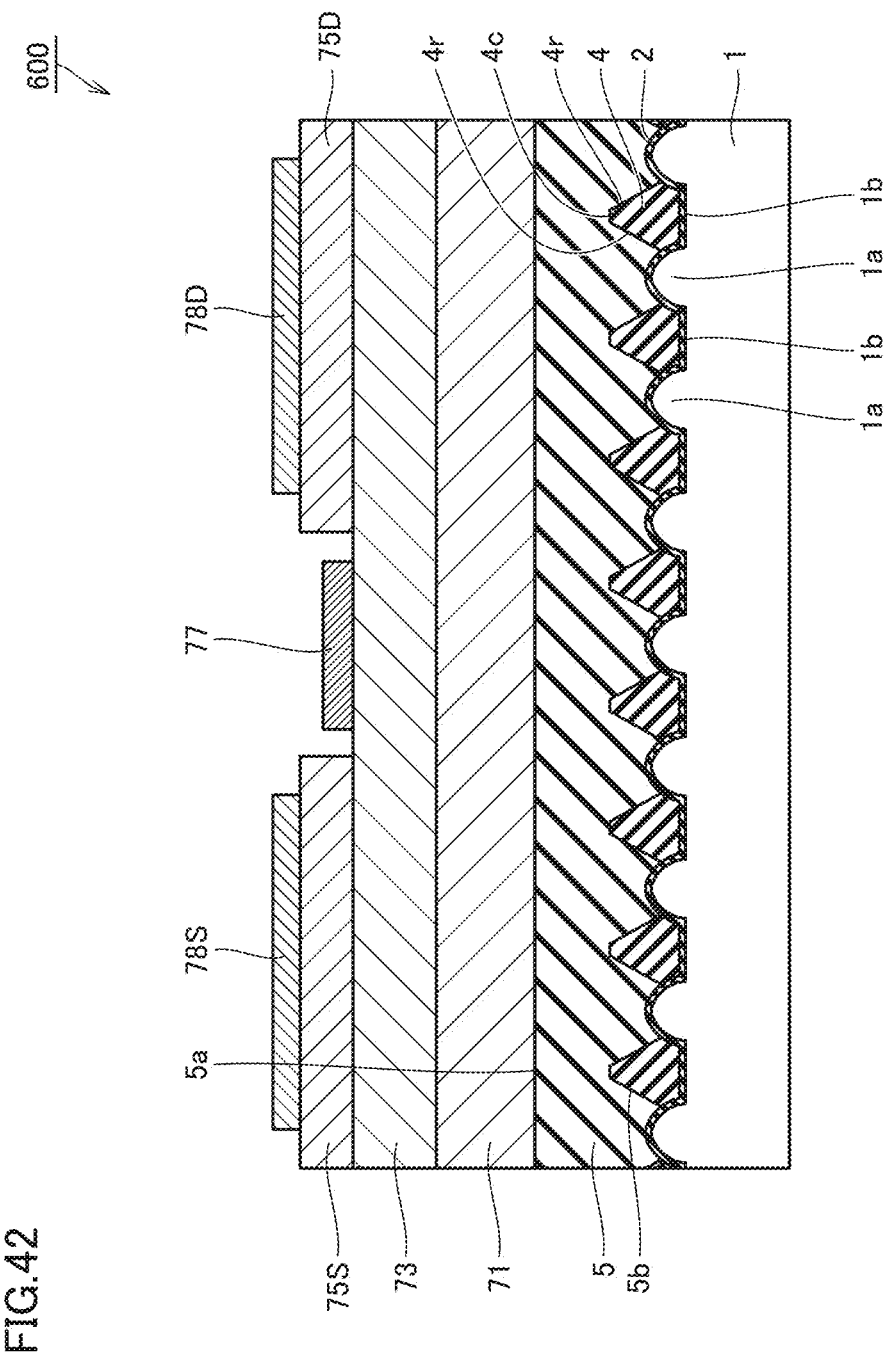
FIG. 42 is a schematic cross-sectional view of a nitride semiconductor transistor element in an embodiment.

FIG. 42 shows a schematic cross-sectional view of a nitride semiconductor transistor element 600 according to Embodiment 3-2. Nitride semiconductor transistor element 600 has a nitride semiconductor structure constituted of substrate 1 formed of a sapphire substrate having a c plane as a main surface, in which projection portions 1a are arranged in three equivalent directions of the a (sub) axis, as well as nitride semiconductor intermediate layer 2 composed of AlN or the like, first nitride semiconductor underlying layer 4 composed of undoped GaN or the like, and second nitride semiconductor underlying layer 5 composed of undoped GaN or the like, which are successively stacked on the surface of substrate 1.

Then, nitride semiconductor electron transit layer 71 composed of undoped GaN or the like is stacked on flat upper surface 5a of second nitride semiconductor underlying layer 5 having few crystal defects and good crystallinity, and n-type nitride semiconductor electron supply layer 73 composed of n-type AlGaN or the like is stacked on the surface of nitride semiconductor electron transit layer 71.

Gate electrode 77 is provided on the surface of n-type nitride semiconductor electron supply layer 73, and source contact layer 75S and drain contact layer 75D composed of n-type GaN or the like are provided on respective opposing sides of gate electrode 77. In addition, source electrode 78S is provided on source contact layer 75S, and drain electrode 78D is provided on drain contact layer 75D.

One example of a method of manufacturing nitride semiconductor transistor element 600 according to Embodiment 3-2 will be described below. Initially, as in Embodiment 3-1, nitride semiconductor intermediate layer 2 composed of AlN is formed with reactive sputtering on the surface of substrate 1 having projection portions 1a and recess portions 1b.

Then, with MOCVD under the conditions the same as in Embodiment 3-1, first nitride semiconductor underlying layer 4 composed of undoped GaN is grown on the surface of nitride semiconductor intermediate layer 2. Here, first nitride semiconductor underlying layer 4 is grown under such conditions that two first oblique facet planes 4r which appear in the direction of the a (sub) axis and two first oblique facet planes 4r which appear in each of the direction inclined by an angle of +60° with respect to the direction of the a (sub) axis and the direction inclined by an angle of −60° with respect to the direction of the a (sub) axis appear (for example, the conditions in case 3-1).

Then, second nitride semiconductor underlying layer 5 composed of undoped GaN is grown on the surface of first nitride semiconductor underlying layer 4 with MOCVD under the conditions the same as in Embodiment 1. Here, second nitride semiconductor underlying layer 5 is grown under such conditions that first oblique facet plane 4r of first nitride semiconductor underlying layer 4 is buried and substantially flat upper surface 5a appears.

Then, with MOCVD, nitride semiconductor electron transit layer 71 composed of n-type $Al_xGa_{1-x}N$ is stacked on substantially flat upper surface 5a of second nitride semiconductor underlying layer 5 and n-type nitride semiconductor electron supply layer 73 is stacked on the surface of nitride semiconductor electron transit layer 71.

Thereafter, as shown in FIG. 42, after source contact layer 75S and drain contact layer 75D are formed on the surface of n-type nitride semiconductor electron supply layer 73, source electrode 78S, drain electrode 78D, and gate electrode 77 are each formed. Nitride semiconductor transistor element 600 according to Embodiment 3-2 can be fabricated as above.

In nitride semiconductor transistor element 600 according to Embodiment 3-2 as well, as in Embodiment 3-1, nitride semiconductor layers such as nitride semiconductor electron transit layer 71 and n-type nitride semiconductor electron supply layer 73 are stacked on upper surface 5a of second nitride semiconductor underlying layer 5 having high crystallinity and high flatness on the surface of first nitride semiconductor underlying layer 4 which is a continuous film having high uniformity and continuous surfaces. Thus, since crystal defects in a two-dimensional electron transit region at an uppermost surface of nitride semiconductor electron transit layer 71 are decreased in particular, electron mobility can be improved.

Therefore, in nitride semiconductor transistor element 600 according to Embodiment 3-2 as well, each layer stacked on the surface of nitride semiconductor intermediate layer 2 can be a layer low in dislocation density and excellent in crystallinity, and hence an element achieving improved characteristics such as electron mobility can be obtained.

As above, according to the present embodiment, by forming the surface of first nitride semiconductor underlying layer 4 which is a continuous film having high uniformity and continuous surfaces on substrate 1 having projection portions 1a and recess portions 1b, upper surface 5a of second nitride semiconductor underlying layer 5 having high crystallinity and high flatness is obtained. Thus, while occurrence of breakage and crack of a wafer during growth with MOCVD of a nitride semiconductor layer stacked on such upper surface 5a of second nitride semiconductor underlying layer 5 and in subsequent processes is suppressed, crystallinity expressed with an X-ray half width or the like of a nitride semiconductor layer can be improved and defect density expressed with the CL method, EPD, or the like can be lowered. Therefore, a nitride semiconductor element achieving improved device characteristics represented by emission efficiency, electron mobility, and the like and a nitride semiconductor structure serving as a basis for the nitride semiconductor element can be provided.

It is noted that description other than the above in Embodiments 3-1 and 3-2 is the same as that in Embodiments 1-1, 1-2, 2-1, and 2-2 and hence description thereof will not be provided.

EXAMPLES

Experimental Example 1

Initially, a substrate having a diameter of 4 inches and a thickness of 0.9 mm and composed of sapphire single crystal was prepared. Then, a mask defining two-dimensional arrangement of projection portions shown in FIG. 3 was formed on that substrate, and the surface of the substrate was dry-etched with the use of the mask, to thereby form recess portions in two-dimensional arrangement shown in FIG. 3.

Thus, the projection portions at the surface of the substrate were arranged in the direction of the a (sub) axis (<11-20> direction) of the surface of the substrate and arranged in the direction inclined by +60° with respect to the direction of the a (sub) axis of the surface of the substrate and in the direction inclined by −60° with respect to the direction of the a (sub) axis of the surface of the substrate. Here, in the plan view of the surface of the substrate, the projection portions were located at respective vertices of virtual triangle 1t shown in FIG. 3 and periodically arranged in a direction of each side of three sides of the virtual triangle. In addition, a two-dimensional shape at a bottom surface of the projection portion was annular. Moreover, in the plan view of the surface of the substrate, an interval between adjacent projection portions was 2 μm, a diameter of an annular circle which was the two-dimensional shape at the bottom surface of the projection portion was approximately 1.2 μm, and a height of the projection portion was approximately 0.6 μm. Furthermore, the projection portion and the recess portion at the surface of the substrate each had a cross-section shown in FIG. 4, and the projection portion had a tip end portion.

Then, the surface of the substrate after the projection portions and the recess portions were formed was subjected to RCA cleaning. Then, the substrate subjected to RCA cleaning above was set in a chamber, $N_2$ and Ar were introduced, the substrate was heated to 650° C., and a nitride semiconductor intermediate layer having a thickness of 25 nm and composed of AlN crystal made of an aggregate of column crystals uniform in crystal grain extending in a direction of the normal of the surface of the substrate was formed on the surface of the substrate having the projection portions and the recess portions with reactive sputtering with which an Al target was sputtered in a mixed atmosphere of $N_2$ and Ar.

Six wafers on which layers up to the nitride semiconductor intermediate layer were formed as above were prepared as wafers of respective Samples 1 to 6. Then, the wafers of Samples 1 to 6 were each set in the MOCVD apparatus, in the MOCVD apparatus, an ammonia gas was supplied as a group V source material gas and TMG (trimethylgallium) was supplied as a group III source material gas, and a third nitride semiconductor underlying layer composed of undoped GaN crystal and having a thickness of 300 nm was grown with MOCVD under such conditions as a growth temperature (a temperature of a substrate during growth), a growth time period, a growth pressure (a pressure in the MOCVD apparatus during growth), and a V/III ratio (the number of moles of a group V source material gas supplied per unit time/the number of moles of a group III source material gas supplied per unit time) shown in Table 1 below. Here, TMG was supplied into the MOCVD apparatus such that a rate of growth of the third nitride semiconductor underlying layer attained approximately to 2 to 3 μm/h.

Then, the surface of the third nitride semiconductor underlying layer grown on the surface of each of the wafers of Samples 1 to 6 was observed with an SEM (Scanning Electron Microscope). FIGS. 43 to 48 show SEM images of the third nitride semiconductor underlying layers on the surfaces of the wafers of Samples 1 to 6, respectively.

A growth parameter controlling a mode of growth of the third nitride semiconductor underlying layer includes a growth temperature, a growth pressure, a V/III ratio, and the like, and among these, a growth parameter mainly controlling the growth mode is considered as a growth temperature. Therefore, change in mode of growth of the third nitride semiconductor underlying layer at the time when a temperature for growth of the third nitride semiconductor underlying layer was changed will be described in further detail below.

TABLE 1

Figure 43:
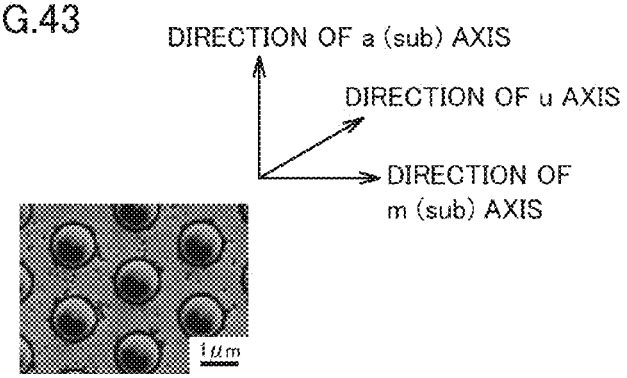
FIG. 43 shows an SEM image of a surface of a third nitride semiconductor underlying layer grown on a surface of a wafer of Sample 1.
Figure 44:
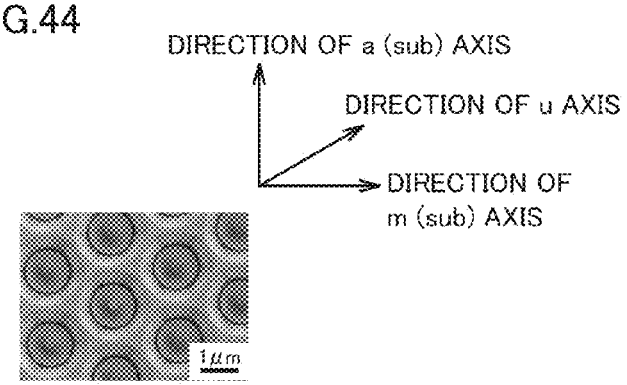
FIG. 44 shows an SEM image of a surface of a third nitride semiconductor underlying layer grown on a surface of a wafer of Sample 2.
Figure 45:
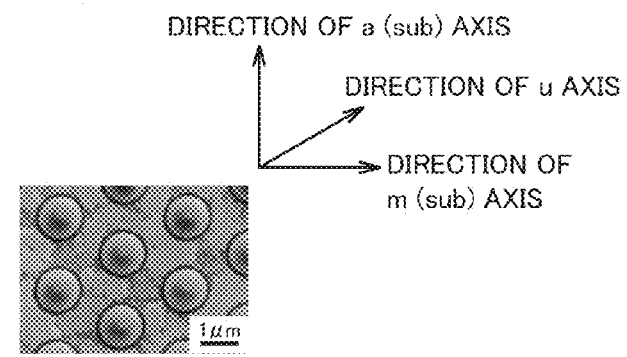
FIG. 45 shows an SEM image of a surface of a third nitride semiconductor underlying layer grown on a surface of a wafer of Sample 3.
Figure 46:
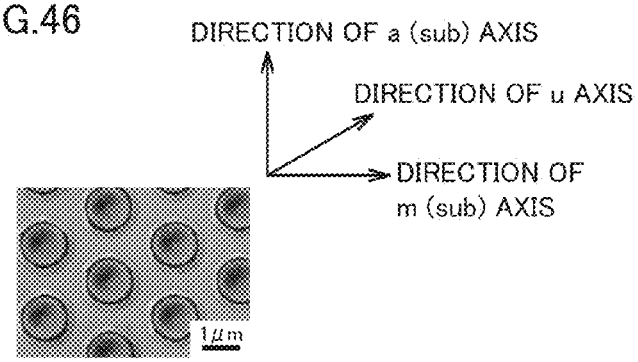
FIG. 46 shows an SEM image of a surface of a third nitride semiconductor underlying layer grown on a surface of a wafer of Sample 4.
Figure 47:
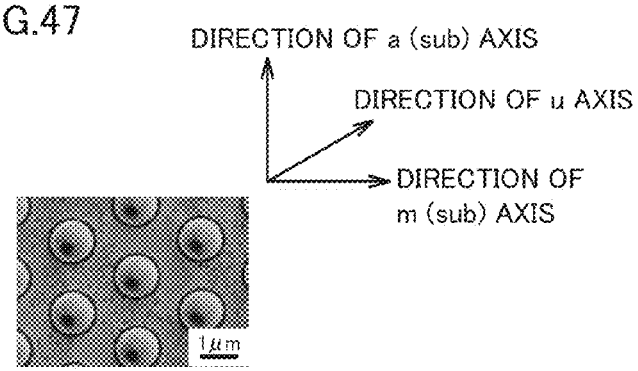
FIG. 47 shows an SEM image of a surface of a third nitride semiconductor underlying layer grown on a surface of a wafer of Sample 5.
Figure 48:
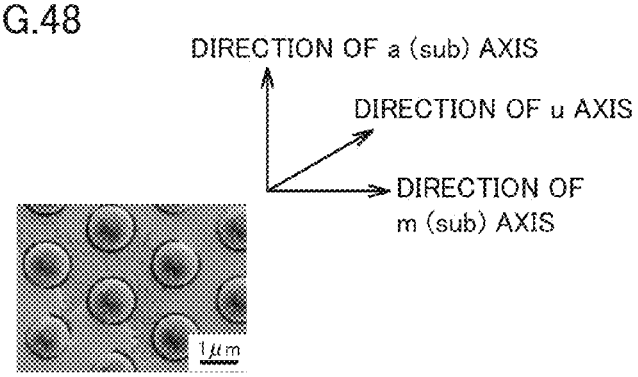
FIG. 48 shows an SEM image of a surface of a third nitride semiconductor underlying layer grown on a surface of a wafer of Sample 6.

| | Growth Temperature [° C.] | Growth Time Period [minute] | Growth Pressure [kPa] | V/III Ratio | SEM Image |
|---|---|---|---|---|---|
| Sample 1 | 960 | 1 | 66.7 | 1165 | FIG. 43 |
| Sample 2 | 960 | 5 | 66.7 | 1165 | FIG. 44 |
| Sample 3 | 1050 | 1 | 66.7 | 1165 | FIG. 45 |
| Sample 4 | 1050 | 5 | 66.7 | 1165 | FIG. 46 |
| Sample 5 | 1100 | 1 | 66.7 | 1165 | FIG. 47 |
| Sample 6 | 1100 | 5 | 66.7 | 1165 | FIG. 48 |

(1) Case where Growth Temperature was Set to 960° C.

First, a mode of growth of a third nitride semiconductor underlying layer in a case where a growth temperature was set to 960° C. was discussed.

Initially, it can be seen based on comparison of FIG. 43 with FIGS. 45 and 47 that, in the case where a growth time period was set to 1 minute, a uniform third nitride semiconductor layer was likely to be formed in a region on the recess portion at the surface of the substrate when a growth temperature was set to 960° C., which was the lowest.

Then, it is clear from FIG. 44 that, in the case where a growth time period was set to 5 minutes, a third oblique facet plane of the third nitride semiconductor underlying layer was formed to surround an outer circumference of the projection portion of the substrate.

As shown in FIGS. 43 and 44, it was also confirmed that the recess portion at the substrate was covered with a third flat region of the third nitride semiconductor underlying layer and the third oblique facet plane of the third nitride semiconductor underlying layer, and a ratio of area of the third flat region at the surface of the third nitride semiconductor underlying layer was higher than a ratio of area of a first oblique facet plane. In addition, as shown in FIGS. 43 and 44, it was also confirmed that substantially no third nitride semiconductor underlying layer was formed on the projection portion of the substrate.

From the foregoing, it was confirmed that the mode of growth of the third nitride semiconductor underlying layer on the surface of each of the wafers of Samples 1 and 2 was the three-dimensional growth mode.

Thereafter, after a first nitride semiconductor underlying layer composed of undoped GaN crystal and having a thickness of 1400 nm was grown in the three-dimensional mode on the surface of the third nitride semiconductor underlying layer shown in each of FIGS. 43 and 44, a second nitride semiconductor underlying layer constituted of a lower layer composed of undoped GaN crystal and having a thickness of 4000 nm and an upper layer composed of n-type GaN crystal doped with Si and having a thickness of 3000 nm was grown in the two-dimensional growth mode on the surface of the first nitride semiconductor underlying layer. It is noted that a silane gas was employed as an n-type dopant gas used during growth of the upper layer.

It is noted that relation among a growth temperature, a growth pressure, and a V/III ratio during growth of each of the third nitride semiconductor underlying layer, the first nitride semiconductor underlying layer, and the second nitride semiconductor underlying layer was as follows.

Growth temperature: Second nitride semiconductor underlying layer>Third nitride semiconductor underlying layer>First nitride semiconductor underlying layer Growth Pressure: Second nitride semiconductor underlying layer<Third nitride semiconductor underlying layer<First nitride semiconductor underlying layer V/III ratio: Second nitride semiconductor underlying layer<Third nitride semiconductor underlying layer<First nitride semiconductor underlying layer Crystallinity of the upper surface of the second nitride semiconductor underlying layer grown as described above was evaluated by measuring a half width of an X-ray rocking curve (XRC). Specifically, a half width (arcsec) of XRC at the GaN (004) plane at the upper surface of the second nitride semiconductor underlying layer was 30 to 40 arcsec and a half width of XRC at a GaN (102) plane was 110 to 120 arcsec, and it could be confirmed that crystallinity improved as compared with the conventional example.

In addition, crystal defect density at the upper surface of the second nitride semiconductor underlying layer was evaluated with the CL method, EPD, or the like, and it could also be confirmed that defect density lowered as compared with the conventional example. Specifically, dark spot density obtained with the CL method and indicating crystal defect density at the upper surface of the second nitride semiconductor underlying layer was not higher than $2 \times 10^8$ cm$^{-3}$.

(2) Case where Growth Temperature was Set to 1050° C.

Then, a mode of growth of a third nitride semiconductor underlying layer in a case where a growth temperature was set to 1050° C. was discussed.

Initially, it can be seen that, in the case of a growth time period was set to 1 minute, as shown in FIG. 45, a third flat region and a rough surface having many pits (a rough surface region) are both present at the surface of the third nitride semiconductor underlying layer in the region on the recess portion at the surface of the substrate.

Then, it can be seen that, in the case where a growth time period was set to 5 minutes, as shown in FIG. 46, substantially the entire surface of the recess portion at the substrate was uniformly covered with the third flat region of the third nitride semiconductor underlying layer and the third oblique facet plane was slightly formed around the projection portion of the substrate.

Here, it can be seen that growth of the third nitride semiconductor underlying layer proceeded selectively from the recess portion at the substrate, substantially the entire region on the recess portion at the substrate was uniformly covered with the third flat region of the third nitride semiconductor underlying layer at the time point of lapse of 5 minutes since start of growth of the third nitride semiconductor underlying layer, and the third oblique facet plane was slightly formed around the projection portion at the substrate.

Crystallinity of the upper surface of the second nitride semiconductor underlying layer grown as described above was evaluated by measuring a half width of XRC. Specifically, a half width (arcsec) of XRC at the GaN (004) plane at the upper surface of the second nitride semiconductor underlying layer was 30 to 40 arcsec and a half width of XRC at the GaN (102) plane was 110 to 120 arcsec, and it could be confirmed that crystallinity improved as compared with the conventional example.

In addition, crystal defect density at the upper surface of the second nitride semiconductor underlying layer was evaluated with the CL method, EPD, or the like, and it could also be confirmed that defect density lowered as compared with the conventional example. Specifically, dark spot density obtained with the CL method and indicating crystal defect density at the upper surface of the second nitride semiconductor underlying layer was not higher than $2 \times 10^8$ cm$^{-3}$.

Furthermore, warpage of the wafer after the third nitride semiconductor underlying layer was formed was approximately from 100 to 110 μm, and no crack was caused in the wafer surface as far as second nitride semiconductor underlying layer 5.

(3) Case where Growth Temperature was Set to 1100° C.

A mode of growth of a third nitride semiconductor underlying layer in a case where a growth temperature was set to 1100° C. was further discussed.

Initially, it can be seen that, in the case of a growth time period was set to 1 minute, as shown in FIG. 47, a third flat region and a rough surface having many pits (a rough surface region) are both present at the surface of the third nitride semiconductor underlying layer in the region on the recess portion at the surface of the substrate.

Then, it can be seen that, in the case where a growth time period was set to 5 minutes as well, as shown in FIG. 48, as in FIG. 47 where the growth time period was set to 1 minute, a third flat region and a rough surface having many pits (a rough surface region) are both present at the surface of the third nitride semiconductor underlying layer in the region on the recess portion at the surface of the substrate.

Crystallinity of the upper surface of the second nitride semiconductor underlying layer grown as described above was evaluated by measuring a half width of XRC. Specifically, a half width (arcsec) of XRC at the GaN (004) plane at the upper surface of the second nitride semiconductor underlying layer was 40 to 50 arcsec and a half width of XRC at the GaN (102) plane was 110 to 120 arcsec.

In addition, crystal defect density at the upper surface of the second nitride semiconductor underlying layer was evaluated with the CL method, EPD, or the like, and it could also be confirmed that defect density lowered as compared with the conventional example. Specifically, dark spot density obtained with the CL method and indicating crystal defect density at the upper surface of the second nitride semiconductor underlying layer was not higher than $3 \times 10^8$ cm$^{-3}$.

Furthermore, warpage of the wafer after the third nitride semiconductor underlying layer was formed was approximately 120 μm.

(4) Second Nitride Semiconductor Underlying Layer

The second nitride semiconductor underlying layer was grown in the three-dimensional growth mode on the surface of the first nitride semiconductor underlying layer shown in FIG. 46.

When the surface of the first nitride semiconductor underlying layer was observed, the first nitride semiconductor underlying layer had 6 first oblique facet planes surrounding the projection portion on the outer side of the projection portion of the substrate. Here, as in the plan view shown in FIG. 33, two first oblique facet planes appeared in the direction of the a (sub) axis, and two oblique facet planes appeared in each of the direction inclined by an angle of +60° with respect to the direction of the a (sub) axis and the direction inclined by an angle of −60° with respect to the direction of the a (sub) axis (both of which were the u direction).

In addition, the first oblique facet plane had a cross-section as shown in FIG. 34, and it was a plane which similarly appeared also in a direction of depth of the cross-section shown in FIG. 34, in a range where the first oblique facet planes were present. Moreover, one first oblique facet plane surrounding the projection portion and another first oblique facet plane surrounding the projection portion were coupled to each other at the first flat region of the first nitride semiconductor underlying layer.

Here, a direction of inclination of 6 first oblique facet planes surrounding the projection portion around the outer circumference of the projection portion extended obliquely upward from an outer circumferential surface of the projection portion.

Specifically, among the 6 first oblique facet planes, in the plan view of the surface of the first nitride semiconductor underlying layer, two first oblique facet planes which appeared in the direction of the a (sub) axis were inclined obliquely upward with respect to the direction of the a (sub) axis (<11-20> direction), and the facet plane extended in that direction of inclination.

In addition, similarly, in the plan view of the surface of the first nitride semiconductor underlying layer, two first oblique facet planes which appeared in each of the direction inclined by the angle of +60° with respect to the direction of the a (sub) axis and the direction inclined by the angle of −60° with respect to the direction of the a (sub) axis were also inclined obliquely upward with respect to the direction inclined by the angle of +60° with respect to the direction of the a (sub) axis and the direction inclined by the angle of −60° with respect to the direction of the a (sub) axis, and the facet plane extended in that direction of inclination.

(5) Third Nitride Semiconductor Underlying Layer

Furthermore, a second nitride semiconductor underlying layer constituted of a lower layer composed of undoped GaN crystal and having a thickness of 4000 nm and an upper layer composed of n-type GaN crystal doped with Si and having a thickness of 3000 nm was grown in the two-dimensional mode on the surface of the first nitride semiconductor underlying layer above. It is noted that a silane gas was employed as the n-type dopant gas used during growth of the upper layer.

Then, a growth temperature of the third nitride semiconductor underlying layer was denoted as $T_1$, and relation with characteristics of the second nitride semiconductor underlying layer was examined.

Figure 49:
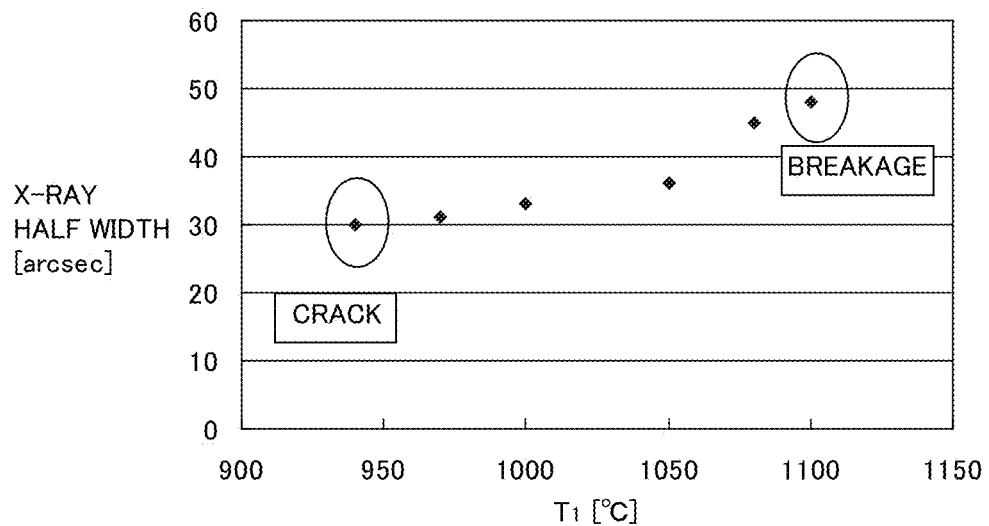
FIG. 49 is a diagram showing relation between a growth temperature $T_1$ of a third nitride semiconductor underlying layer and a half width (arcsec) of XRC at a GaN (004) plane which is an upper surface of a second nitride semiconductor underlying layer.

FIG. 49 shows relation between $T_1$ and a half width (arcsec) of XRC at the GaN (004) plane which is the upper surface of the second nitride semiconductor underlying layer. The abscissa in FIG. 49 represents $T_1$ (° C.) and the ordinate in FIG. 49 represents a half width (arcsec) of XRC at the GaN (004) plane of the upper surface of the second nitride semiconductor underlying layer.

Figure 50:
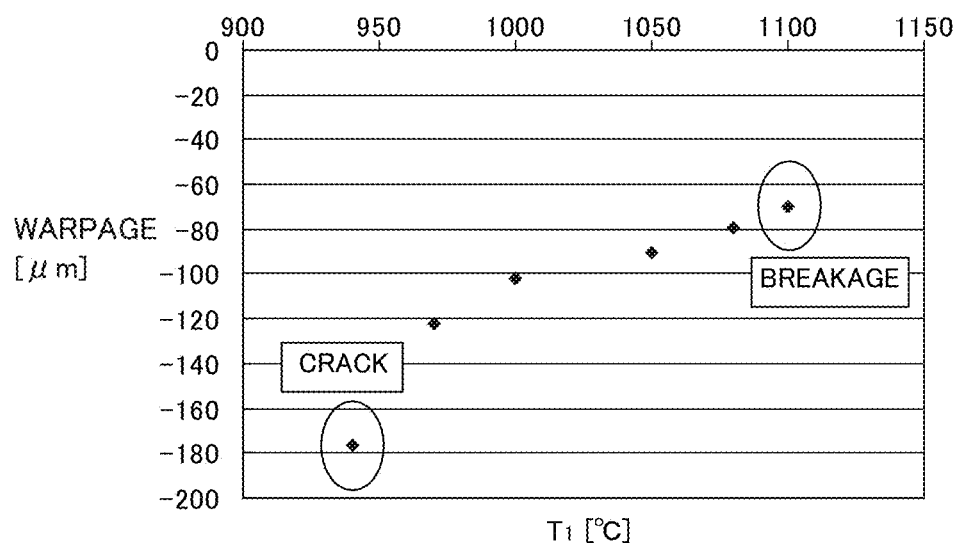
FIG. 50 is a diagram showing relation between a growth temperature $T_1$ (° C.) of a third nitride semiconductor underlying layer and warpage (μm) of a wafer during growth of a second nitride semiconductor underlying layer.

FIG. 50 shows relation between $T_1$ (° C.) and warpage (μm) of a wafer during growth of the second nitride semiconductor underlying layer. Here, warpage of a wafer during growth refers to warpage of a wafer immediately before end of growth of the second nitride semiconductor underlying layer. The abscissa in FIG. 50 represents $T_1$ (° C.) and the ordinate in FIG. 50 represents warpage (μM) of a wafer.

As shown in FIGS. 49 and 50, when $T_1$ is as low as 940° C., a crack was caused in a film at the surface of the wafer in some cases. Data indicated with "crack" in FIGS. 49 and 50 expresses this fact. On the other hand, when T1 is as high as 1100° C., a wafer broke in some cases during or after growth. Data indicated with "breakage" in FIGS. 49 and 50 expresses this fact.

In addition, as shown in FIG. 49, as $T_1$ is lower, tendency that a half width of XRC decreases and the second nitride semiconductor underlying layer having few crystal defects and a good surface is obtained is observed.

Moreover, as shown in FIG. 50, when $T_1$ is too low, warpage during growth of the second nitride semiconductor underlying layer increases. This is estimated as a cause of crack in the second nitride semiconductor underlying layer. On the other hand, when $T_1$ is too high, as shown in FIG. 15, third flat region 3c and rough surface region 3d rougher than third flat region 3c are likely to be present together at the surface of third nitride semiconductor underlying layer 3 in the region on the recess portion. Therefore, when first nitride semiconductor underlying layer 4 is grown on the surface of this rough surface region 3d, the surface of first nitride semiconductor underlying layer 4 is more likely to be a greater rough surface, and in second nitride semiconductor underlying layer 5 grown further thereon, homogenous film quality is less likely to be obtained in a substrate plane and additionally the surface does not tend to be flat. This is estimated as a cause of likeliness of breakage of the third nitride semiconductor underlying layer during or after growth.

Therefore, by setting $T_1$ to such an extent as preventing crack in a wafer, a film of good quality, which has excellent crystallinity expressed with a half-width of XRC, is obtained for the second nitride semiconductor underlying layer.

Setting $T_1$ to an appropriate value, for example, around 1050° C. and setting a temperature $T_2$ for growing the first nitride semiconductor underlying layer to an appropriate value, for example, around 1000° C., correspond to switching the mode of growth of the first nitride semiconductor underlying layer from the "2.5 dimensional growth mode" which is the mode of growth of the third nitride semiconductor underlying layer as described above to the "three-dimensional growth mode." Therefore, it is considered that an equivalent effect is obtained also by changing a growth pressure and a V/III ratio which are parameters other than a growth temperature.

One example of each of growth parameters including (α) a growth temperature, (β) a growth pressure, and (γ) a V/III ratio during growth of each of the third nitride semiconductor underlying layer, the first nitride semiconductor underlying layer, and the second nitride semiconductor underlying layer is shown. Then, Table 2 shows relation between a value set as a growth parameter and a mode of growth of a nitride semiconductor underlying layer.

(α) Growth temperature: The third nitride semiconductor underlying layer is grown in the 2.5 dimensional growth mode in which the third flat region which is a flat surface and the third oblique facet plane simultaneously appear, for example, at a growth temperature of 1050° C. Then, the first nitride semiconductor underlying layer is grown in the three-dimensional growth mode in which the first oblique facet plane mainly appears, for example, with a growth temperature being lowered to 960° C. Furthermore, the second nitride semiconductor underlying layer is grown in the two-dimensional growth mode in which the first oblique facet plane is buried and a flat upper surface appears, for example, with a growth temperature being raised to 1080° C.

(β) Growth Pressure: The third nitride semiconductor underlying layer is grown in the 2.5 dimensional growth mode in which the third flat region which is a flat surface and the third oblique facet plane simultaneously appear, for example, at a growth pressure of 350 Torr (46.7 kPa). Then, the first nitride semiconductor underlying layer is grown in the three-dimensional growth mode in which the first oblique facet plane mainly appears, for example, with a growth pressure being raised to a pressure of 500 Torr (66.7 kPa). Furthermore, the second nitride semiconductor underlying layer is grown in the two-dimensional growth mode in which the first oblique facet plane is buried and a flat upper surface appears, for example, with a growth pressure being lowered to a pressure of 200 Torr (26.7 kPa).

(γ) V/III ratio: The third nitride semiconductor underlying layer is grown in the 2.5 dimensional growth mode in which the third flat region which is a flat surface and the third oblique facet plane simultaneously appear, for example, at a V/III ratio of 920. Then, the first nitride semiconductor underlying layer is grown in the three-dimensional growth mode in which the first oblique facet plane mainly appears, for example, with a V/III ratio being raised to 1165. Furthermore, the second nitride semiconductor underlying layer is grown in the two-dimensional growth mode in which the first oblique facet plane is buried and a flat upper surface appears, for example, with a V/III ratio being lowered to 676.

TABLE 2

| Growth Parameter | Third Nitride Semiconductor Underlying Layer | First Nitride Semiconductor Underlying Layer | Second Nitride Semiconductor Underlying Layer |
| --- | --- | --- | --- |
| Growth Temperature [° C.] | 1050 | 960 | 1080 |
| Growth Pressure [kPa] | 46.7 | 66.7 | 26.7 |
| V/III Ratio | 920 | 1165 | 676 |
| Growth Mode | 2.5 Dimensional Growth Mode | Three-Dimensional Growth Mode | Two-Dimensional Growth Mode |

Relation between a growth parameter and a growth mode described above is by way of example, and a growth mode may be different depending on combination of conditions and apparatus dependency.

Experimental Example 2

Example 1

Initially, a substrate having a diameter of 4 inches and a thickness of 0.9 mm and composed of sapphire single crystal was prepared. Then, a mask defining two-dimensional arrangement of projection portions shown in FIG. 3 was formed on that substrate, and the surface of the substrate was dry-etched with the use of the mask, to thereby form recess portions in two-dimensional arrangement shown in FIG. 3.

Thus, the projection portions at the surface of the substrate were arranged in the direction of the a (sub) axis (<11-20> direction) of the surface of the substrate and arranged in the direction inclined by +60° with respect to the direction of the a (sub) axis of the surface of the substrate and in the direction inclined by −60° with respect to the direction of the a (sub) axis of the surface of the substrate. Here, in the plan view of the surface of the substrate, the projection portions were located at respective vertices of virtual triangle 1t shown in FIG. 3 and periodically arranged in a direction of each side of three sides of the virtual triangle. In addition, a two-dimensional shape at the bottom surface of the projection portion was annular. Moreover, in the plan view of the surface of the substrate, an interval between adjacent projection portions was 2 μm, a diameter of an annular circle which is the two-dimensional shape at the bottom surface of the projection portion was approximately 1.2 μm, and a height of the projection portion was approximately 0.6 μm. Furthermore, the projection portion and the recess portion at the surface of the substrate each had a cross-section shown in FIG. 4, and the projection portion had a tip end portion.

Then, the surface of the substrate after the projection portions and the recess portions were formed was subjected to RCA cleaning. Then, the substrate subjected to RCA cleaning above was set in a chamber, $N_2$ and Ar were introduced, the substrate was heated to 650° C., and a nitride semiconductor intermediate layer having a thickness of 25 nm and composed of AlN crystal made of an aggregate of column crystals uniform in crystal grain extending in a direction of the normal of the surface of the substrate was formed on the surface of the substrate having the projection portions and the recess portions with reactive sputtering with which an Al target was sputtered in a mixed atmosphere of $N_2$ and Ar.

A wafer on which layers up to the nitride semiconductor intermediate layer were formed as above was set in the vertical MOCVD apparatus, the substrate of the wafer was rotated at the number of rotations of 600 RPM while a temperature of the substrate of the wafer was heated to 1000° C., and with a pressure of an atmosphere in the vertical MOCVD apparatus being set to 66.6 kPa, a gas mixture of an ammonia gas which was a group V source material gas and TMG (trimethylgallium) which was a group III source material gas was supplied as a source material gas into the vertical MOCVD apparatus and only a hydrogen gas (a flow rate: 129 slm) was supplied as a carrier gas, so that undoped GaN crystal was grown for 25 minutes with MOCVD to thereby form the first nitride semiconductor underlying layer in Example 1 having a thickness of 60 nm.

Figure 51:
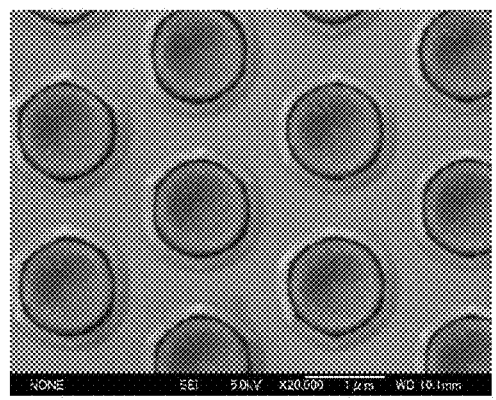
FIG. 51 shows an SEM image of a surface of a first nitride semiconductor underlying layer in an early stage of growth in Example 1.

Here, the source material gas was supplied such that a V/III ratio of the source material gas was set to 1165. It is noted that, since only the hydrogen gas was supplied as the carrier gas, it is clear that the volume ratio of the hydrogen gas to the total volume of the carrier gas during growth of the first nitride semiconductor underlying layer was 1. Then, the surface of the first nitride semiconductor underlying layer in Example 1 was observed with an SEM (Scanning Electron Microscope). FIG. 51 shows an SEM image of the surface of the first nitride semiconductor underlying layer in Example 1 having a thickness of 60 nm.

Thereafter, successively, under the conditions the same as above, undoped GaN crystal was further grown to thereby form the first nitride semiconductor underlying layer in Example 1 having a thickness of 300 nm.

Figure 52:
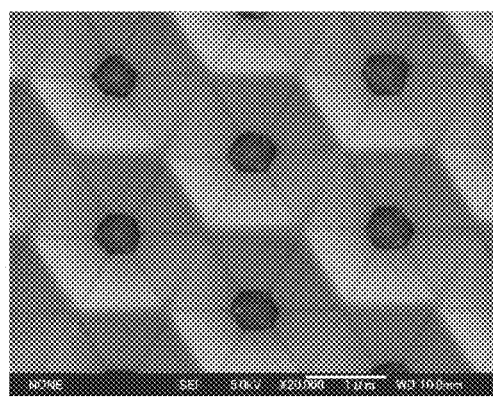
FIG. 52 shows an SEM image of the surface of the first nitride semiconductor underlying layer after growth in Example 1.

Then, the surface of the second nitride semiconductor underlying layer in Example 1 was observed with the SEM. FIG. 52 shows an SEM image of the surface of the second nitride semiconductor underlying layer in Example 1 having a thickness of 300 nm.

Example 2

The first nitride semiconductor underlying layer in Example 2 having a thickness of 60 nm was grown as in Example 1, except that a gas mixture of a hydrogen gas (a flow rate: 129 slm) and a nitrogen gas (a flow rate: 27 slm) was supplied as a carrier gas into the vertical MOCVD apparatus. Here, a volume ratio of the hydrogen gas to the total volume of the carrier gas during growth of the first nitride semiconductor underlying layer in Example 2 was set to 0.83.

Then, the surface of the first nitride semiconductor underlying layer in Example 2 having a thickness of 60 nm was observed with the SEM. Consequently, at the surface of the first nitride semiconductor underlying layer in Example 2 having a thickness of 60 nm as well, an SEM image the same as the SEM image of the surface of the first nitride semiconductor underlying layer in Example 1 having a thickness of 60 nm shown in FIG. 51 was obtained.

Thereafter, successively, under the conditions the same as above, undoped GaN crystal was further grown to thereby form the first nitride semiconductor underlying layer in Example 2 having a thickness of 300 nm.

Then, the surface of the first nitride semiconductor underlying layer in Example 2 having a thickness of 300 nm was observed with the SEM. Consequently, at the surface of the first nitride semiconductor underlying layer in Example 2 having a thickness of 300 nm as well, an SEM image the same as the SEM image of the surface of the first nitride semiconductor underlying layer in Example 1 having a thickness of 300 nm shown in FIG. 52 was obtained.

Example 3

The first nitride semiconductor underlying layer in Example 3 having a thickness of 60 nm was grown as in Example 1, except that a gas mixture of a hydrogen gas (a flow rate: 129 slm) and a nitrogen gas (a flow rate: 54 slm) was supplied as a carrier gas into the vertical MOCVD apparatus. Here, a volume ratio of the hydrogen gas to the total volume of the carrier gas during growth of the first nitride semiconductor underlying layer in Example 3 was set to 0.7.

Then, the surface of the first nitride semiconductor underlying layer in Example 3 having a thickness of 60 nm was observed with the SEM. Consequently, at the surface of the first nitride semiconductor underlying layer in Example 3 having a thickness of 60 nm as well, an SEM image the same as the SEM image of the surface of the first nitride semiconductor underlying layer in Example 3 having a thickness of 60 nm shown in FIG. 51 was obtained.

Thereafter, successively, under the conditions the same as above, undoped GaN crystal was further grown to thereby form the first nitride semiconductor underlying layer in Example 3 having a thickness of 300 nm.

Then, the surface of the first nitride semiconductor underlying layer in Example 3 having a thickness of 300 nm was observed with the SEM. Consequently, at the surface of the first nitride semiconductor underlying layer in Example 3 having a thickness of 300 nm as well, an SEM image the same as the SEM image of the surface of the first nitride semiconductor underlying layer in Example 1 having a thickness of 300 nm shown in FIG. 52 was obtained.

Example 4

The first nitride semiconductor underlying layer in Example 4 having a thickness of 60 nm was grown as in Example 1, except that the number of rotations of the substrate was set to 400 RPM.

Then, the surface of the first nitride semiconductor underlying layer in Example 4 having a thickness of 60 nm was observed with the SEM. Consequently, at the surface of the first nitride semiconductor underlying layer in Example 4 having a thickness of 60 nm as well, an SEM image the same as the SEM image of the surface of the first nitride semiconductor underlying layer in Example 1 having a thickness of 60 nm shown in FIG. 51 was obtained.

Thereafter, successively, under the conditions the same as above, undoped GaN crystal was further grown to thereby form the first nitride semiconductor underlying layer in Example 4 having a thickness of 300 nm.

Then, the surface of the first nitride semiconductor underlying layer in Example 4 having a thickness of 300 nm was observed with the SEM. Consequently, at the surface of the first nitride semiconductor underlying layer in Example 4 having a thickness of 300 nm as well, an SEM image the same as the SEM image of the surface of the first nitride semiconductor underlying layer in Example 1 having a thickness of 300 nm shown in FIG. 52 was obtained.

Example 5

The first nitride semiconductor underlying layer in Example 5 having a thickness of 60 nm was grown as in Example 1, except that the number of rotations of the substrate was set to 1000 RPM.

Then, the surface of the first nitride semiconductor underlying layer in Example 5 having a thickness of 60 nm was observed with the SEM. Consequently, at the surface of the first nitride semiconductor underlying layer in Example 5 having a thickness of 60 nm as well, an SEM image the same as the SEM image of the surface of the first nitride semiconductor underlying layer in Example 1 having a thickness of 60 nm shown in FIG. 51 was obtained.

Thereafter, successively, under the conditions the same as above, undoped GaN crystal was further grown to thereby form the first nitride semiconductor underlying layer in Example 5 having a thickness of 300 nm.

Then, the surface of the first nitride semiconductor underlying layer in Example 5 having a thickness of 300 nm was observed with the SEM. Consequently, at the surface of the first nitride semiconductor underlying layer in Example 5 having a thickness of 300 nm as well, an SEM image the same as the SEM image of the surface of the first nitride semiconductor underlying layer in Example 1 having a thickness of 300 nm shown in FIG. 52 was obtained.

Comparative Example 1

The first nitride semiconductor underlying layer in Comparative Example 1 having a thickness of 60 nm was grown as in Example 1, except that a gas mixture of a hydrogen gas (a flow rate: 129 slm) and a nitrogen gas (a flow rate: 78 slm) was supplied as a carrier gas into the vertical MOCVD apparatus. Here, a volume ratio of the hydrogen gas to the total volume of the carrier gas during growth of the first nitride semiconductor underlying layer in Comparative Example 1 having a thickness of 60 nm was set to 0.62.

Figure 53:
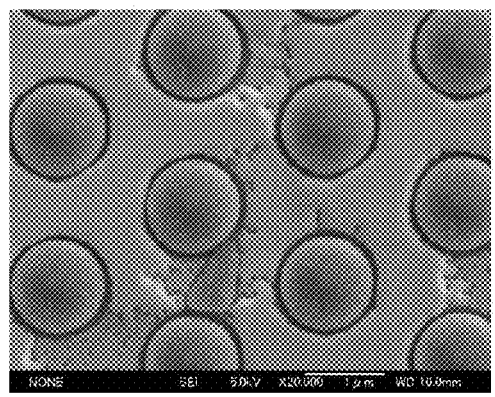
FIG. 53 shows an SEM image of a surface of a first nitride semiconductor underlying layer in an early stage of growth in Comparative Example 1.

Then, the surface of the first nitride semiconductor underlying layer in Comparative Example 1 having a thickness of 60 nm was observed with the SEM. FIG. 53 shows an SEM image of the surface of the first nitride semiconductor underlying layer in Comparative Example 1 having a thickness of 60 nm.

Thereafter, successively, under the conditions the same as above, undoped GaN crystal was further grown to thereby form the first nitride semiconductor underlying layer in Comparative Example 1 having a thickness of 300 nm.

Figure 54:
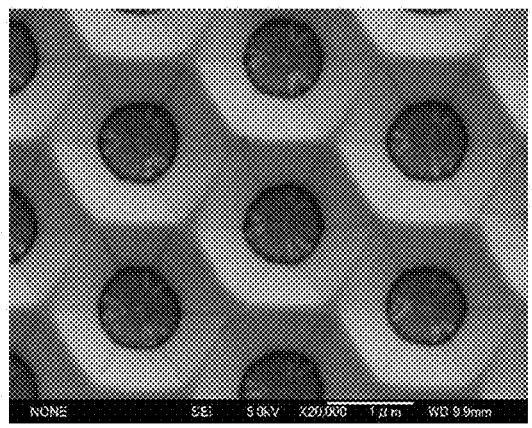
FIG. 54 shows an SEM image of the surface of the first nitride semiconductor underlying layer after growth in Comparative Example 1.

Then, the surface of the first nitride semiconductor underlying layer in Comparative Example 1 having a thickness of 300 nm was observed with the SEM. FIG. 54 shows an SEM image of the surface of the first nitride semiconductor underlying layer in Comparative Example 1 having a thickness of 300 nm.

Comparative Example 2

The first nitride semiconductor underlying layer in Comparative Example 2 having a thickness of 300 nm was grown as in Example 1, except that the number of rotations of the substrate was set to 1200 RPM.

Figure 55:
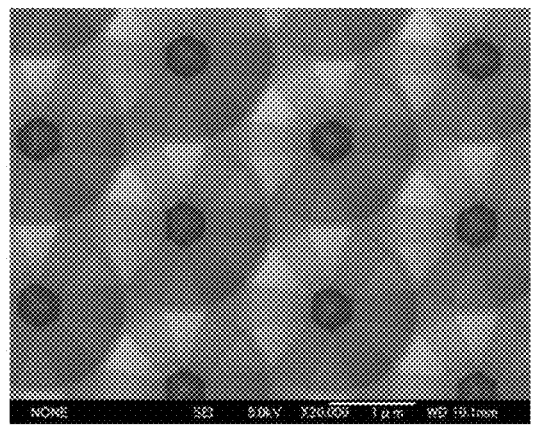
FIG. 55 shows an SEM image of a surface of a first nitride semiconductor underlying layer after growth in Comparative Example 2.

Then, the surface of the first nitride semiconductor underlying layer in Comparative Example 2 having a thickness of 300 nm was observed with the SEM. FIG. 55 shows an SEM image of the surface of the first nitride semiconductor underlying layer in Comparative Example 2 having a thickness of 300 nm.

<Evaluation>
(Early Stage of Growth)
(1) First Oblique Facet Plane

As shown in FIGS. 51 and 52, in Examples 1 to 5 and Comparative Example 1, in an early stage of growth of the first nitride semiconductor underlying layer (having a thickness of 60 nm), the surface of the first nitride semiconductor underlying layer was formed only of the first oblique facet plane which was an r plane.

It is noted that the r plane refers to two first oblique facet planes which appear in the direction of the a (sub) axis as well as in each of the direction inclined by an angle of +60° with respect to the direction of the a (sub) axis and the direction inclined by an angle of −60° with respect to the direction of the a (sub) axis (both of which are the u direction), as shown, for example, in FIG. 8.

(2) Surface State

As shown in FIG. 51, the first nitride semiconductor underlying layer having a thickness of 60 nm in each of Examples 1 to 5 was confirmed to be a continuous film having high uniformity and continuous surfaces. On the other hand, as shown in FIG. 53, the first nitride semiconductor underlying layer having a thickness of 60 nm in Comparative Example 1 was confirmed to be a discontinuous film having a non-uniform surface.

(3) ESD Yield

In addition, an ESD test of the first nitride semiconductor underlying layer having a thickness of 60 nm in each of Examples 1 to 5 and Comparative Example 1 was conducted. Consequently, yield in the ESD test of the first nitride semiconductor underlying layer in each of Examples 1 to 5 was not lower than 90%. On the other hand, yield in the ESD test of the first nitride semiconductor underlying layer in Comparative Example 1 was 20%. It is noted that the ESD test was conducted under an HBM condition in which a reverse voltage was set to 1 kV.

Thus, the reason why yield in the ESD test in Comparative Example 1 was low is considered as follows. Namely, in a case where the first nitride semiconductor underlying layer in an early stage of growth in Comparative Example 1 is a discontinuous film, during subsequent growth of GaN crystal, a crystal defect is caused in a portion where the film becomes discontinuous. It has been confirmed that current leakage originates from this crystal defect when a nitride semiconductor light emitting diode element is driven. It is considered that, consequently, a current concentrates in the vicinity of this crystal defect in the ESD test, which has become a cause of lowering in ESD yield. Such a crystal defect is considered as a crystal defect called micropipe, which propagates perpendicularly to a growth surface of GaN crystal.

(After Growth)
(1) First Oblique Facet Plane

As shown in FIGS. 52 and 54, in Examples 1 to 5 and Comparative Example 1, the first oblique facet plane after growth of the first nitride semiconductor underlying layer (having a thickness of 300 nm) was formed only of the r plane. On the other hand, as shown in FIG. 55, in Comparative Example 2, an r plane, an n plane, and a c plane were together present at the first oblique facet plane after growth of the first nitride semiconductor underlying layer (having a thickness of 300 nm).

It is noted that the n plane refers to two first oblique facet planes which appear in each of the direction inclined by +30° with respect to the direction of the a (sub) axis, the direction inclined by −30° with respect to the direction of the a (sub) axis, and the direction of the m (sub) axis. In addition, the c plane is the upper surface of first nitride semiconductor underlying layer 4.

(2) Breakage of Substrate

In Examples 1 to 5 and Comparative Example 1, no substrate broke after growth of the first nitride semiconductor underlying layer having a thickness of 300 nm. On the other hand, in Comparative Example 2, a substrate broke after growth of the first nitride semiconductor underlying layer having a thickness of 300 nm.

In an early stage of growth of the first nitride semiconductor underlying layer (having a thickness of 60 nm) in Comparative Example 2, not only an r plane but also an n plane and a c plane were together present at the first oblique facet plane. It was thus found that, in a case where the first oblique facet planes of both of the r plane and the n plane appeared, breakage was likely in the substrate after growth (having a thickness of 300 nm).

A hypothesis of this phenomenon is considered as follows. A crystal orientation of a film grown on an r plane which is the first oblique facet plane and a crystal orientation of a film grown on an n plane which is the first oblique facet plane are slightly displaced from each other, which causes a line defect at an interface therebetween, and the film breaks along a line corresponding to a series of such line defects. Consequently, strain involved with difference in thermal expansion between the film and the substrate may concentrate in that portion and a substrate may break.

(3) Half Width of XRC

Crystallinity of the first nitride semiconductor underlying layer having a thickness of 300 nm in each of Examples 1 to 5 was evaluated by measuring a half width of an X-ray rocking curve (XRC). Consequently, specifically, it was confirmed that each of the GaN (004) plane and the GaN (102) plane of the surface of the first nitride semiconductor underlying layer having a thickness of 300 nm in each of Examples 1 to 5 was narrow in half width of XRC, and it was confirmed that it had high crystallinity.

It was thus confirmed that the first nitride semiconductor underlying layer having a thickness of 300 nm in each of Examples 1 to 5 was higher in crystallinity than the first nitride semiconductor underlying layer having a thickness of 300 nm in Comparative Example 1.

(4) ESD Yield

In addition, an ESD test of the first nitride semiconductor underlying layer having a thickness of 300 nm in each of Examples 1 to 5 and Comparative Example 1 was conducted. Consequently, yield in the ESD test of the first nitride semiconductor underlying layer in each of Examples 1 to 5 was not lower than 90%. On the other hand, yield in the ESD test of the first nitride semiconductor underlying layer having a thickness of 300 nm in Comparative Examples 1 was 20%, It is noted that the ESD test was conducted under an HBM condition in which a reverse voltage was set to 1 kV.

<Results>

From the results above, in the case where the first nitride semiconductor underlying layer was grown with MOCVD with the use of the vertical MOCVD apparatus in which the carrier gas containing the hydrogen gas of which volume ratio to the total volume of the carrier gas was not lower than 0.7 and not higher than 1 was used while the substrate was rotated at the number of rotations per unit time not lower than 400 RPM and not higher than 1000 RPM, as shown in Examples 1 to 5, the surface of the first nitride semiconductor underlying layer formed of a continuous film having a uniform surface and formed only of the r plane which was the first oblique facet plane was obtained.

Therefore, it is considered that a second nitride semiconductor underlying layer having an upper surface high in crystallinity and flatness can be grown on the surface of a first nitride semiconductor underlying layer of good quality in the embedment growth mode as in Examples 1 to 5, and a nitride layer having excellent crystallinity can be formed above with good reproducibility on such an upper surface of the second nitride semiconductor underlying layer.

Consequently, a nitride semiconductor element having the first nitride semiconductor underlying layer in each of Examples 1 to 5, such as a nitride semiconductor light emitting diode element, a nitride semiconductor laser element, and a nitride semiconductor transistor element, is considered to have excellent characteristics.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

The present invention can be made use of in a nitride semiconductor structure, a nitride semiconductor light emitting element, a nitride semiconductor transistor element, a method of manufacturing a nitride semiconductor structure, and a method of manufacturing a nitride semiconductor element.

In particular, the present invention can suitably be made use of in a nitride semiconductor light emitting diode element used for illumination, liquid crystal backlight, display, and the like, a nitride semiconductor laser element used for an optical disk, a projector, and the like, a nitride semiconductor transistor element used for a portable telephone, ultrahigh-speed optical communication, power control, and the like, and the like.

The invention claimed is:

1. A nitride semiconductor structure, comprising:
a substrate having a recess portion and a projection portion provided between said recess portions at its surface;
a nitride semiconductor intermediate layer provided on said substrate;
a first nitride semiconductor underlying layer provided on said nitride semiconductor intermediate layer; and
a second nitride semiconductor underlying layer provided on said first nitride semiconductor underlying layer,
said substrate being composed of trigonal corundum or hexagonal crystal,
said first nitride semiconductor underlying layer having at least 6 first oblique facet planes surrounding said projection portion on an outer side of said projection portion,
said second nitride semiconductor underlying layer having a lower surface in contact with at least one said first oblique facet plane of said first nitride semiconductor underlying layer, and
said second nitride semiconductor underlying layer having a flat upper surface.

2. The nitride semiconductor structure according to claim 1, wherein at least one said first oblique facet plane is inclined with respect to an m axis of a nitride semiconductor having a hexagonal structure.

3. The nitride semiconductor structure according to claim 1, wherein said projection portion is arranged along a <11-20> direction of said substrate.

4. The nitride semiconductor structure according to claim 1, wherein in a cross-sectional view passing through a center of said projection portion in a plan view of said surface of said substrate, said projection portion is in a shape having a tip end portion.

5. The nitride semiconductor structure according to claim 1, wherein said nitride semiconductor intermediate layer is composed of a nitride semiconductor expressed with a formula AlN or $Al_xGa_{1-x}N$ ($0.5<x\le1$).

6. A nitride semiconductor light emitting element, comprising:
   the nitride semiconductor structure according to claim 1;
   a first-conductivity-type nitride semiconductor layer provided on said nitride semiconductor structure;
   a nitride semiconductor active layer provided on said first-conductivity-type nitride semiconductor layer;
   a second-conductivity-type nitride semiconductor layer provided on said nitride semiconductor active layer;
   a first electrode in contact with said first-conductivity-type nitride semiconductor layer; and
   a second electrode in contact with said second-conductivity-type nitride semiconductor layer.

7. A nitride semiconductor transistor element, comprising:
   the nitride semiconductor structure according to claim 1;
   a first-conductivity-type nitride semiconductor electron transit layer provided on said nitride semiconductor structure;
   a first-conductivity-type nitride semiconductor electron supply layer provided on said first-conductivity-type nitride semiconductor electron transit layer; and
   an electrode provided on said first-conductivity-type nitride semiconductor electron supply layer.

8. A nitride semiconductor structure, comprising:
   a substrate having a recess portion and a projection portion provided between said recess portions at its surface;
   a nitride semiconductor intermediate layer provided on said substrate;
   a third nitride semiconductor underlying layer provided on said nitride semiconductor intermediate layer at least in said recess portion;
   a first nitride semiconductor underlying layer provided at least on said third nitride semiconductor underlying layer; and
   a second nitride semiconductor underlying layer provided at least on said first nitride semiconductor underlying layer,
   said substrate being composed of trigonal corundum or hexagonal crystal,
   a surface of said third nitride semiconductor underlying layer having a third oblique facet plane and a third flat region,
   an area of said third oblique facet plane at said surface of said third nitride semiconductor underlying layer being smaller than an area of said third flat region,
   said first nitride semiconductor underlying layer having a first oblique facet plane surrounding said projection portion,
   said second nitride semiconductor underlying layer having a lower surface in contact with said first oblique facet plane, and
   said second nitride semiconductor underlying layer having a flat upper surface.

9. The nitride semiconductor structure according to claim 8, wherein
   said first oblique facet plane includes a plane inclined with respect to an m axis of a nitride semiconductor having a hexagonal structure.

10. The nitride semiconductor structure according to claim 8, wherein
    said projection portion is arranged along a <11-20> direction of said substrate.

11. The nitride semiconductor structure according to claim 8, wherein
    in a cross-sectional view passing through a center of said projection portion in a plan view of said surface of said substrate, said projection portion is in a shape having a tip end portion.

12. The nitride semiconductor structure according to claim 8, wherein said nitride semiconductor intermediate layer is composed of a nitride semiconductor expressed with a formula AlN or $Al_xGa_{1-x}N$ ($0.5<x\leq1$).

13. A nitride semiconductor light emitting element, comprising:
    the nitride semiconductor structure according to claim 8;
    a first-conductivity-type nitride semiconductor layer provided on said nitride semiconductor structure;
    a nitride semiconductor light emitting layer provided on said first-conductivity-type nitride semiconductor layer;
    a second-conductivity-type nitride semiconductor layer provided on said nitride semiconductor light emitting layer;
    a first electrode in contact with said first-conductivity-type nitride semiconductor layer; and
    a second electrode in contact with said second-conductivity-type nitride semiconductor layer.

14. A nitride semiconductor transistor element, comprising:
    the nitride semiconductor structure according to claim 8;
    a first-conductivity-type nitride semiconductor electron transit layer provided on said nitride semiconductor structure;
    a first-conductivity-type nitride semiconductor electron supply layer provided on said first-conductivity-type nitride semiconductor electron transit layer; and
    an electrode provided on said first-conductivity-type nitride semiconductor electron supply layer.

15. A method of manufacturing a nitride semiconductor structure, comprising the steps of:
    preparing a substrate having a recess portion and a projection portion provided between said recess portions at its surface;
    forming a nitride semiconductor intermediate layer on said substrate; and
    forming on said nitride semiconductor intermediate layer, a first nitride semiconductor underlying layer having at least 6 first oblique facet planes surrounding said projection portion on an outer side of said projection portion with said projection portion being located in a center,
    said step of forming a first nitride semiconductor underlying layer including the step of growing said first nitride semiconductor underlying layer with MOCVD by using a vertical MOCVD apparatus in which a carrier gas containing a hydrogen gas is used while said substrate is rotated,
    the number of rotations of said substrate per unit time being not lower than 400 RPM and not higher than 1000 RPM, and
    a volume ratio of said hydrogen gas with respect to a total volume of said carrier gas being not lower than 0.7 and not higher than 1.

16. The method of manufacturing a nitride semiconductor structure according to claim 15, further comprising the step of forming a second nitride semiconductor underlying layer on said first nitride semiconductor underlying layer, wherein
    said steps of forming a first nitride semiconductor underlying layer and forming a second nitride semiconductor underlying layer are each the step of growing said first nitride semiconductor underlying layer and said second nitride semiconductor underlying layer with MOCVD in which a carrier gas containing a hydrogen gas is used while said substrate is rotated, and performed to satisfy at least one condition selected from the group consisting of setting a growth temperature during growth of said first nitride semiconductor underlying layer to be lower than a growth temperature during growth of said second nitride semiconductor underlying layer, setting a pressure during growth of said first nitride semiconductor underlying layer to be higher than a pressure during growth of said second nitride semiconductor underlying layer, setting a V/III ratio of a source material gas supplied during growth of said first nitride semiconductor underlying layer to be higher than a V/III ratio of a source material gas supplied during growth of said second nitride semiconductor underlying layer, setting the number of rotations of said substrate per unit time during growth of said first nitride semiconductor underlying layer to be smaller than the number of rotations of said substrate per unit time during growth of said second nitride semiconductor underlying layer, and setting a volume ratio of said hydrogen gas with respect to the total volume of said carrier gas during growth of said first nitride semiconductor underlying layer to be equal to or higher than a volume ratio of said hydrogen gas with respect to the total volume of said carrier gas during growth of said second nitride semiconductor underlying layer.

17. The method of manufacturing a nitride semiconductor structure according to claim 15, wherein
said step of preparing a substrate includes the step of forming said projection portion and said recess portion at a c plane of said substrate or a surface inclined with respect to the c plane in a range of 5° or smaller.

18. The method of manufacturing a nitride semiconductor structure according to claim 15, wherein
said substrate is composed of trigonal corundum or hexagonal crystal.

19. The method of manufacturing a nitride semiconductor structure according to claim 15, wherein
said projection portion is arranged along a <11-20> direction of said substrate.

20. The method of manufacturing a nitride semiconductor structure according to claim 15, wherein
in a cross-sectional view passing through a center of said projection portion in a plan view of said surface of said substrate, said projection portion is in a shape having a tip end portion.

21. The method of manufacturing a nitride semiconductor structure according to claim 15, wherein
said step of forming a nitride semiconductor intermediate layer includes the step of forming said nitride semiconductor intermediate layer with sputtering.

22. The method of manufacturing a nitride semiconductor structure according to claim 15, wherein
said nitride semiconductor intermediate layer is composed of a nitride semiconductor expressed with a formula AlN or $Al_xGa_{1-x}N$ ($0.5<x\le1$).

23. A method of manufacturing a nitride semiconductor element, comprising the step of forming a nitride semiconductor layer on a surface of said second nitride semiconductor underlying layer manufactured with the method of manufacturing a nitride semiconductor structure according to claim 15.

* * * * *